(12) United States Patent
Mathuriya et al.

(10) Patent No.: US 11,836,102 B1
(45) Date of Patent: Dec. 5, 2023

(54) LOW LATENCY AND HIGH BANDWIDTH ARTIFICIAL INTELLIGENCE PROCESSOR

(71) Applicant: Kepler Computing Inc., San Francisco, CA (US)

(72) Inventors: Amrita Mathuriya, Portland, OR (US); Rajeev Kumar Dokania, Beaverton, OR (US); Ananda Samajdar, Hillsboro, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 317 days.

(21) Appl. No.: 16/823,209

(22) Filed: Mar. 18, 2020

Related U.S. Application Data

(60) Provisional application No. 62/821,328, filed on Mar. 20, 2019.

(51) Int. Cl.
*G06F 7/52* (2006.01)
*G06F 13/40* (2006.01)
(Continued)

(52) U.S. Cl.
CPC ............ *G06F 13/4027* (2013.01); *G06F 7/50* (2013.01); *G06F 13/1668* (2013.01);
(Continued)

(58) Field of Classification Search
CPC ........ G06N 20/00; G06N 20/10; G06N 20/20; G06N 5/00–048; G06F 7/50–53338;
(Continued)

(56) References Cited

U.S. PATENT DOCUMENTS

| 5,834,162 A | 11/1998 | Malba |
| 6,256,248 B1 | 7/2001 | Leung |

(Continued)

FOREIGN PATENT DOCUMENTS

| CN | 104081516 A | 10/2014 |
| CN | 104081516 B | 2/2017 |

(Continued)

OTHER PUBLICATIONS

Jun et al., "HBM (High Bandwidth Memory) DRAM Technology and Architecture", 2017 IEEE International Memory Workshop (IMW), Monterey, CA, 2017, pp. 1-4.
(Continued)

*Primary Examiner* — Ilwoo Park
(74) *Attorney, Agent, or Firm* — MUGHAL GAUDRY & FRANKLIN PC

(57) ABSTRACT

Matrix multiplication process is segregated between two separate dies—a memory die and a compute die to achieve low latency and high bandwidth artificial intelligence (AI) processor. The blocked matrix-multiplication scheme maps computations across multiple processor elements (PE) or matrix-multiplication units. The AI architecture for inference and training includes one or more PEs, where each PE includes memory (e.g., ferroelectric (FE) memory, FE-RAM, SRAM, DRAM, MRAM, etc.) to store weights and input/output I/O data. Each PE also includes a ring or mesh interconnect network to couple the PEs for fast access of information.

37 Claims, 49 Drawing Sheets

(51) Int. Cl.
  *G06F 17/16* (2006.01)
  *G06F 7/50* (2006.01)
  *G06F 13/16* (2006.01)
  *G11C 11/22* (2006.01)
  *G06N 20/00* (2019.01)
  *H01L 25/065* (2023.01)
  *G06N 3/063* (2023.01)

(52) U.S. Cl.
  CPC .......... *G06F 17/16* (2013.01); *G06N 20/00* (2019.01); *G11C 11/22* (2013.01); *H01L 25/0657* (2013.01); *G06N 3/063* (2013.01)

(58) Field of Classification Search
  CPC .......... G06F 13/1668–1694; G06F 7/52–5277; G06F 7/53–5375
  USPC ................ 708/501, 607; 326/37–45; 706/15
  See application file for complete search history.

(56) References Cited

U.S. PATENT DOCUMENTS

| | | |
|---|---|---|
| 6,487,135 B2 | 11/2002 | Watanabe et al. |
| 6,890,798 B2 | 5/2005 | McMahon |
| 7,146,454 B1 | 12/2006 | Li et al. |
| 7,217,596 B2 | 5/2007 | Cobbley et al. |
| 7,683,459 B2 | 3/2010 | Ma et al. |
| 7,992,017 B2 | 8/2011 | Safford et al. |
| 8,143,710 B2 | 3/2012 | Cho |
| 8,198,716 B2 | 6/2012 | Periaman et al. |
| 8,245,065 B2 | 8/2012 | Niggemeier et al. |
| 8,525,342 B2 | 9/2013 | Chandrasekaran et al. |
| 8,546,955 B1 | 10/2013 | Wu |
| 8,547,769 B2 | 10/2013 | Saraswat et al. |
| 8,612,809 B2 | 12/2013 | Casper et al. |
| 8,701,073 B1 | 4/2014 | Fu et al. |
| 8,759,899 B1 | 6/2014 | Lue et al. |
| 8,896,126 B2 | 11/2014 | Setardja |
| 8,947,931 B1 | 2/2015 | d'Abreu |
| 9,165,968 B2 | 10/2015 | Chao et al. |
| 9,379,078 B2 | 6/2016 | Yu et al. |
| 9,627,365 B1 | 4/2017 | Yu et al. |
| 9,748,190 B2 | 8/2017 | Chen et al. |
| 10,074,423 B1 | 9/2018 | Hermesh et al. |
| 10,461,076 B1* | 10/2019 | Brewer ............. H01L 21/76898 |
| 10,741,525 B2 | 8/2020 | Takishita et al. |
| 11,009,938 B1 | 5/2021 | Law et al. |
| 11,043,472 B1 | 6/2021 | Dokania et al. |
| 11,139,270 B2 | 10/2021 | Manipatruni et al. |
| 11,152,343 B1 | 10/2021 | Dokania et al. |
| 11,171,115 B2 | 11/2021 | Manipatruni et al. |
| 11,238,206 B1 | 2/2022 | Sivaswamy et al. |
| 11,436,402 B1 | 9/2022 | Liu et al. |
| 2003/0097543 A1 | 5/2003 | Wishneusky |
| 2006/0179329 A1 | 8/2006 | Terechko et al. |
| 2007/0208902 A1 | 9/2007 | Park et al. |
| 2007/0234094 A1 | 10/2007 | Samra et al. |
| 2008/0126611 A1 | 5/2008 | Tu et al. |
| 2009/0019411 A1 | 1/2009 | Chandra et al. |
| 2009/0103854 A1* | 4/2009 | Beausoleil ........... H04B 10/801 385/14 |
| 2010/0008058 A1 | 1/2010 | Saen et al. |
| 2010/0057404 A1 | 3/2010 | Dittmann et al. |
| 2010/0077179 A1 | 3/2010 | Stillwell, Jr. et al. |
| 2010/0167467 A1 | 7/2010 | Aoi |
| 2010/0228955 A1 | 9/2010 | Niggemeier et al. |
| 2010/0321993 A1 | 12/2010 | Nikonov et al. |
| 2011/0222540 A1 | 9/2011 | Mital et al. |
| 2012/0098140 A1 | 4/2012 | Bartley et al. |
| 2012/0106117 A1 | 5/2012 | Sundaram et al. |
| 2012/0146207 A1* | 6/2012 | Chou ..................... H01L 25/18 438/107 |
| 2012/0239904 A1 | 9/2012 | Ekanadham et al. |
| 2013/0086395 A1 | 4/2013 | Liu |
| 2013/0141858 A1 | 6/2013 | Pyeon |
| 2013/0175686 A1 | 7/2013 | Meyer et al. |
| 2013/0205143 A1 | 8/2013 | Eastlack |
| 2013/0320560 A1 | 12/2013 | Secker et al. |
| 2013/0346781 A1 | 12/2013 | Chung et al. |
| 2014/0006817 A1 | 1/2014 | Bonen et al. |
| 2014/0026146 A1 | 1/2014 | Jahagirdar et al. |
| 2014/0208041 A1 | 7/2014 | Hyde et al. |
| 2014/0217616 A1 | 8/2014 | Choi |
| 2014/0371109 A1 | 12/2014 | McMillen et al. |
| 2015/0091131 A1 | 4/2015 | Lamorey et al. |
| 2015/0277532 A1 | 10/2015 | Mishaeli et al. |
| 2015/0279431 A1 | 10/2015 | Li et al. |
| 2016/0126291 A1 | 5/2016 | Lu et al. |
| 2016/0357630 A1 | 12/2016 | Kang et al. |
| 2017/0018301 A1 | 1/2017 | Kilmer et al. |
| 2017/0062383 A1* | 3/2017 | Yee ..................... H01L 23/3675 |
| 2017/0077387 A1 | 3/2017 | Kan et al. |
| 2017/0084312 A1 | 3/2017 | Kim |
| 2017/0084596 A1 | 3/2017 | Scanlan |
| 2017/0139635 A1* | 5/2017 | Jayasena ................ G11C 5/025 |
| 2017/0178711 A1 | 6/2017 | Morris et al. |
| 2017/0300269 A1 | 10/2017 | Um |
| 2018/0082981 A1 | 3/2018 | Gowda |
| 2018/0095750 A1 | 4/2018 | Drysdale et al. |
| 2018/0107630 A1 | 4/2018 | Zhou et al. |
| 2018/0240964 A1 | 8/2018 | Nikonov et al. |
| 2018/0254073 A1 | 9/2018 | Frans |
| 2018/0277695 A1* | 9/2018 | Garten ................ H01L 51/4206 |
| 2018/0330236 A1 | 11/2018 | Tou et al. |
| 2018/0350773 A1 | 12/2018 | Saito |
| 2019/0042251 A1 | 2/2019 | Nurvitadhi et al. |
| 2019/0050040 A1 | 2/2019 | Baskaran et al. |
| 2019/0051642 A1 | 2/2019 | Hyde et al. |
| 2019/0065204 A1 | 2/2019 | Jean |
| 2019/0065956 A1 | 2/2019 | Qian et al. |
| 2019/0096453 A1 | 3/2019 | Shin et al. |
| 2019/0102330 A1 | 4/2019 | Hasbun et al. |
| 2019/0103143 A1 | 4/2019 | Hasbun et al. |
| 2019/0103148 A1 | 4/2019 | Hasbun et al. |
| 2019/0114535 A1 | 4/2019 | Ng et al. |
| 2019/0164834 A1* | 5/2019 | Or-Bach ............. H01L 21/6835 |
| 2019/0187898 A1* | 6/2019 | Gu ............................ G06N 3/08 |
| 2019/0189564 A1 | 6/2019 | Guzek |
| 2019/0198083 A1 | 6/2019 | Biswas et al. |
| 2019/0205244 A1 | 7/2019 | Smith |
| 2019/0220434 A1 | 7/2019 | Dai et al. |
| 2019/0229101 A1 | 7/2019 | Lee |
| 2019/0259732 A1 | 8/2019 | Choo et al. |
| 2019/0267074 A1 | 8/2019 | Fishburn et al. |
| 2019/0279697 A1 | 9/2019 | Karpov et al. |
| 2019/0317585 A1 | 10/2019 | Bhandaru et al. |
| 2019/0318975 A1 | 10/2019 | Shi et al. |
| 2019/0334010 A1 | 10/2019 | Avci et al. |
| 2020/0006324 A1 | 1/2020 | Chen et al. |
| 2020/0075567 A1 | 3/2020 | Collins |
| 2020/0076424 A1 | 3/2020 | Dubey et al. |
| 2020/0098725 A1 | 3/2020 | Liff et al. |
| 2020/0107444 A1 | 4/2020 | Hoe et al. |
| 2020/0126995 A1 | 4/2020 | Ge et al. |
| 2020/0135697 A1* | 4/2020 | Brewer ................... H01L 23/36 |
| 2020/0159568 A1 | 5/2020 | Goyal et al. |
| 2020/0161230 A1 | 5/2020 | Knickerbocker et al. |
| 2020/0168528 A1 | 5/2020 | Cheah et al. |
| 2020/0168550 A1 | 5/2020 | Ryu et al. |
| 2020/0168554 A1 | 5/2020 | Fay et al. |
| 2020/0279793 A1 | 9/2020 | Xie et al. |
| 2020/0303343 A1 | 9/2020 | Manipatruni et al. |
| 2020/0303344 A1 | 9/2020 | Manipatruni et al. |
| 2020/0334082 A1 | 10/2020 | Zhao et al. |
| 2020/0365593 A1 | 11/2020 | Chen et al. |
| 2021/0134724 A1 | 5/2021 | Rubin et al. |
| 2021/0160061 A1 | 5/2021 | Liu et al. |
| 2021/0166740 A1 | 6/2021 | Shin et al. |
| 2021/0311629 A1 | 10/2021 | Pappachan et al. |
| 2021/0335718 A1 | 10/2021 | Cheah et al. |
| 2021/0391469 A1 | 12/2021 | Doornbos et al. |

(56) References Cited

U.S. PATENT DOCUMENTS

| | | |
|---|---|---|
| 2022/0367400 A1 | 11/2022 | Li |
| 2023/0086010 A1 | 3/2023 | Gonzalez et al. |

FOREIGN PATENT DOCUMENTS

| | | | | |
|---|---|---|---|---|
| GB | 2323188 A | | 9/1998 | |
| JP | H11168185 A | | 6/1999 | |
| JP | 2000196008 A | | 7/2000 | |
| JP | 2004315268 A | * | 11/2004 | |
| JP | 2006324430 A | | 11/2006 | |
| JP | 2007150154 | | 1/2009 | |
| JP | 2010053399 A | * | 3/2010 | |
| JP | 2018160490 A | | 10/2018 | |
| KR | 20100081272 A | | 7/2010 | |
| KR | 20200066538 | * | 6/2020 | ............ G06N 3/063 |
| TW | 201327740 A | | 7/2013 | |
| TW | 201430968 A | | 8/2014 | |
| TW | 201523827 A | | 6/2015 | |
| WO | WO-2018126073 A1 | * | 7/2018 | ............ G06F 17/16 |
| WO | 2018220846 A1 | | 12/2018 | |
| WO | 2019023253 A1 | | 1/2019 | |
| WO | WO-2020062312 A1 | * | 4/2020 | ............... G06N 3/08 |

OTHER PUBLICATIONS

Kim et al., "A 1.2 V 12.8 GB/s 2 GB Mobile Wide-I/O DRAM With 4$\times$128 I/Os Using TSV Based Stacking", IEEE Journal of Solid-State Circuits, vol. 47, No. 1, pp. 107-116, Jan. 2012.

Lee et al., "25.2 A 1.2V 8Gb 8-channel 128GB/s high-bandwidth memory (HBM) stacked DRAM with effective microbump I/O test methods using 29nm process and TSV", 2014 IEEE International Solid-State Circuits Conference Digest of Technical Papers (ISSCC), San Francisco, CA, 2014, pp. 432-433.

Macri, "AMD's next generation GPU and high bandwidth memory architecture: FURY", 2015 IEEE Hot Chips 27 Symposium (HCS), Cupertino, CA, 2015, pp. 1-26.

Pugsley et al., "NDC: Analyzing the impact of 3D-stacked memory+ logic devices on MapReduce workloads", 2014 IEEE International Symposium on Performance Analysis of Systems and Software (ISPASS), Monterey, CA, 2014, pp. 190-200.

Shulaker et al., "Monolithic 3D integration of logic and memory: Carbon nanotube FETs, resistive RAM, and silicon FETs", 2014 IEEE International Electron Devices Meeting, San Francisco, CA, 2014, pp. 27.4.1-27.4.4.

Sun et al., "A novel architecture of the 3D stacked MRAM L2 cache for CMPs", 2009 IEEE 15th International Symposium on High Performance Computer Architecture, Raleigh, NC, 2009, pp. 239-249.

Woo et al., "An optimized 3D-stacked memory architecture by exploiting excessive, high-density TSV bandwidth", HPCA—16 2010 The Sixteenth International Symposium on High-Performance Computer Architecture, Bangalore, 2010, pp. 1-12.

Yu, "Wafer level system integration for SiP", 2014 IEEE International Electron Devices Meeting, San Francisco, CA, 2014, pp. 27.1.1-27.1.4.

1st Office Action & Search Report dated Dec. 9, 2020, for Taiwan Patent Application No. 109106755.

Advisory Action dated Mar. 3, 2021 for U.S. Appl. No. 16/357,265.

Advisory Action dated Mar. 3, 2021 for U.S. Appl. No. 16/357,272.

AMD CDNA whitepaper. Retrieved from https://www.amd.com/system/files/documents/amd-cdna-whitepaper.pdf [Sep. 14, 2021].

AMD's V-cache product announcement. Retrieved from https://www.pcworld.com/article/3620871/amd-v-cache-for-ryzen-everything you-need-to-know.html [Sep. 14, 2021].

Rotem et al. "Power-management architecture of the intel microarchitecture code-named sandy bridge." IEEE micro 32.2 (2012): 20-27.

Restriction Requirement dated Jan. 2, 2020 for U.S. Appl. No. 16/357,272.

Restriction Requirement dated Dec. 13, 2019 for U.S. Appl. No. 16/357,265.

Restriction Requirement dated Apr. 3, 2020 for U.S. Appl. No. 16/428,893.

Chen et al. "System on integrated chips (SoIC (TM) for 3D heterogeneous integration." 2019 IEEE 69th Electronic Components and Technology Conference (ECTC). IEEE, 2019.

Chen et al. "Ultra high density SoIC with sub-micron bond pitch." 2020 IEEE 70th Electronic Components and Technology Conference (ECTC). IEEE, 2020.

Decision of Rejection dated May 18, 2021 for Taiwan Patent Application No. 109106755.

Final Office Action dated Dec. 28, 2020 for U.S. Appl. No. 16/357,265.

Final Office Action dated Dec. 31, 2020 for U.S. Appl. No. 16/357,272.

First Office Action in Re-Examination dated Jul. 11, 2022 for Taiwan Patent Application No. 109106755.

Herbert et al., "Analysis of dynamic voltage/frequency scaling in chip-multiprocessors." Proceedings of the 2007 International symposium on Low power electronics and design (ISLPED'07). IEEE, 2007.

Ingerly et al. "Foveros: 3D integration and the use of face-to-face chip stacking for logic devices." 2019 IEEE International Electron Devices Meeting (IEDM). IEEE, 2019.

International Preliminary Report on Patentability dated Dec. 9, 2021 for PCT Patent Application No. PCT/US2020/032974.

International Preliminary Report on Patentability dated Sep. 30, 2021 for PCT Patent Application No. PCT/US2020/018875.

International Search Report & Written Opinion dated Jun. 11, 2020 for PCT Patent Application No. PCT/US2020/018875.

International Search Report & Written Opinion dated Sep. 1, 2020 for PCT Patent Application No. PCT/US2020/032974.

Kim, J. et al., "A 1.2 V 12.8 GB/s 2 GB Mobile Wide-I/O DRAM With 4$\times$128 I/Os Using TSV Based Stacking", IEEE Journal of Solid-State Circuits, vol. 47, No. 1, pp. 107-116, Jan. 2012.

Leblebici, Y., et al. "A compact high-speed (31, 5) parallel counter circuit based on capacitive threshold-logic gates." IEEE Journal of Solid-State Circuits 31.8 (1996): 1177-1183.

Lee et al. "Heterogeneous System-Level Package Integration-Trends and Challenges." 2020 IEEE Symposium on VLSI Technology. IEEE, 2020.

Lee, D. et al., "A 1.2V 8Gb 8-channel 128GB/s high-bandwidth memory (HBM) stacked DRAM with effective microbump I/O test methods using 29nm process and TSV", 2014 IEEE International Solid-State Circuits Conference Digest of Technical Papers (ISSCC), San Francisco, CA, 2014, pp. 432-433.

Lent et al. "Quantum cellular automata." Nanotechnology 4.1 (1993): 49.

Manipatruni et al. "Scalable energy-efficient magnetoelectric spin-orbit logic." Nature 565.7737 (2019): 35-42.

Non-Final Office Action dated Jul. 20, 2020 for U.S. Appl. No. 16/357,272.

Non-Final Office Action dated Jul. 22, 2020 for U.S. Appl. No. 16/357,265.

Non-Final Office Action dated Mar. 22, 2021 for U.S. Appl. No. 16/357,265.

Non-Final Office Action dated Mar. 23, 2021 for U.S. Appl. No. 16/357,272.

Non-Final Office Action dated Sep. 3, 2020 for U.S. Appl. No. 16/428,885.

Non-Final Office Action dated Sep. 3, 2020 for U.S. Appl. No. 16/428,893.

Notice of Allowance dated Feb. 22, 2021 for U.S. Appl. No. 16/428,885.

Notice of Allowance dated Jul. 9, 2021 for U.S. Appl. No. 16/428,893.

Notice of Allowance dated Jul. 22, 2021 for U.S. Appl. No. 16/357,265.

Notice of Allowance dated Jul. 22, 2021 for U.S. Appl. No. 16/357,272.

Prasad et al. "Buried power rails and back-side power grids: Arm® CPU power delivery network design beyond 5nm." 2019 IEEE International Electron Devices Meeting (IEDM). IEEE, 2019.

(56) References Cited

OTHER PUBLICATIONS

Restriction Requirement dated Apr. 3, 2020 for U.S. Appl. No. 16/428,885.
Non-Final Office Action dated Oct. 5, 2022 for U.S. Appl. No. 17/472,308.
Non-Final Office Action dated Oct. 6, 2022 for U.S. Appl. No. 17/472,325.
Non-Final Office Action dated Sep. 26, 2022 for U.S. Appl. No. 17/390,829.
Notice of Allowance dated Nov. 23, 2022 for U.S. Appl. No. 17/390,829.
Notice of Allowance dated Sep. 28, 2022 for U.S. Appl. No. 17/390,799.
Notice of Allowance dated Sep. 21, 2022 for Taiwan Patent Application No. 109106755.
Advisory Action dated Mar. 15, 2023 for U.S. Appl. No. 17/472,308.
Advisory Action dated Mar. 15, 2023 for U.S. Appl. No. 17/472,325.
Final Office Action dated Feb. 14, 2023 for U.S. Appl. No. 17/472,308.
Final Office Action dated Feb. 14, 2023 for U.S. Appl. No. 17/472,325.
LexInnova, 3D Stacked Memory, retrieved from the Internet by USPTO at . 2017. 23 pages.
Non-Final Office Action dated Mar. 3, 2023 for U.S. Appl. No. 17/449,240.
Non-Final Office Action dated Mar. 24, 2023 for U.S. Appl. No. 17/408,326.
Notice of Reasons for Rejection dated Nov. 8, 2022 for Japanese Patent Application No. 2021-546863.
Office Action dated Feb. 21, 2023 for Japanese Patent Application No. 2021-546863.
Restriction Requirement dated Feb. 8, 2023 for U.S. Appl. No. 17/229,750.
Wikipedia. Ferroelectric RAM. retrieved from the Internet by USPTO Feb. 21, 2023, https://en.wikipedia.org/wiki/Ferroelectric_RAM, 8 pages.
Office Action dated May 8, 2023 for Taiwan Patent Application No. 111129893.
Final Office Action dated Apr. 17, 2023 for U.S. Appl. No. 17/499,241.
Non-Final Office Action dated Apr. 20, 2023 for U.S. Appl. No. 17/472,308.
Non-Final Office Action dated Apr. 20, 2023 for U.S. Appl. No. 17/472,325.
Non-Final Office Action dated May 9, 2023 for U.S. Appl. No. 17/408,323.
Non-Final Office Action dated May 15, 2023 for U.S. Appl. No. 17/472,330.
Notice of Allowance dated Apr. 13, 2023 for U.S. Appl. No. 17/478,841.
Notice of Allowance dated May 10, 2023 for U.S. Appl. No. 17/396,585.
Restriction Requirement dated May 1, 2023 for U.S. Appl. No. 17/230,889.
Non-Final Office Action dated Sep. 6, 2023 for Taiwan Patent Application No. 112127062.
Notice of Allowance dated Sep. 11, 2023 for Taiwan Patent Application No. 111129893.
Coskun et al., "Temperature- and Cost-Aware Design of 3D Multiprocessor Architectures," 2009 12th Euromicro Conference on Digital System Design, Architectures, Methods and Tools, Patras, Greece, 2009, pp. 183-190, doi: 10.1109/DSD.2009.233 (8 pages).
Ex Parte Quayle Action notified Aug. 24, 2023 for U.S. Appl. No. 17/408,251.
Koob et al., "Design of a 3-D fully depleted SOI computational RAM," in IEEE Transactions on Very Large Scale Integration ( VLSI) Systems, vol. 13, No. 3, pp. 358-369, Mar. 2005, doi: 10.1109/TVLSI.2004.842890 (12 pages).
Lewis et al., "Testing Circuit-Partitioned 3D IC Designs," 2009 IEEE Computer Society Annual Symposium on VLSI, Tampa, FL, USA, 2009, pp. 139-144, doi: 10.1109/ISVLSI.2009.48 (6 pages).
Non-Final Office Action dated Aug. 30, 2023 for U.S. Appl. No. 17/230,889.
Non-Final Office Action dated Jul. 6, 2023 for U.S. Appl. No. 17/229,50.
Non-Final Office Action dated Jul. 26, 2023 for U.S. Appl. No. 7/230,890.
Notice of Allowance dated Jul. 12, 2023 for U.S. Appl. No. 17/499,241.
Notice of Allowance dated Jul. 18, 2023 for Japanese Patent Application No. 2021-546863.
Notice of Allowance dated Jul. 27, 2023 for U.S. Appl. No. 17/229,750.
Notice of Allowance dated Jun. 6, 2023 for U.S. Appl. No. 17/472,308.
Notice of Allowance dated Jun. 6, 2023 for U.S. Appl. No. 17/472,325.
Notice of Allowance dated Jun. 29, 2023 for U.S. Appl. No. 17/407,094.
Non-Final Office Action dated Sep. 15, 2023 for U.S. Appl. No. 17/408,326.
Notice of Allowance dated Sep. 29, 2023 for U.S. Appl. No. 17/408,251.

* cited by examiner

Same input, but weight is blocked (or split)
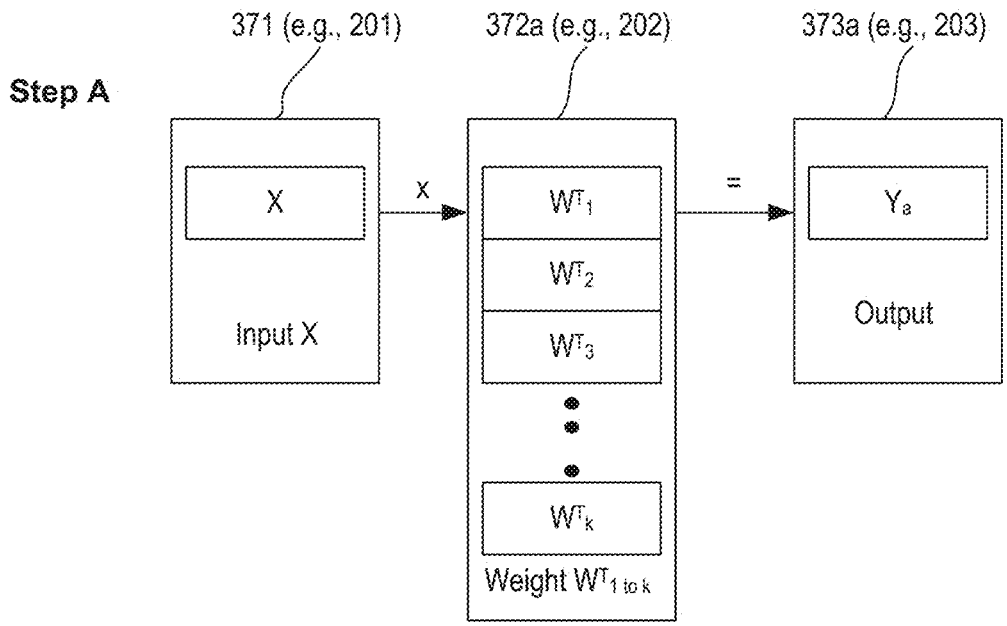
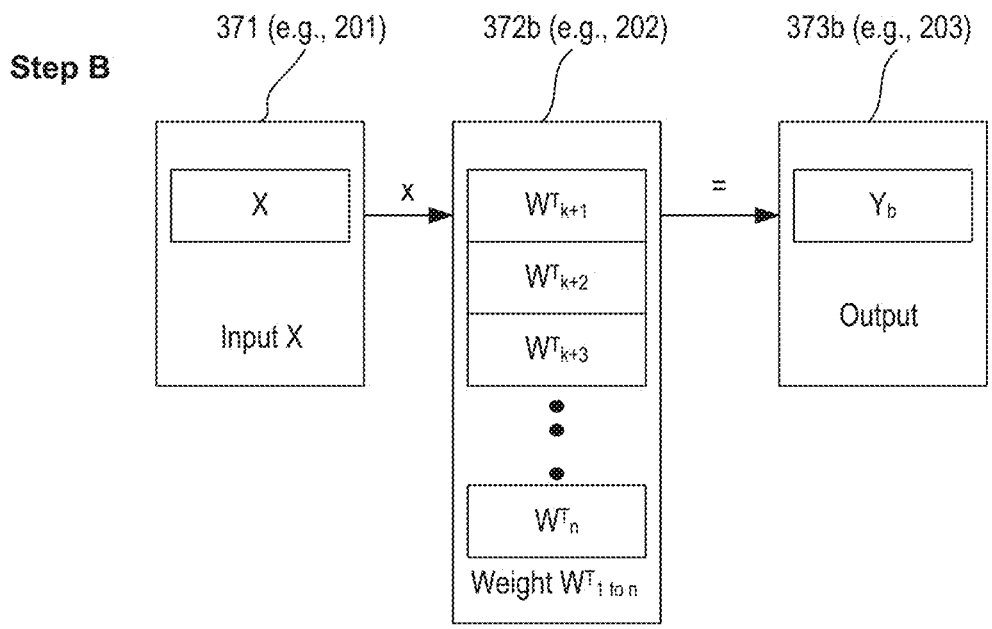
Step C
Y = Y_a concatenate Y_b
Fig. 3G

US 11,836,102 B1

LOW LATENCY AND HIGH BANDWIDTH ARTIFICIAL INTELLIGENCE PROCESSOR

CLAIM OF PRIORITY

This application claims priority of U.S. Provisional Application No. 62/821,328 filed Mar. 20, 2019 titled "Low Latency and High Bandwidth Artificial Intelligence Processor," which is incorporated by reference in its entirety.

BACKGROUND

Artificial intelligence (AI) is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained". This trained model with fixed weights is then used to make decisions about new data. Training a model and then applying the trained model for new data is hardware intensive activity. There is a desire to reduce latency of computing the training model and using the training model, and to reduce the power consumption of such AI processor systems.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3G-K illustrate the concept of splitting the weights when size of the weights is above a threshold, multiplying the input with the split weights, and then concatenating the multiplication results to generate an output, in accordance with some embodiments.

DETAILED DESCRIPTION

Figure 1:
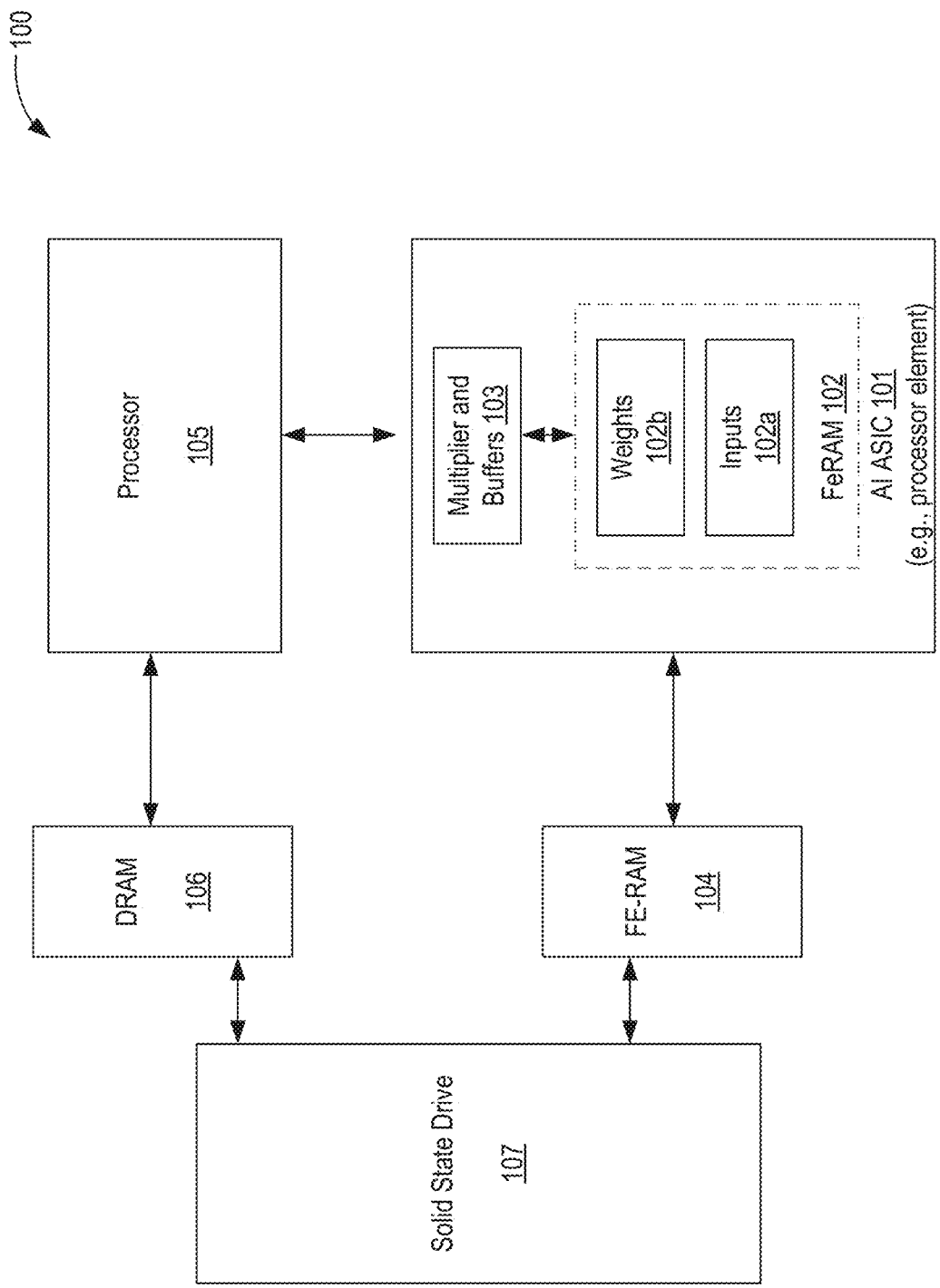
FIG. 1 illustrates a high-level architecture of an artificial intelligence (AI) machine comprising a compute die positioned on top of a memory die, in accordance with some embodiments.

Some embodiments describe a low latency and high bandwidth artificial intelligence processor with ferroelectric memory. Matrix multiplication is a basic function performed by artificial intelligence processors, graphic processing units, and/or inference chips. Some embodiments segregate the matrix multiplication process between two separate dies—a memory die and a compute die. The memory die may include one or more memory arrays. The memory arrays can be implemented as ferroelectric random access memory (Fe-RAM), magnetic random access memory (MRAM), resistive random access memory (Re-RAM), static random access memory (SRAM) and/or dynamic random access memory (DRAM). In some embodiments, compute die comprises one or more matrix multiplication units (MMUs) that are used to multiply inputs X with weight factors W. The weight factors may be computed by another die that performs training of a model. In some embodiments, the weights after being computed are stored in read-only memory. In one such embodiment, the weights are stationary weights that are multiplied with different inputs. In some embodiments, the memory die that stores the weights has high bandwidth memory access for the stored weights and their gradients that are provided to the MMU.

In some embodiments, the inputs X and/or weights W are received from a first die (e.g., memory die) or a buffer via a memory controller (e.g., using direct memory access (DMA)) or through a network interface from one or more processors. The compute die or an MMU generates an output from the inputs and weights. In some embodiments, the output is provided directly to the first die (e.g., memory die). In some embodiments, the output is provided to the second die (e.g., compute die) through a temporary buffer. The temporary buffer may reside on the second die or on the first die. In some embodiments, the output from one MMU is provided to another MMU on the second die. For example, the output of one MMU is stored in a temporary buffer then the output of the temporary buffer is provided to another MMU. Each MMU may be part of a processing entity (PE) or a processor core. These processor cores or PEs may be connected with one another in a ring format using a ring interconnect, or in a mesh format using a mesh interconnect, in accordance with some embodiments. Other fabrics for interconnecting processor cores or PEs may also be used.

In some embodiments, when the input X is large (e.g., above a first threshold), the input is split into two or more portions (Xa and Xb). These portions are then multiplied with weights to generate a first output and a second output. The two outputs are then added to generate a final output. In some embodiments, when the weight W is large (e.g., above a second threshold), the weights are split into sections. The input is then multiplied with each section to generate a corresponding output. The outputs from each multiplication process is then concatenated to generate a final output.

There are many technical effects of the packaging technology of various embodiments. For example, by segregating the matrix multiplication process into two separate dies, the performance of matrix multiplication is improved. Segregating memory on the other die provides large capacity due to larger allocated area. And, with high density memories such as MRAM and ferroelectric memories, it can further increase the capacity. High bandwidth is provided by the larger number I/Os that are available across the planar area. This way, matrix-multiplication can be significantly sped up across various matrix-sizes, especially of larger dimensions. When the memory buffers are carefully chunked on the memory die to provide large bandwidth to the corresponding logic units on the compute die—it can provide up to 10× or higher performance improvement and up to 10× lower energy. When, the input or weights become larger in size to fit in one of those chunks or the computations are needed to be parallelized across multiple logic units, in those cases blocked (or segregated) matrix-multiplication algorithm is performed to map the computations across multiple processor elements or matrix-multiplication units.

By using high bandwidth and high density memory such as ferroelectric memory (Fe-RAM), SRAMs, and/or DRAMs, large weight factors are stored in low power and high-speed memory arrays. By splitting a large input (e.g., when a size of input X is above a first threshold), and then multiplying the split input with the weights, the multiplication process is made fast. In some embodiments, by splitting a large weight (e.g., when a size of the weights is above a second threshold), the split weights are multiplied with the input to improve the speed of multiplication. Other technical effects will be evident from the various embodiments and figures.

In some embodiments, the segregated memory includes one or more of: Fe-RAM, Fe-SRAM, SRAM, MRAM, DRAM, or Re-RAM. In the segregated architecture, matrix-multiply computation is mapped to memory and compute dies. In some embodiments, inputs X and/or W come from the die 1 (e.g., memory die or from a unified or a split buffer). In some embodiments, the output flows either directly to the die 1 or through a temporary buffer on the die 2 (e.g., compute die) or to another MMU unit on die 1. The computation may be performed with a logic unit that is capable of matrix-multiplying and element-wise operations. In some embodiments, for an AI architecture with on-chip FE-RAM, SRAM, and/or DRAM and with AI accelerator, the AI architecture for inference and training includes one or more PE (processing elements), where each PE includes: FE-RAM, SRAM, and/or DRAM memory to store weights and I/O; and a ring or mesh interconnect network to couple the PEs.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +1-10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Here, the term "die" generally refers to a silicon chip comprising various logic circuits. A die can have multiple tiles or instances of the same logic. For example, compute die can have multiple compute tiles. Each tile may include one or more processor cores or compute cores. In another example, a memory die may include multiple memory tiles or memory banks. Each memory tile can have its own memory controller. In some examples, a memory die has one controller for all memory tiles in that memory die. In some examples, the memory controller can be part of the compute die. In other examples, the memory controller can be a distributed logic which resides in compute tiles and/or memory tiles.

Here, the term "tile" generally refers to an instance of a logic/memory in one or more die. The tile is generally repeated in some M×N configurations, where M and N are numbers. One die can have tiles of different kinds or same kind. For example, a compute die may have tiles of compute cores and memory. In another example, different functionality groups of tiles are intermixed in a die.

It is pointed out that those elements of the figures having the same reference numbers (or names) as the elements of any other figure can operate or function in any manner similar to that described, but are not limited to such.

FIG. 1 illustrates a high-level architecture of a system 100 comprising of a microprocessor and memory subsystem together with an artificial intelligence (AI) accelerator with Fe-RAM, where the accelerator comprises a compute die positioned on top of a memory die, in accordance with some embodiments. The AI accelerator is capable of performing AI operations such as training and inference and aids the microprocessor in the system for faster processing.

AI machine 100 comprises computational block 101 or processor having random access memory (RAM) 102 and computational logic 103; static random access memory (SRAM) or Fe-RAM 104, main processor 105, dynamic random access memory (DRAM) 106, and solid-state memory or drive (SSD) 107. In some embodiments, some or all components of AI machine are packaged in a single package forming a system-on-chip (SOC). In some embodiments, computational block 101 is packaged in a single package and then coupled to processor 105 and memories 104, 106, and 107 on a printed circuit board (PCB). In various embodiments, computational block 101 comprises a special purpose compute die 103 or microprocessor. In some embodiments, RAM 102 is a Ferro-electric RAM (Fe-RAM) which forms a special memory/cache for the special purpose compute die 103. The various memories (such as 104, 106, etc.) herein can be any one of: SRAM, Fe-RAM, Re-RAM, MRAM, DRAM, etc. In some embodiments, compute die 103 is specialized for applications such as Artificial Intelligence, graphics processing, digital signal processing, and algorithms for data processing. In some embodiments, compute die 103 has computational logic blocks, for example, multipliers and buffers, a special data memory block (e.g., buffers) comprising FE-RAM and/or SRAM, and other logic. In some embodiments, FE-RAM, SRAM 102, and/or DRAM has weights and inputs stored in-order to improve the computational efficiency. The interconnects between processor 105 or special purpose processor 105, FE-SRAM 104 and compute die 103 are optimized for high bandwidth and low latency. The architecture of FIG. 1 allows efficient packaging to lower the energy, power, and/or cost.

In some embodiments, RAM 102 comprises an SRAM which is partitioned to store input data (or data to be processed) 102a and weight factors 102b. In some embodiments, RAM 102 comprises Fe-RAM. In some embodiments, RAM 102 comprises trenched FE-RAM or planar FE-RAM. In some embodiments, input data 102a is stored in a separate memory (e.g., a separate memory die) and weight factors 102b are stored in a separate memory (e.g., separate memory die).

In some embodiments, computational logic 103 comprises matrix multiplier, adder, concatenation logic, buffers, and combinational logic. In various embodiments, computational logic 103 performs multiplication operation on inputs 102a and weights 102b. In some embodiments, weights 102b are fixed weights. For example, processor 105 (e.g., a graphics processor unit (GPU), an AI processor, inference chip, a central processing unit (CPU), or any other high performance processor that computes the weights for a training model. Once the weights are computed, they are stored in memory 102b. In various embodiments, the input data that is to be analyzed using a trained model is processed by computational block 101 with computed weights 102b to generate an output (e.g., a classification result).

In some embodiments, SRAM 104 is ferroelectric based SRAM. For example, a six transistor (6T) SRAM bit-cells having ferroelectric transistors is used to implement a non-volatile Fe-SRAM. In some embodiments, SSD 107 comprises NAND flash cells. In some embodiments, SSD 107 comprises NOR flash cells. In some embodiments, SSD 107 comprises multi-threshold NAND flash cells.

In various embodiments, the non-volatility of Fe-RAM is used to introduce new features such as security, functional safety, and faster reboot time of architecture 100. The non-volatile Fe-RAM is a low power RAM that provides fast access to data and weights. Fe-RAM 104 can also serve as a fast storage for inference die 101 (accelerator, AI ASCI), which typically has low capacity and fast access requirements.

In various embodiments, the Fe-RAM (trenched FE-RAM or planar FE-RAM) includes non-linear polar material. The non-linear polar material includes one of: ferroelectric (FE) material, para-electric material, relaxor ferroelectric or non-linear dielectric.

The ferroelectric (FE) material may be in a transistor gate stack or in a capacitor of the memory. The ferroelectric material can be any suitable low voltage FE material that allows the FE material to switch its state by a low voltage (e.g., 100 to 550 mV).

In various embodiments, FE material can be any suitable low voltage FE material that allows the FE material to switch its state by a low voltage (e.g., 100 to 550 mV mV). In some embodiments, FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted $BiFeO_3$, $BiCrO_3$, $BiCoO_3$ class of materials, La or rare earth substitution into the Bi site can tune the spontaneous distortion. In some embodiments, FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In some embodiments, the perovskite includes one of: BaTiO3, PbTiO3, KNbO3, NaTaO3, LaCoO3, SrCoO3, SrRuO3, LaMnO3, SrMnO3, YBa2Cu3O7, Bi2Sr2CaCu2O8, or LaNiO3.

In some embodiments, FE material comprises hexagonal ferroelectrics of the type $h\text{-}RMnO_3$, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: $YMnO_3$ or $LuFeO_3$. In various embodiments, when FE material comprises hexagonal ferroelectrics, the conductive oxides are of A2O3 (e.g., In2O3, Fe2O3) and ABO3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material 105 for storing the charge state, the embodiments are also applicable for paraelectric material. For example, the capacitor of various embodiments can be formed using paraelectric material instead of ferroelectric material.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, FE material includes one or more of: Hafnium (Hf), Zirconium (Zr), Aluminum (Al), Silicon (Si), their oxides or their alloyed oxides. In some embodiments, FE material 105 includes one or more of: Al(1-x)Sc (x)N, Ga(1-x)Sc(x)N, Al(1-x)Y(x)N or Al(1-x-y)Mg(x)Nb (y)N, y doped $HfO_2$, where x includes one of: Al, Ca, Ce, Dy, Er, Gd, Ge, La, Sc, Si, Sr, Sn, or Y, wherein 'x' is a fraction.

In some embodiments, FE material includes Bismuth ferrite (BFO), BFO with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb; and relaxor ferroleectrics such as PMN-PT. In some embodiments, FE material 105 includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, FE material includes Hafnium oxides of the form, Hfl-x Ex Oy where E can be Al, Ca, Ce, Dy, er, Gd, Ge, La, Sc, Si, Sr, Sn, or Y. In some embodiments, FE material 105 includes Niobate type compounds LiNbO3, LiTaO3, Lithium iron Tantalum Oxy Fluoride, Barium Strontium Niobate, Sodium Barium Niobate, or Potassium strontium niobate.

Threshold in FE material has a highly non-linear transfer function in the polarization vs. voltage response. The threshold is related to a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfectly epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, FE material comprises organic material. For example, Polyvinylidene fluoride or polyvinylidene difluoride (PVDF).

In some embodiments, FE material couples to a transistor via one or more electrodes and a barrier material coupled to one of the electrodes. The barrier material may be formed of refractive inter-conductive material (e.g., Ti—Al, Ti, V, Cr, Mn, Zr, Nb, Mo, Tc, Ru, Rh, Hf, Ta, W, Re, Os, Ir, Al, or Co). In some embodiments, the barrier layer is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer is matched with the lattice parameters of the conductive oxides and/or the FE material 105.

Figure 2A:
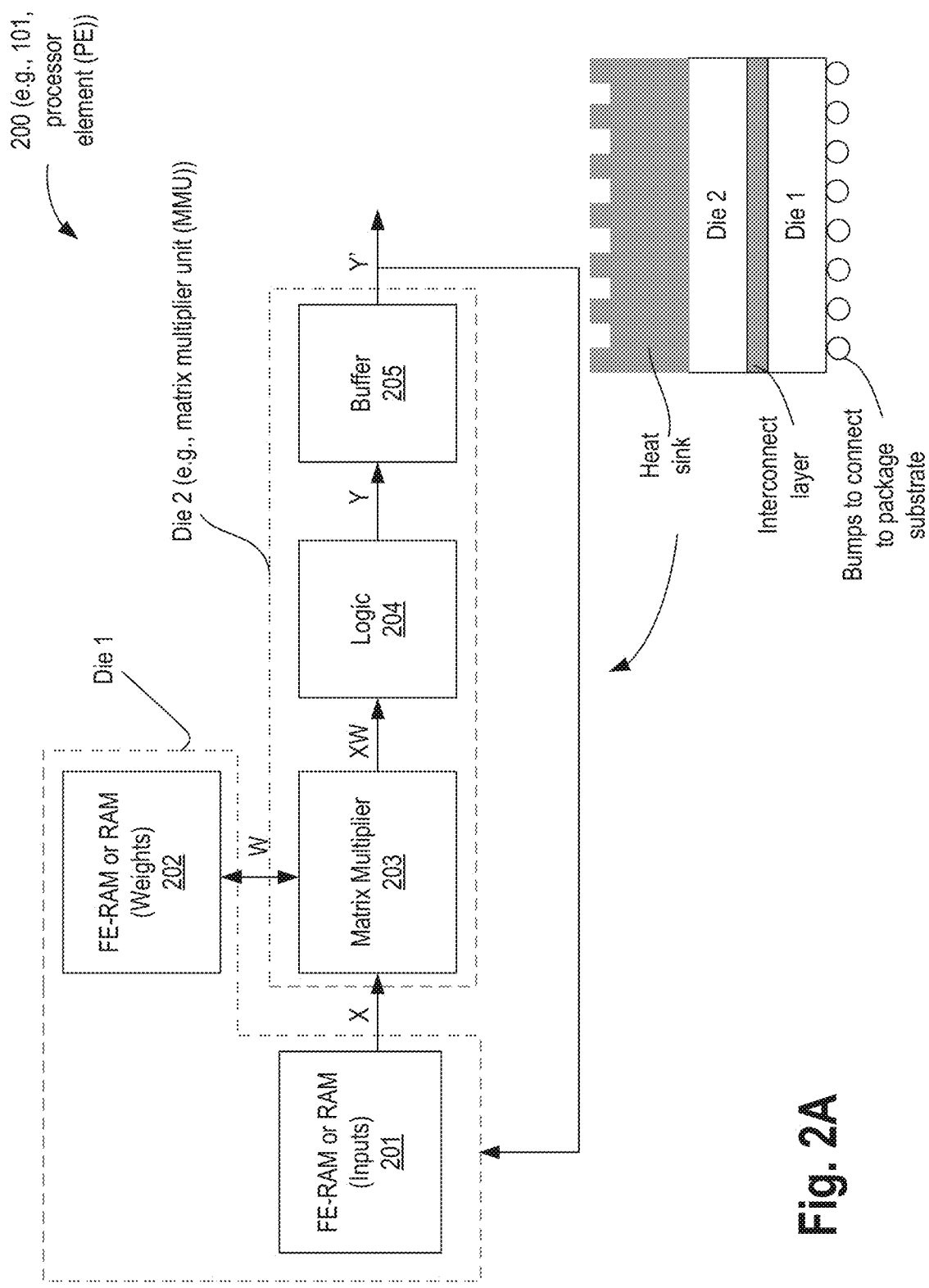
FIG. 2A illustrates an architecture of a computational block comprising a compute die positioned on top of a memory die, in accordance with some embodiments.

FIG. 2A illustrates an architecture of computational block 200 (e.g., 101) comprising a compute die positioned on top of a memory die, in accordance with some embodiments. This type of computational block can be used as a unit inside an AI accelerator, where the blocks connect via interconnect. The architecture of FIG. 2A illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, memory die is a high bandwidth memory (HBM) which comprises multiple dies of memories in a stack and a controller to control the read and write functions to the stack of memory dies. In some embodiments, memory die comprises a first die 201 to store input data and a second die 202 to store weight factors. In some embodiments, memory die is a single die that is partitioned such that first partition 201 of the memory die is used to store input data and second partition or tile 202 of the memory die is used to store weights. In some embodiments, the memory die comprises FE-RAM (e.g., trenched FE-RAM or planar FE-RAM). In some embodiments, the memory die comprises SRAM or DRAM. In some embodiments, the memory die comprises MRAM. Memory partitions 201 and 202, or memory dies 201 and 202 include one or more of: trenched FE-RAM or planar FE-RAM, SRAM, DRAM, and/or MRAM. In some embodiments, the input data stored in memory partition or die 201 is the data to be analyzed by a trained model with fixed weights stored in memory partition or die 202.

In some embodiments, compute die comprises matrix multiplier 203, logic 204, and temporary buffer 205. Matrix multiplier 203 performs multiplication operation on input data 'X' and weights 'W' to generate an output 'Y'. This output may be further processed by logic 204. In some embodiments, logic 204 performs a threshold operation, pooling and drop out operations, and/or concatenation operations to complete the AI logic primitive functions. In some embodiments, the output of logic 204 (e.g., processed output 'Y') is temporarily stored in buffer 205. In some embodiments, buffer 205 is memory such as one or more of: trenched FE-RAM or planar FE-RAM, MRAM, resistive RAM (Re-RAM), DRAM, and/or SRAM. In some embodiments, buffer 205 is part of the memory die (e.g., Die 1). In some embodiments, buffer 205 performs the function of a re-timer. In some embodiments, the output of buffer 205 (e.g., processed output 'Y') modifies the weights in memory partition or die 202. In one such embodiment, computational block 200 not only operates as an inference circuitry, but also as a training circuitry to train a model. In some embodiments, matrix multiplier 203 includes an array of multiplier cells, wherein the RAMs 201 and 202 include arrays of memory bit-cells, respectively, wherein each multiplier cell is coupled to a corresponding memory bit-cell of the RAM 201 and/or RAM 202. In some embodiments, computational block 200 comprises an interconnect fiber coupled to the array of multiplier cells such that each multiplier cell is coupled to the interconnect fiber.

Architecture 200 provides reduced off-chip memory accesses for compute die (e.g., die 2) by providing data locality for weights, inputs and outputs. In one example, data from and to the AI computational blocks (e.g., matrix multiplier 203) is locally processed within a same packaging unit. Architecture 200 also segregates the memory and logic operations on to memory die (e.g., Die 1) and logic die (e.g., Die 2), respectively, allowing for optimized AI processing. Segregated dies allow for improved yield of the dies. A high-capacity memory process for Die 1 allows reduction of power of the external interconnects to memory, reduces cost of integration, and also results in a smaller foot-print. In some embodiments, memories 201 and 202 can be a single memory partitioned into memory segments 201 and 202. In some embodiments, memory 201 and/or memory 202 can be single memory or multiple memories. In some embodiments, all components of FIG. 2 are on a single die which is partitioned into memory segments that comprises memory 201 and 202, and logic segments that comprise matrix multiplier 203, logic 204, and/or buffer 205.

Figure 2B:
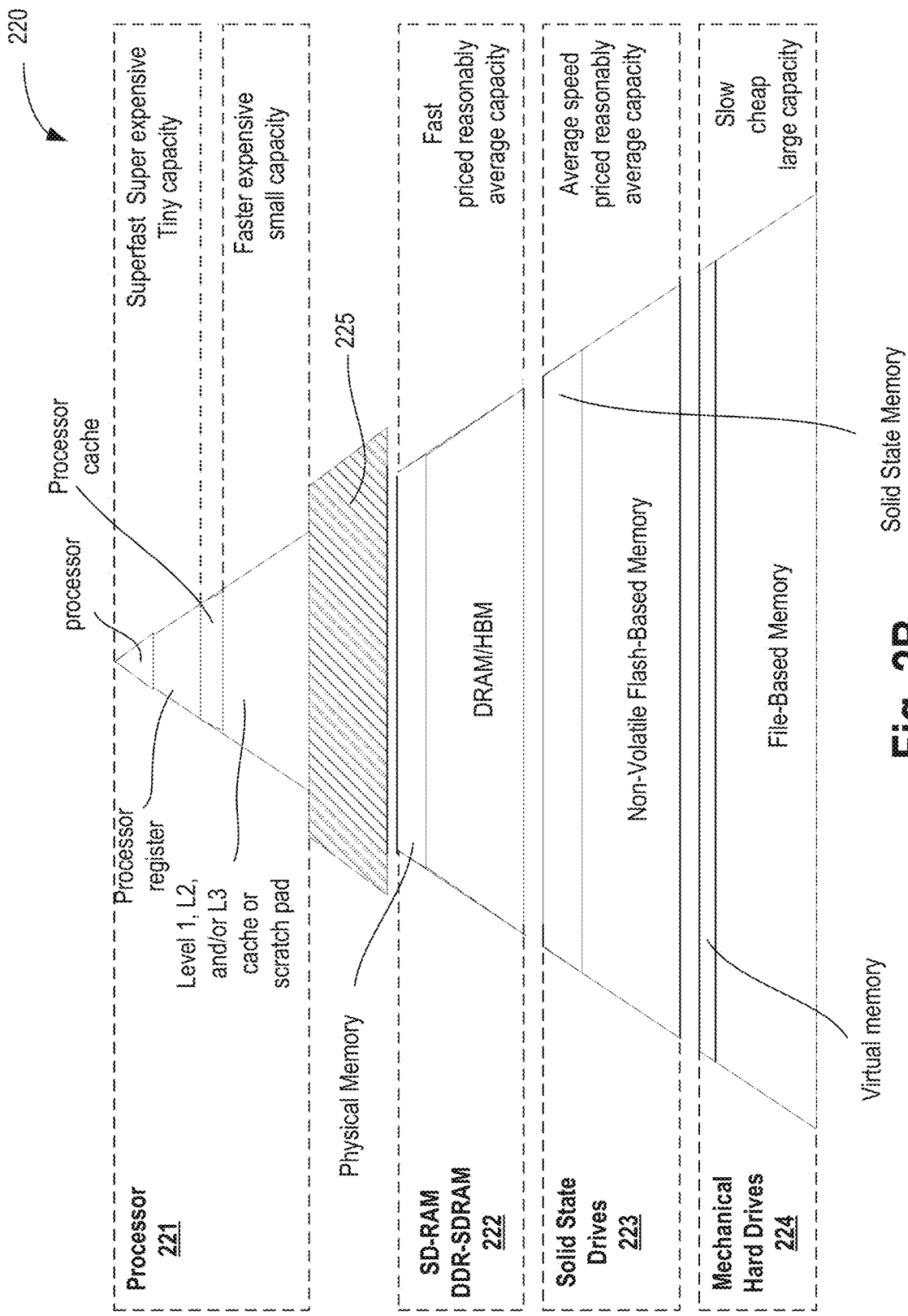
FIG. 2B illustrates a memory hierarchy that shows the unique place of high-speed and relatively large memory capacity achieved by the architecture of FIG. 2A, in accordance with various embodiments.

FIG. 2B illustrates memory hierarchy 220 that shows the unique place of high-speed and relatively large memory capacity achieved by the architecture of FIG. 2A, in accordance with various embodiments. The pyramid shaped hierarchy 220 groups certain memories in accordance to their speed (e.g., speed of access and writing), cost, and capacity. Processor 221 take the top stop of hierarchy 220 while processor registers such as flip-flops, latches providing the fast read and write operations. The speed of a processor (e.g., a CPU) is generally dictated by the critical timing paths, and flip-flops and latches are part of those paths. Using registers for large scale memory usage is expensive since they use many devices to implement that results in high power consumption.

Cache memory (and/or scratch pad) coupled to a processor core occupies space just below the registers. Cache memory usually comprises SRAM memory bit-cells. These bit-cells use few transistors (e.g., 6 transistors) and have fast read and write. Cache memory is used to store data that is readily used by the processor so that the processor can avoid expensive and latency heavy transactions with larger memories off die or far away from the processor core.

Modern processors benefit from the fast speed of cache (and/or scratch pad) by using multi-level caches. These caches provide deeper memory. For example, when data needed by the processor is not found in the cache, it looks into level-1 cache (L1 cache), then L2 cache and so on. Usually, processors have up to 3 levels of cache, but can have more. The more levels of cache add more latency and so the benefit for extra levels of cache may diminish. This deeper level of cache are usually part of the processor. However, the capacity of the deeper memory is low because they are allotted a small real estate in the processor die.

Below processor 221, the next level of memory is dynamic random access memory (DRAM) and high bandwidth memory (HBM) 222. These memories include memories such as a synchronous DRAM (SD-RAM), and double data rate (DDR) compliant SD-RAM. These memories are fast memories and are readily available in the market, and as such they are reasonably priced. However, the refresh operation required for such dynamic memories may limit the overall capacity of such memories.

Below DRAM and HBM 222, are solid state drives (SSD) 223. These memories include flash memory, NAND memory, NOR memory, and other non-volatile flash based memory. SSD devices vary in their properties according to the number of bits stored in each cell. As such, SSDs are categorized as single bit cell memory where each bit cell stores a single bit; a 2-bit cell memory (MLC) which is a multi-level bit-cell that stores 2 bits per cell; a 3-bit cell memory (TLC) which is another multi-level bit-cell that stores 3 bits per cell; a 5-bit cell memory (QLC) which stores 4 bits per cell. SLC is generally the most reliable, durable, fast, and expensive type compared to MLC and TLC. QLC is generally used for consumer devices that do not need such extreme properties and are the cheapest of the four. Given the speed of access, price, and capacity, SSDs 223 are below DRAM/HMB 222.

Below SSD 223 are the typical mechanical hard drives or disks 224. These memories are slow, inexpensive, but provide very large capacity. These are generally located on the motherboard.

The hierarchy of memories 220 classifies memories based on capacity, speed, and cost. The memory architecture of various embodiments result is a new classification indicated by 225. This memory comprises a plurality of memory tiles positioned under a compute die that comprises a plurality of processing elements (PEs). The memory tiles are coupled to the PEs via fast I/Os that are coupled to an interconnect fabric. The memory tiles can be scratch pads. In some embodiments, the interconnect fabric can be a mesh or ring that can be realized in the compute die, memory die, or both. The memory bit-cells in the memory dies can be SRAM, DRAM, FeRAM, or MRAM. This unique architecture provides a memory that is faster than DRAM/HBM 222 and comparable to that of multi-level caches, has a capacity substantially equal or less than that of DRAM 222 and perhaps that of SSDs 223. This new class of memory 225 disrupts the traditional hierarchy of memories 220 with much needed speed, low cost, and high capacity. For example, the new class of memory 225 provides 10× higher bandwidth over HBM and 10× lower energy per bit over HBM for existing process technologies because of tighter integration, and distributed nature of access.

Figure 2C:
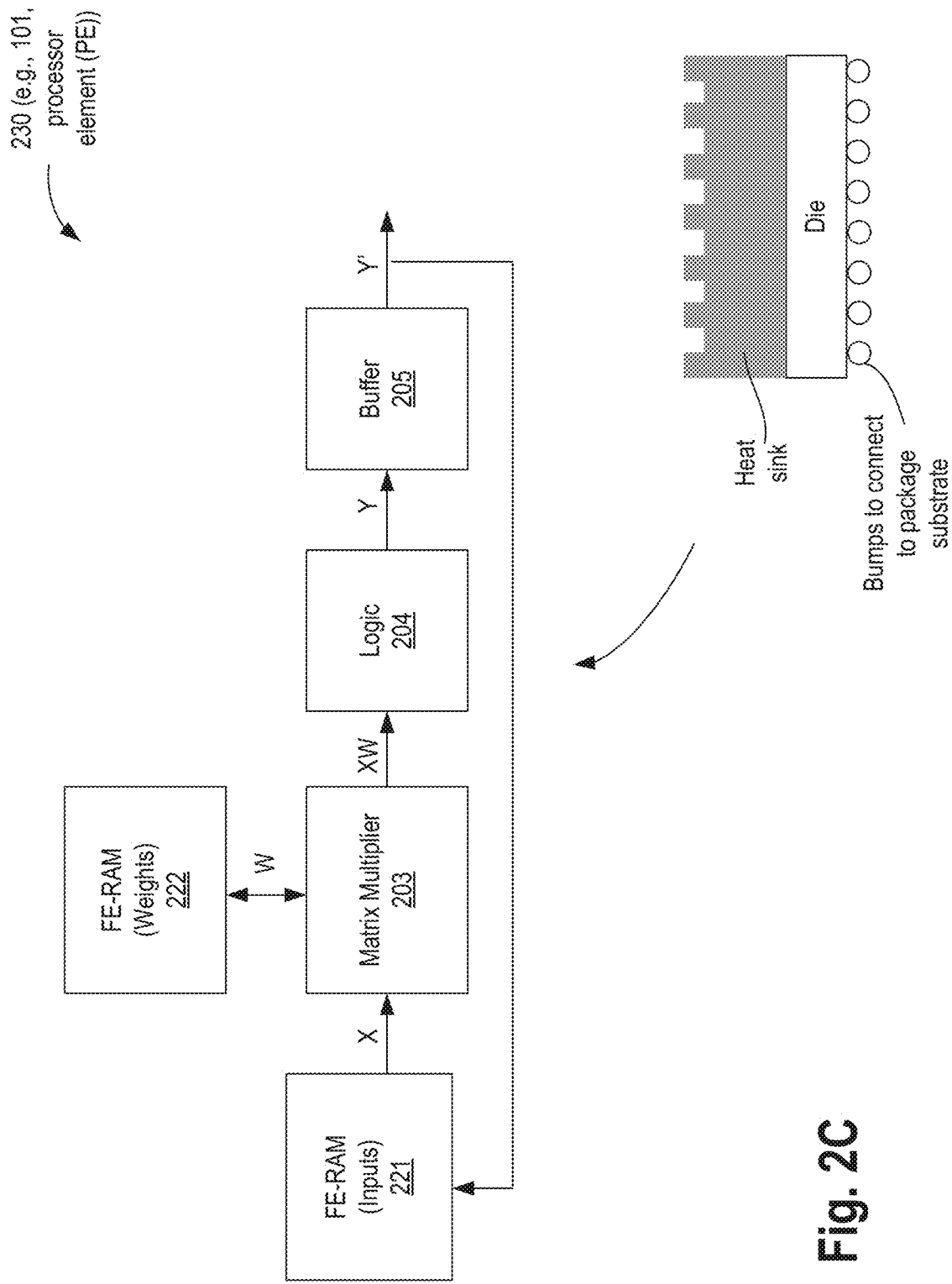
FIG. 2C illustrates an architecture of a single die where weights and inputs are stored in a ferroelectric (FE) random access memory (RAM), in accordance with some embodiments.

FIG. 2C illustrates architecture 230 of a single die where weights and inputs are stored in a ferroelectric (FE) random access memory (RAM), in accordance with some embodiments. Compared to FIG. 2A, here memory components or memory tiles are not on a separate die below a compute die, but instead are part of a system-on-chip (SoC) residing alongside the components of the compute die. In various embodiments, the inputs 221 and weights 222 are stored in an FE-RAM instead of a non-FE RAM. Such memory allows for fast access to inputs 221 and weights 222 at low power. In some embodiments, the die of matrix multiplier 230 comprises a first circuitry to generate a training model having weight factors 222. The die further comprises a second circuitry 203 to multiply an input data with the weight factors to generate an output representative of an error. As discussed herein, a first ferroelectric random access memory (FE-RAM) 221 stores the input data while a second FE-RAM stores the weight factors 222. In various embodiments, second circuitry 202 is communicatively coupled to the first and second FE-RAMs. In some embodiments, buffer 205 is communicatively coupled to the first FE-RAM 221. The die further comprises a ring or mesh interconnect, wherein the ring mesh interconnect is coupled to: buffer 205, the first FE-RAM 221; the second circuitry 203, and the second FE-RAM 222. In some embodiments, the die includes a memory interface to communicate with a memory (e.g., memories 104, 106, 107) external to the die. In some embodiments, this external memory is one of a FE-RAM or an SRAM.

In some embodiments, the second circuitry 203 includes a first matrix multiplier and a second multiplier. The input data 221 is split into a first data and a second data while the weight factors are split into a first weight factor and a second weight factor. In some embodiments, the first matrix multiplier multiplies the first data with the first weight factor to generate a first output, while the second matrix multiplier multiplies the second data with the second weight factor to generate a second output. In some embodiments, the die includes adder, which is to add the first output with the second output to generate a third output, wherein the third output is stored in the first FE-RAM 221.

The various schemes of matrix multiplication described herein to generate outputs from inputs and weights are applicable to the architecture of FIG. 2C.

FIGS. 3A-F illustrate the concept of splitting input data and weights when size of input data is above a threshold, multiplying the split portions with weights to generate outputs for each split portion, and then adding the outputs to generate the final output, in accordance with some embodiments.

Figure 3A:
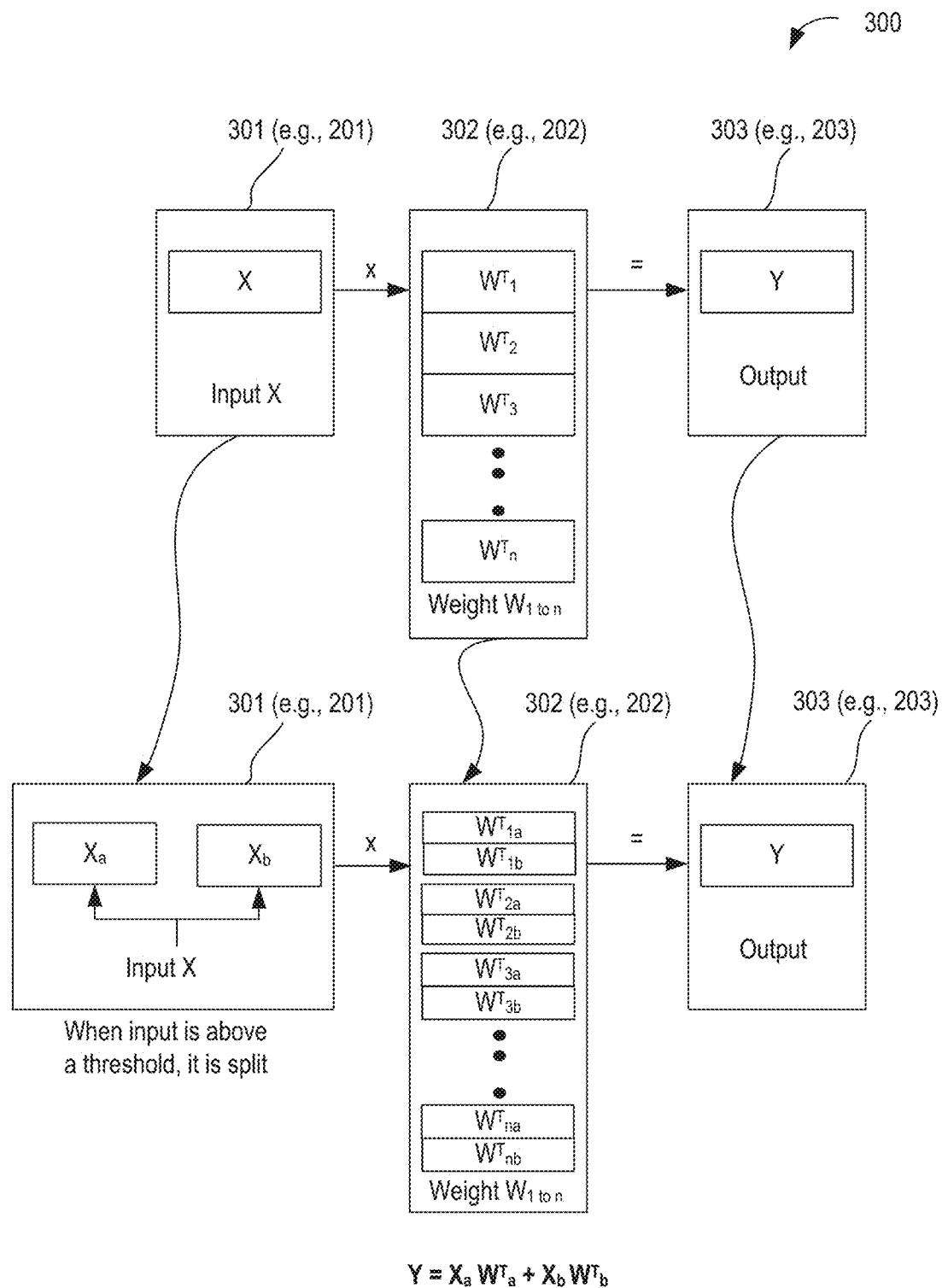
FIGS. 3A-F illustrate the concept of splitting input data when size of input data is above a threshold, multiplying the split portions with weights to generate outputs for each split portion, and then adding the outputs to generate the final output, in accordance with some embodiments.

FIG. 3A shows illustration 300 of multiplying input X with weights $W^T_1$ to $W^T_n$ to generate output Y, in accordance with some embodiments. Input X 301 are stored in memory 301. Weights $W^T_1$ to $W^T_n$ 302 are stored in memory 302. The output Y 303 is the result of multiplication by multiplier 203. In some embodiments, inputs X 301 and weights W 302 are blocked (or split) and allocated across two different matrix multiplication units (MMUs). In some embodiments, when input X is large (e.g., above a first threshold), input is split into inputs Xa and Xb. The first threshold can be fixed or programmable by software (e.g., firmware, operating system) and/or hardware (e.g., fuses). In some embodiments, when weight $W^T$ is large (e.g., above a second threshold), weight $W^T$ is split. For example, $W^T_1$ is split into inputs $W^T_{1a}$ and $W^T_{1b}$, $W^T_2$ is split into inputs $W^T_{2a}$ and $W^T_{2b}$. The second threshold can be fixed or programmable by software (e.g., firmware, operating system) and/or hardware (e.g., fuses). The split inputs and weights are multiplied to achieve output Y, as expressed as:

$$Y = X_a W_a^T + X_b W_b^T + \quad (1)$$

In some embodiments, if X has M rows, then these M rows can be distributed to different processor cores (or PE cores). This process is also referred to as batch parallelism.

Figure 3B:
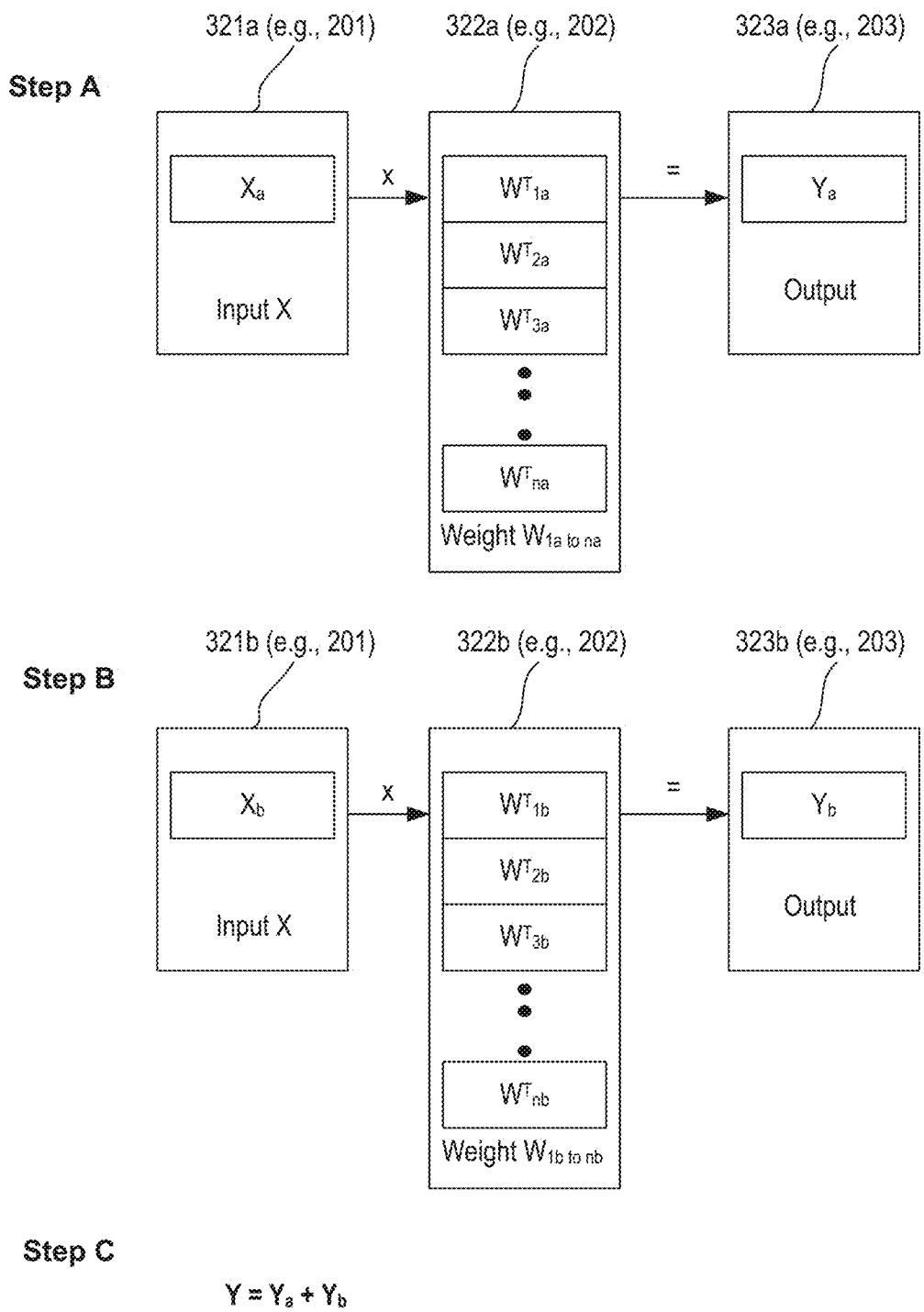

FIG. 3B shows illustration 320 of multiplying input X with weights $W^T_1$ to $W^T_n$ to generate output Y, in accordance with some embodiments. Here, the process of multiplying is illustrated by a 3-step process. The split inputs X are $X_a$ 321a and $X_b$ 321b that are stored in memory 201. The weights $W^T$ are blocked into $W^T_a$ 322a and $W^T_b$ 322b. Weights $W^T_a$ 322a are further split into $W^T_{1a}$ though $W^T_{Na}$ (where 'N' is a number). Weights $W^T_b$ 322b are further split into $W^T_{1b}$ though $W^T_{Nb}$ (where 'N' is a number). After the input and weights are split of blocked as illustrated, the multiplication process begins for individual groups as follows:

$$Y_a = X_a W_a^T \qquad (2)$$

$$Y_b = X_b^T \qquad (3)$$

$$Y = Y_a + Y_b \qquad (4)$$

Figure 3C:
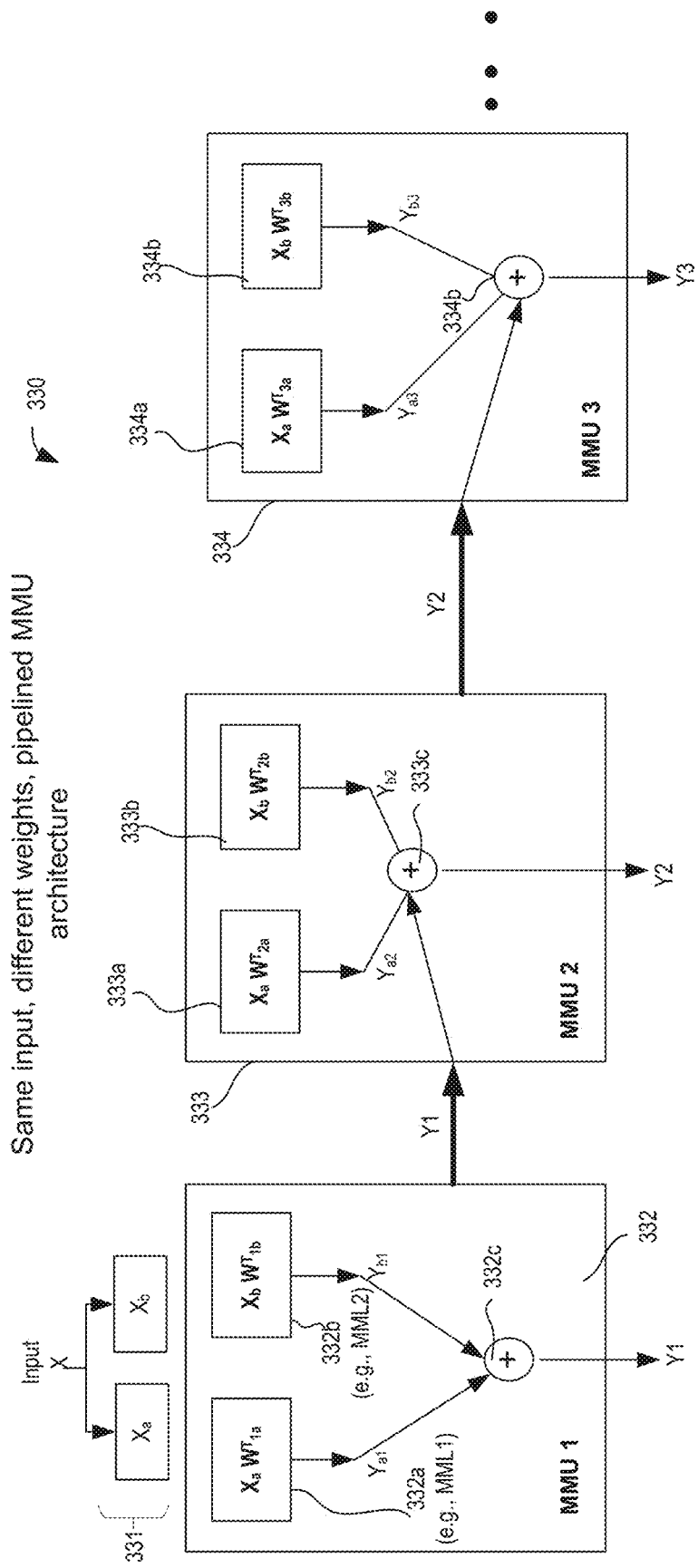

FIG. 3C illustrates a pipelined MMU architecture 330 for multiplying the split or blocked inputs X and weights $W^T$, in accordance with some embodiments. In various embodiments, filter blocking is achieved across two compute blocks. For example, when input X is large (e.g., above a threshold), input is split into Xa and Xb. The split inputs are multiplied with weights to generate outputs Ya and Yb. These outputs from MMU1 are sent to MMU2, wherein the outputs are added to generate a final output. MMU2 also receives split input and multiplies the inputs with the weights to generate outputs Ya and Yb. These outputs are then sent to the next MMU (MMU3), where an adder is used to add Ya and Yb to generate another output. This process continues and as such all the inputs and weights in a matrix are multiplied to generate an output Y matrix.

Architecture 330 illustrates three of the N MMUs (e.g., MMU 332, 333, and 334) that are coupled in a pipeline where output of one MMU is fed as input to the next MMU and so on. Each MMU has logic to multiply the blocked or split inputs 331 and weights, and logic to add the multiplication result to form the output of that MMU. For example, MMU1 332 includes multiplying logic (MML) 332a, 332b, and adder 332c. Multiplying logic 332a multiplies input $X_a$ and weight $W^T_{1a}$ to generate $Y_{a1}$. Multiplying logic 332b multiplies input $X_b$ and weight $W^T_{1b}$ to generate $Y_{b1}$. Adder 332c adds Ya and Yb to output Y1. Output Y1 is also provided to MMU2 333.

MMU2 333 includes multiplying logic (MML) 333a, 333b, and adder 333c. Multiplying logic 333a multiplies input $X_a$ and weight $W^T_{2a}$ to generate Y. Multiplying logic 333b multiplies input $X_b$ and weight $W^T_{2b}$ to generate $Y_{b2}$. Adder 333a adds $Y_{a2}$, $Y_{b2}$ and Y1 to generate output Y2. Output Y2 is also provided to MMU2 334.

MMU2 334 includes multiplying logic (MML) 334a, 334b, and adder 334c. Multiplying logic 334a multiplies input $X_a$ and weight $W^T_{2a}$ to generate Y. Multiplying logic 334b multiplies input $X_b$ and weight $W^T_{2b}$ to generate $Y_{b2}$. Adder 334a adds $Y_{a2}$, $Y_{b2}$ and Y3 to generate output Y3, and so on to next MMU in architecture 330. In some embodiments, MMUs are coupled via a ring-interconnect.

Figure 3D:
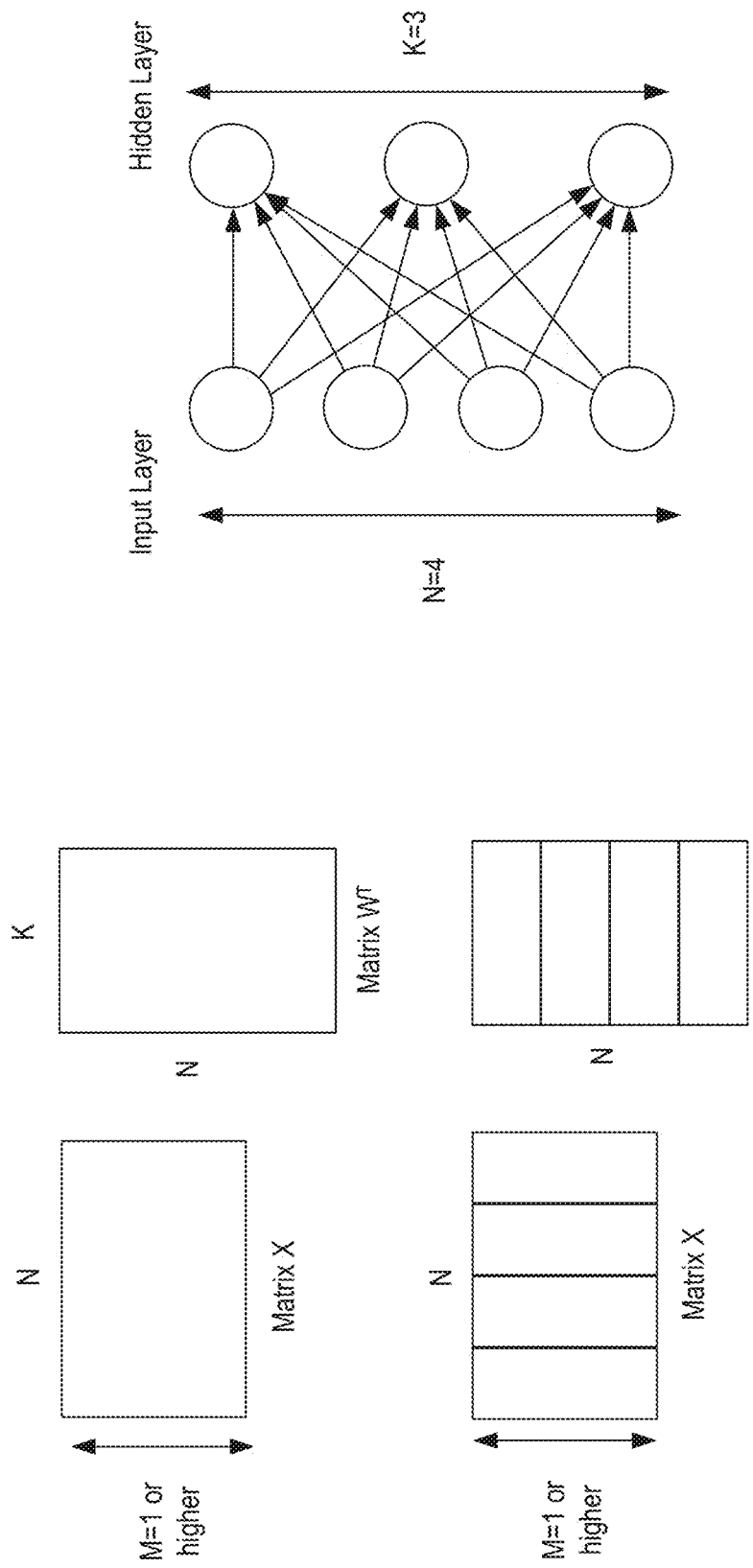

FIG. 3D illustrates a visual depiction 340 of blocking input X and weight $W^T$ matrices, in accordance with some embodiments. Here, input matrix X has M rows and N columns while weight matrix $W^T$ has N rows and K columns In this example, the input matrix X and weight matrix $W^T$ are blocked or split into chunks of 4 (e.g., C=4). The size of each block is B, where B=N/C.

Figure 3E:
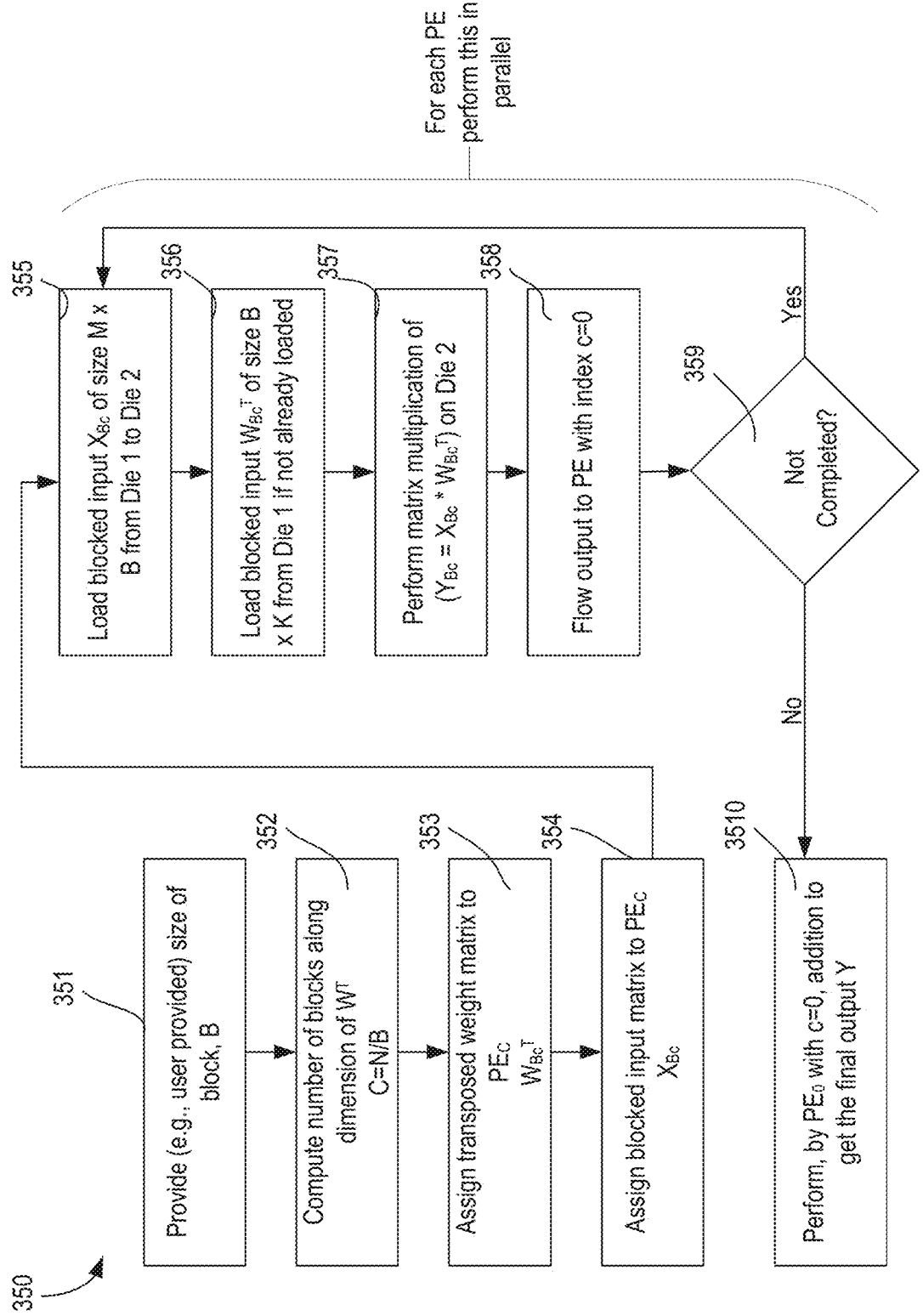

FIG. 3E illustrates flowchart 350 of a method of mapping matrix multiplication function to multiple processing elements (PEs), in accordance with some embodiments. While the various operations are showing in a particular order, the order can be changed. For example, some operations can be performed before others while some operations can be performed in parallel or simultaneously. For example, operations 355-358 may operate in parallel for each PE.

At 351, block size B is identified. Block size B may be provided by user. In some embodiments, block size B is estimated (e.g., B=N/C) and provided to the MMU or PE. Block size B may be stored in a register or memory. At 352, a logic (e.g., one of the PEs, controller, processing core, operating system, or any suitable hardware logic of software logic) computes the number of blocks along dimension weight matrix $W^T$. For example, C=N/B. At 353, logic assigns transposed weight matrix to one of the PEs, PEc. For example, $W_{Bc}^T$ is assigned to PEc, where B is the block size and c is the number of blocks or chucks. At 354, logic assigns the blocked input matrix to PEc. For example, $X_{Bc}$ is assigned to PEc. After transposed weight matrix $W_{Bc}^T$ and blocked input matrix $X_{Bc}$ are assigned to PEc, then for each 'c', the PE performs operations 355, 356, 357, 358, and 359.

At 355, blocked input matrix $X_{Bc}$ of size M×B is loaded from Die 1 (e.g., memory die) to Die 2 (PE die), if not already loaded. At 356, transposed weight matrix $W_{Bc}T$ of size M×K is loaded from Die 1 (e.g., memory die) to Die 2 (PE die), if not already loaded. At 357, PEc of Die 2 performs matrix multiplication as described by FIGS. 3A-C (e.g., $Y_{Bc} = X_{Bc} * W_{Bc}^T$). At 358, PEc provides its output Y and to another PE in the pipeline for accumulation as illustrated by FIG. 3C. For example, output $Y_1$ of $PE_1$ is also provided to $PE_2$. At 359, the logic makes a determination whether additional PEs exist in the pipeline that can perform blocked matrix multiplication. If there are additional PEs, then the process proceeds to 355, otherwise the process proceeds to 3510. In some embodiments, operations 355 through 358 are performed in parallel by each PE in the pipeline. Once all PEs complete their tasks, the process proceeds to block 3510. At 3510, the first PE (e.g., $PE_0$) generates the final output by adding the outputs from each PE. For example, $PE_0$ generates Y as sum of $Y_0$, $Y_1$, $Y_2$, ... $Y_c$, where $Y_0$ is the output of $PE_0$, $Y_1$ is the output of $PE_1$, $Y_2$ is the output of $PE_2$, and $Y_c$ is the output of $PE_c$.

Figure 3F:
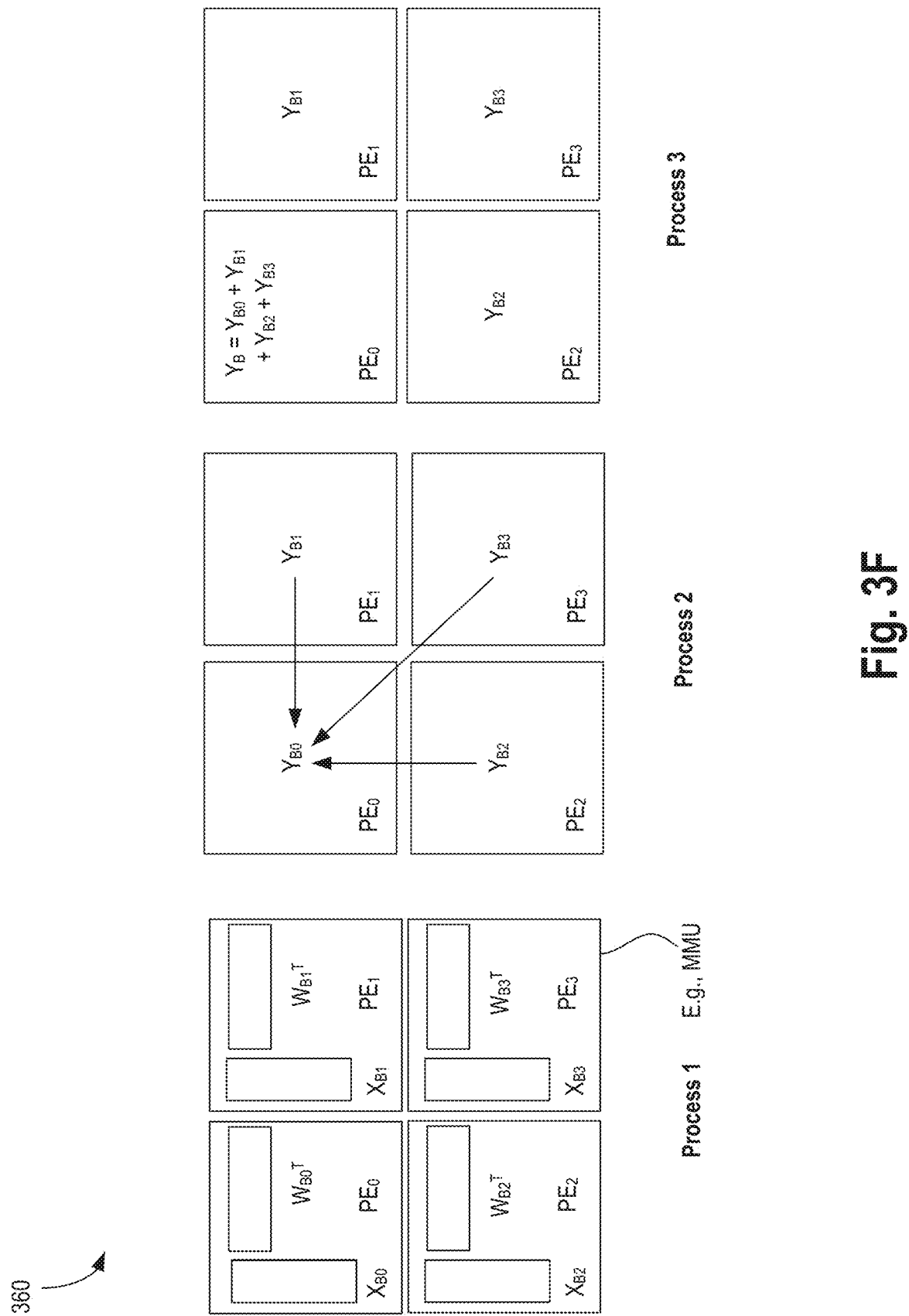

FIG. 3F illustrates a visual process 360 of the flowchart of FIG. 3E, in accordance with some embodiments. In this example, four PEs or MMUs are illustrated. However, the embodiments are applicable to any number of PEs. After the blocked input matrices X and the blocked transposed weight matrices $W^T$ are assigned to their respective PEs, the process of multiplication is ready. In this example, $PE_0$ receives $X_{B0}$ and $W_{B0}^T$ from Die 1, $PE_1$ receives $X_{B1}$ and $W_{B1}^T$ from Die 1, $PE_2$ receives $X_{B2}$ and $W_{B2}^T$ from Die 1, and $PE_3$ receives $X_{B3}$ and $W_{B3}^T$ from Die 1. The multiplication result Y from each PE is gathered by one PE that generates the final multiplication result. In this example, $Y_{B0}$ is the multiplication result of multiplying $X_{B0}$ and $W_{B0}^T$ by $PE_0$, $Y_{B1}$ is the multiplication result of multiplying $X_{B1}$ and $W_{B1}^T$ by $PE_1$, $Y_{B2}$ is the multiplication result of multiplying $X_{B2}$ and $W_{B2}^T$ by $PE_2$, and $Y_{B3}$ is the multiplication result of multiplying $X_{B3}$ and $W_{B3}^T$ by $PE_3$. $PE_0$ then adds the multiplication results to generates the a sub-final multiplication YB result for that blocked input $X_B$ and weight $W_B^T$. Any other PE may also generate the sub-final multiplication result. Depending on the number of blocked input and weights, the sub-final multiplication results are added together. For example, $Y = Y_A + Y_B$.

FIGS. 3G-K illustrate the concept of splitting the weights when size of the weights is above a threshold, multiplying the input with the split weights, and then concatenating the multiplication results to generate an output, in accordance with some embodiments. These figures describe a blocking case, in which inputs X and weights W both are blocked and allocated across two different matrix multiplication units (MMUs). Finally, the output of one MMU flows to the next MMU (e.g., coupled adjacent to the first MMU via a ring-interconnect) and is concatenated. In some embodiments, filter blocking is achieved across two compute blocks. For example, when weights W are large (e.g., above a threshold), the weights are split. The split weights are multiplied with the inputs X to generate outputs Ya and Yb. These outputs from MMU1 are sent to MMU2, wherein the outputs are concatenated to generate a final output. MMU2 also receives split weights and multiplies the inputs with the split weights to generate outputs Ya and Yb. These outputs are then sent to the next MMU (MMU3), where the outputs of MMU2 are concatenated to generate another output. This process continues will all the inputs and weights in a matrix are multiplied to generate an output Y matrix.

FIG. 3G shows illustration 370 of multiplying input X with weights $W^T_1$ to $W^T_k$ to generate output Y, in accordance with some embodiments. Input X 371 are stored in memory 201. Weights $W^T_1$ to $W^T_k$ 372 are stored in memory 202. The output Y 373 is the result of multiplication by multiplier 203. In some embodiments, weights W 372 are blocked (or split) and allocated across two different matrix multiplication units (MMUs). In this example, input X 371 is not split. In some embodiments, when weight $W^T$ is large (e.g., above a threshold), weight $W^T$ is split. For example, $W^T$ is split into inputs $W^T_1$ through $W^T_{1k}$ (identified 372a) and $W^T_k+1$ through $W^T_n$. (identified 372b). The threshold can be fixed or programmable by software (e.g., firmware, operating system) and/or hardware (e.g., fuses). The split weights and fixed input X are multiplied to achieve outputs Ya (373a) and Yb (373b), as expressed as:

$$Y = Y_a \text{conactenate } Y_b \quad (5)$$

Figure 3H:
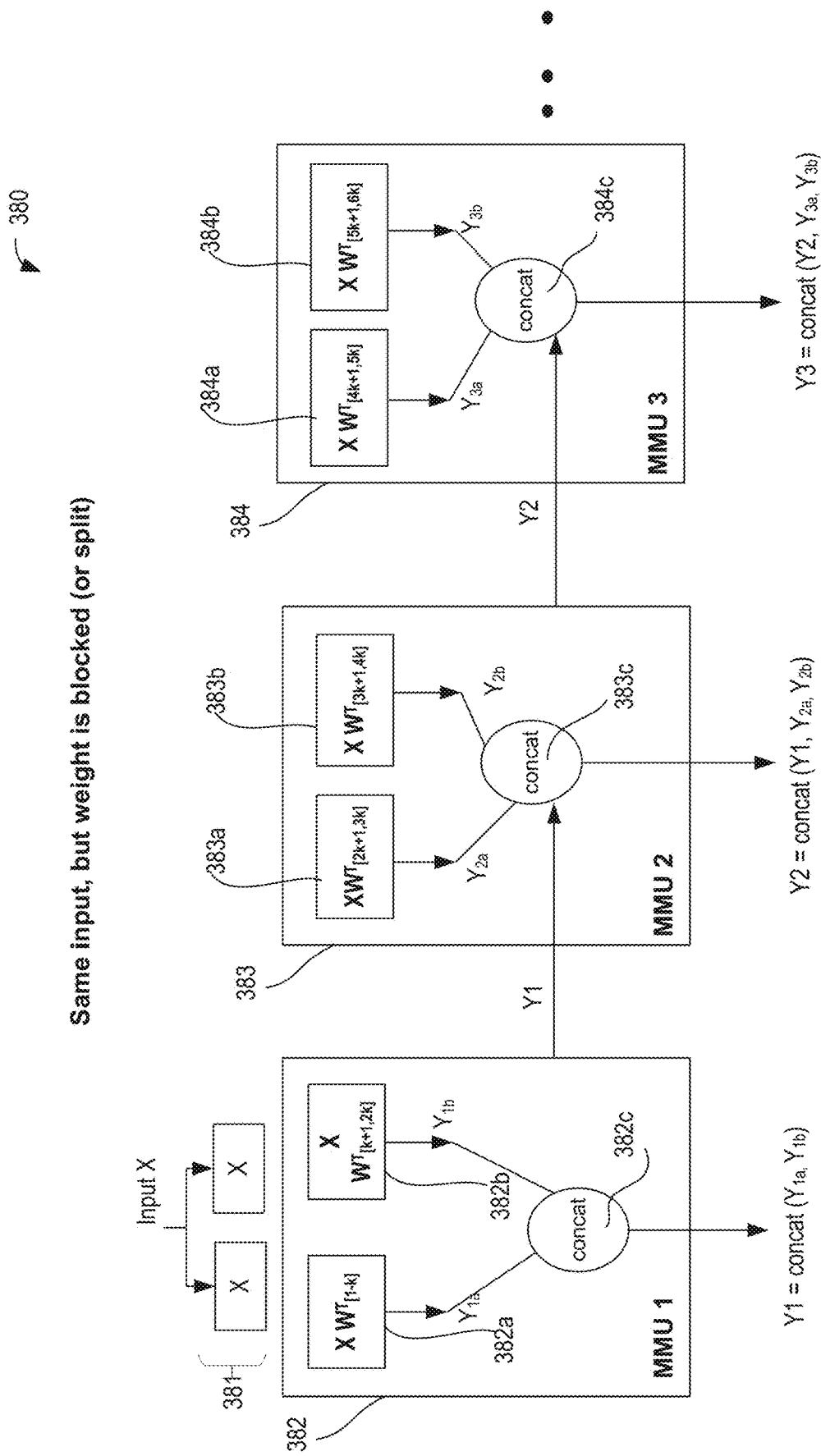

FIG. 3H illustrates a pipelined MMU architecture 380 for multiplying non-split input X with split or blocked weights $W^T$, in accordance with some embodiments. The split or blocked weights $W^T$ are multiplied with input X to generate outputs Ya and Yb. The outputs are concatenated and the concatenated output from MMU1 is sent to MMU2. MMU2 also receives non-split input and multiplies the inputs with the split weights to generate outputs another set of outputs Ya and Yb, which are concatenated. This concatenated output from MMU2 is then sent to the next MMU (MMU3). This process continues and as such all the inputs and weights in a matrix are multiplied to generate an output Y matrix.

Architecture 380 illustrates three of the N MMUs (e.g., MMU 382, 383, and 384) that are coupled in a pipeline where output of one MMU is fed as input to the next MMU and so on. Each MMU has logic to multiply non-split inputs 381 and weights, and logic to concatenate the multiplication result to form the output of that MMU. For example, MMU1 382 includes multiplying logic (MML) 382a, 382b, and concatenation circuitry 382c. Multiplying logic 382a multiplies input X and weight $W^T_{[1+k]}$ to generate $Y_{1a}$. Multiplying logic 382b multiplies input X and weight $W^T_{[1+k, 2k]}$ to generate $Y_{1b}$. Concatenation logic 382c concatenates $Y_{1a}$ and $Y_{1b}$ to generate output Y1. Output Y1 is also provided to MMU2 333.

MMU1 383 includes multiplying logic (MML) 383a, 383b, and concatenation circuitry 383c. Multiplying logic 383a multiplies input X and weight $W^T_{[1+2k,3k]}$ to generate $Y_{2a}$. Multiplying logic 383b multiplies input X and weight $W^T[1+3k, 4k]$ to generate $Y_{2b}$. Concatenation logic 383c concatenates $Y_{2a}$, $Y_{2b}$, and Y1 to generate output Y2. Output Y2 is also provided to MMU2 384.

MMU1 384 includes multiplying logic (MML) 384a, 384b, and concatenation circuitry 384c. Multiplying logic 384a multiplies input X and weight $W^T_{[1+4k,5k]}$ to generate $Y_{3a}$. Multiplying logic 383b multiplies input X and weight $W^T_{[1+5k, 6k]}$ to generate $Y_{3b}$. Concatenation logic 383c concatenates $Y_{3a}$, $Y_{3b}$, and Y2 to generate output Y3. Output Y3 is also provided to the next MMU in architecture 380. In some embodiments, MMUs are coupled via a ring-interconnect.

Figure 3I:
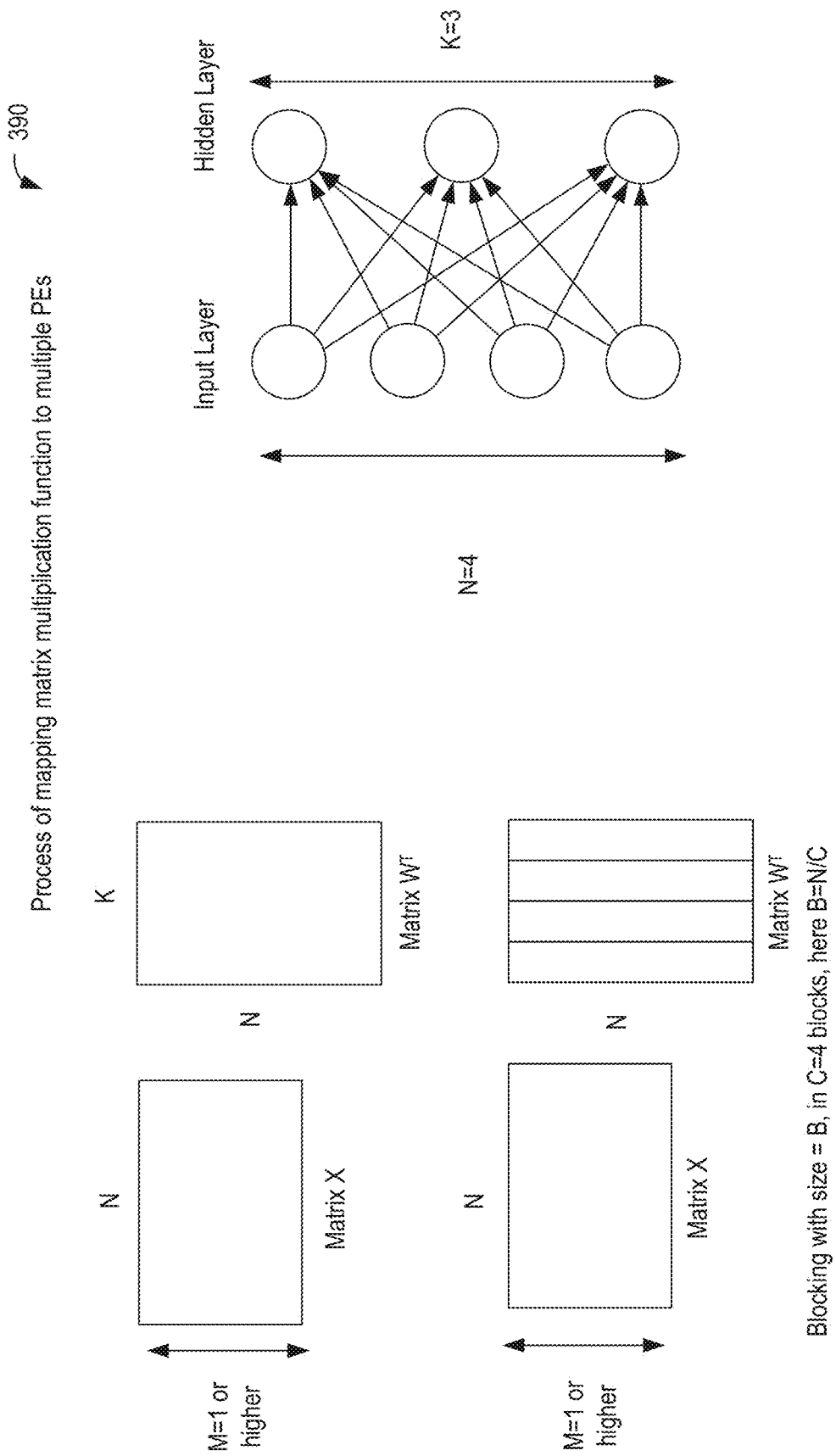

FIG. 3I illustrates a visual depiction 390 of input X and blocking weight $W^T$ matrices, in accordance with some embodiments. Here, input matrix X has M rows and N columns while weight matrix $W^T$ has N rows and K columns In this example, the input matrix X is not blocked (e.g., it is not split) while weight matrix $W^T$ is blocked or split into chunks of 4 (e.g., C=4). The size of each block is B, where B=N/C.

Figure 3J:
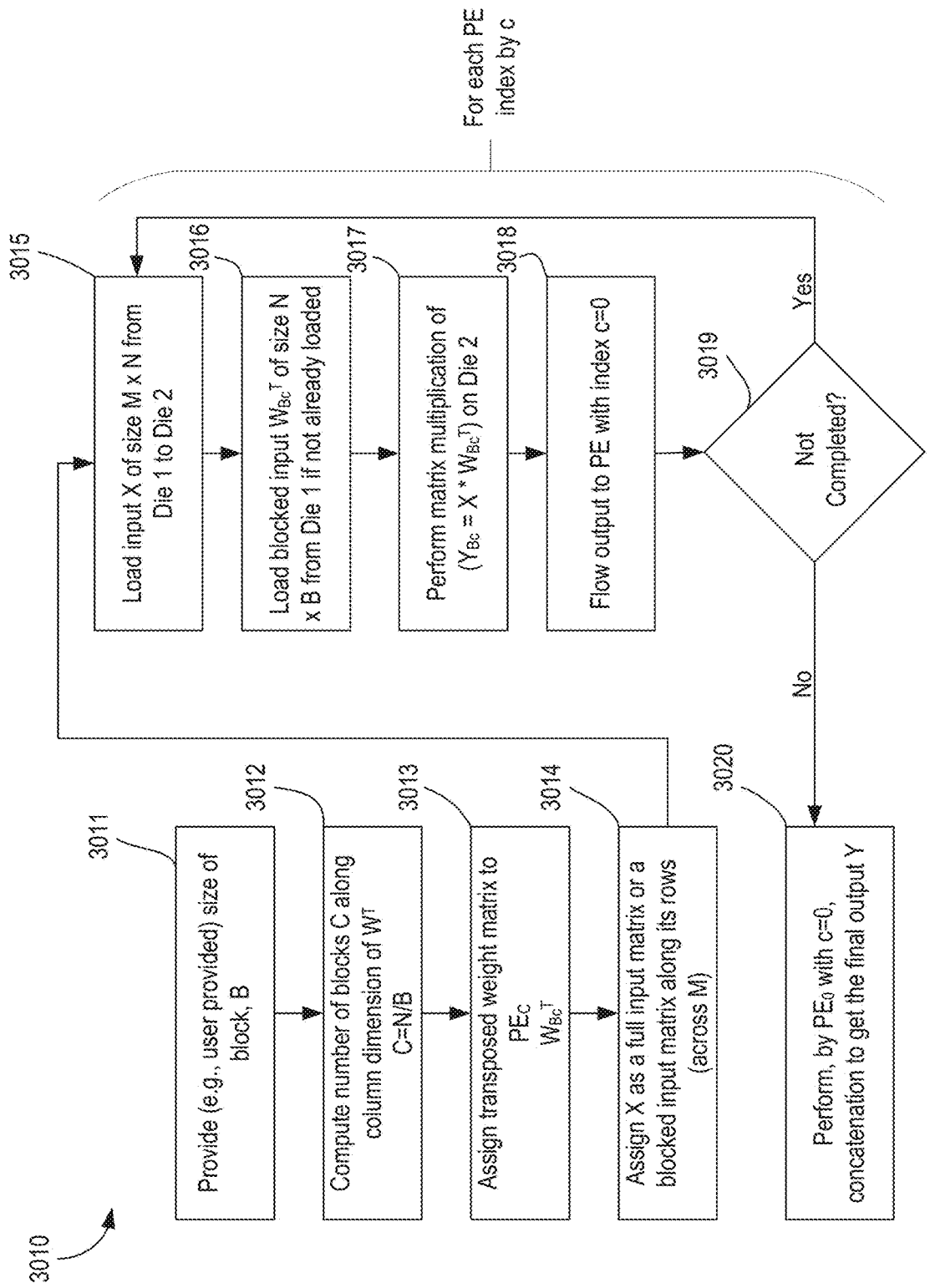

FIG. 3J illustrates flowchart 3010 of a method of mapping matrix multiplication function to multiple processing elements (PEs), in accordance with some embodiments. While the various operations are showing in a particular order, the order can be changed. For example, some operations can be performed before others while some operations can be performed in parallel or simultaneously. In one example, operations 3015 through 3018 are performed in parallel.

At 3011, block size B is identified. Block size B may be provided by user. In some embodiments, block size B is estimated (e.g., B=N/C) and provided to the MMU or PE. Block size B may be stored in a register or memory. At 3012, a logic (e.g., one of the PEs, controller, processing core, operating system, or any suitable hardware logic of software logic) computes the number of blocks along column dimension weight matrix $W^T$. For example, C=N/B. At 3013, logic assigns transposed weight matrix to one of the PEs, PEc. For example, $W_{Bc}^T$ is assigned to PEc, where B is the block size and c is the number of blocks or chucks. At 3014, logic assigns the blocked input matrix to PEc. For example, X is assigned as a full input matrix or as a blocked input matrix along the rows (e.g., across M). After transposed weight matrix $W_{Bc}$T and blocked matrix X are assigned to PEc, then for each 'c', the PE performs operations 3015, 3016, 3017, 3018, and 3019.

At 3015, input matrix X of size M×N is loaded from Die 1 (e.g., memory die) to Die 2 (PE die), if not already loaded. At 3016, transposed weight matrix $W_{Bc}^T$ of size N×B is loaded from Die 1 (e.g., memory die) to Die 2 (PE die), if not already loaded. At 3017, PEc of Die 2 performs matrix multiplication as described by FIGS. 3G-I (e.g., $Y_{Bc}$=X * $W_{Bc}^T$). At 3018, PEc provides its output Y to another PE in the pipeline for concatenation as illustrated by FIG. 3H. For example, output $Y_1$ of $PE_1$ is also provided to $PE_2$. At 3019, the logic makes a determination whether additional PEs exist in the pipeline that can perform blocked matrix multiplication. If there are additional PEs, then the process proceeds to 3015, otherwise the process proceeds to 3020. In some embodiments, operations 3015 through 3018 are performed in parallel by each PE in the pipeline. Once all PEs complete their tasks, the process proceeds to block 3020. At 3020, the first PE (e.g., $PE_0$) generates the final output by concatenating the outputs from each PE. For example, $PE_0$ generates Y as concatenation of $Y_0$, $Y_1$, $Y_2$, ... $Y_c$, where $Y_0$ is the output of $PE_0$, $Y_1$ is the output of $PE_1$, $Y_2$ is the output of $PE_2$, and $Y_c$ is the output of $PE_c$.

Figure 3K:
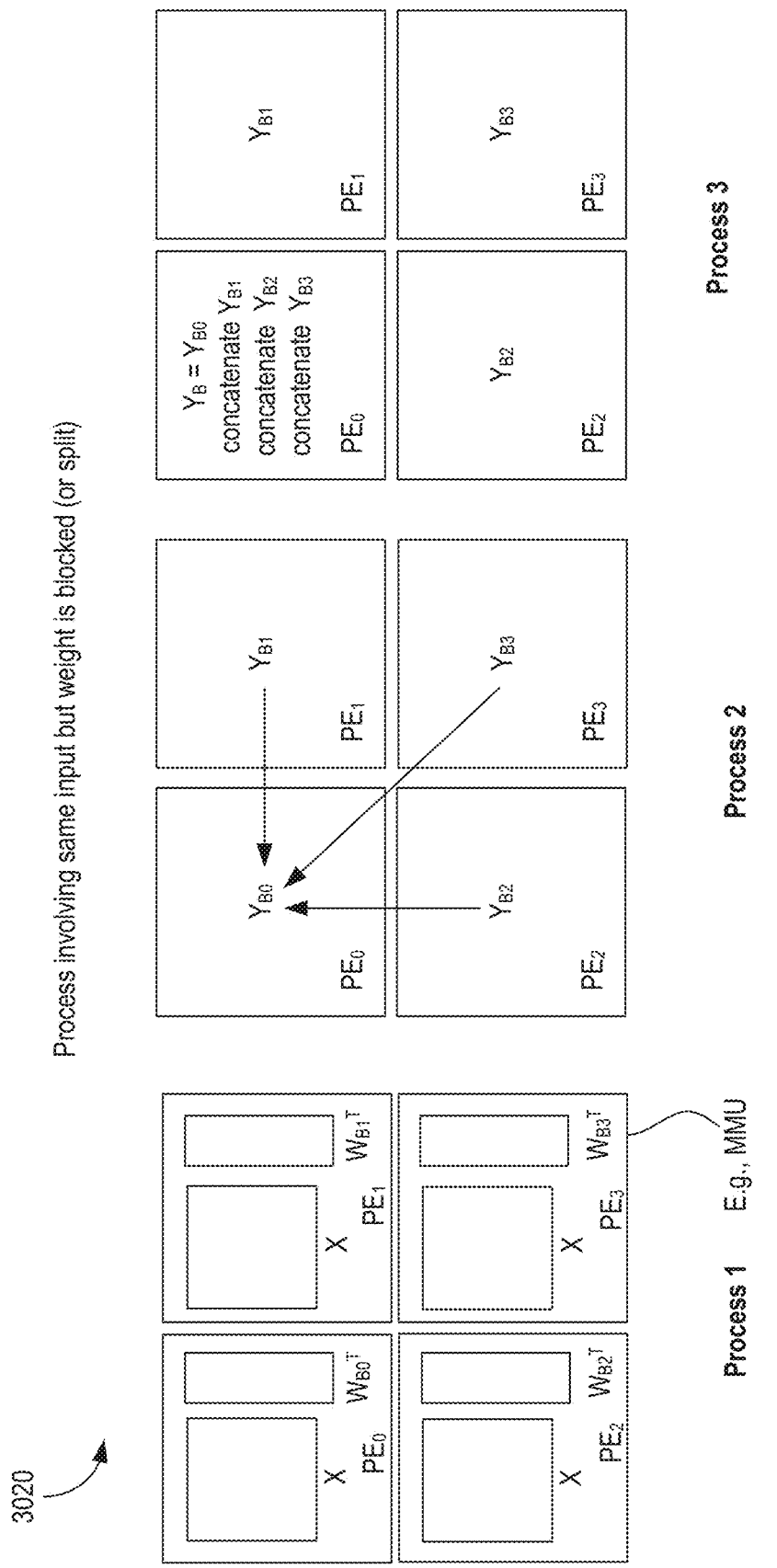

FIG. 3K illustrates a visual process 3020 of the flowchart of FIG. 3J, in accordance with some embodiments. In this example, four PEs or MMUs are illustrated. However, the embodiments are applicable to any number of PEs. After the input matrix X and the blocked transposed weight matrices $W^T$ are assigned to their respective PEs, the process of multiplication is ready. In this example, $PE_0$ receives non-split X and $W_{B0}{}^T$ from Die 1, $PE_1$ receives non-split X and $W_B{}^T$ from Die 1, $PE_2$ receives non-split X and $W_{B2}{}^T$ from Die 1, and $PE_3$ receives $X_{B3}$ and $W_{B3}{}^T$ from Die 1. The multiplication result Y from each PE is gathered by one PE that generates the final multiplication result. In this example, $Y_{B0}$ is the multiplication result of multiplying X and $W_{B0}{}^T$ by $PE_0$, $Y_{B1}$ is the multiplication result of multiplying X and $W_{B1}{}^T$ by $PE_1$, $Y_{B2}$ is the multiplication result of multiplying X and $W_{B2}{}^T$ by $PE_2$, and $Y_{B3}$ is the multiplication result of multiplying X and $W_{B3}$T by $PE_3$. $PE_0$ then concatenates the multiplication results to generate a sub-final multiplication YB result for input X and blocked weight $W_B{}^T$. Any other PE may also generate the sub-final multiplication result. Depending on the number of weights, the sub-final multiplication results are concatenated together. For example, $Y=Y_A$ concatenated with YB.

The architectures of FIGS. 3A-F and FIGS. 3G-K illustrates embodiments to parallelize matrix multiplication of large numbers (inputs and weights) over multiple MMUs. As such, fast multiplication is achieved.

Figure 4:
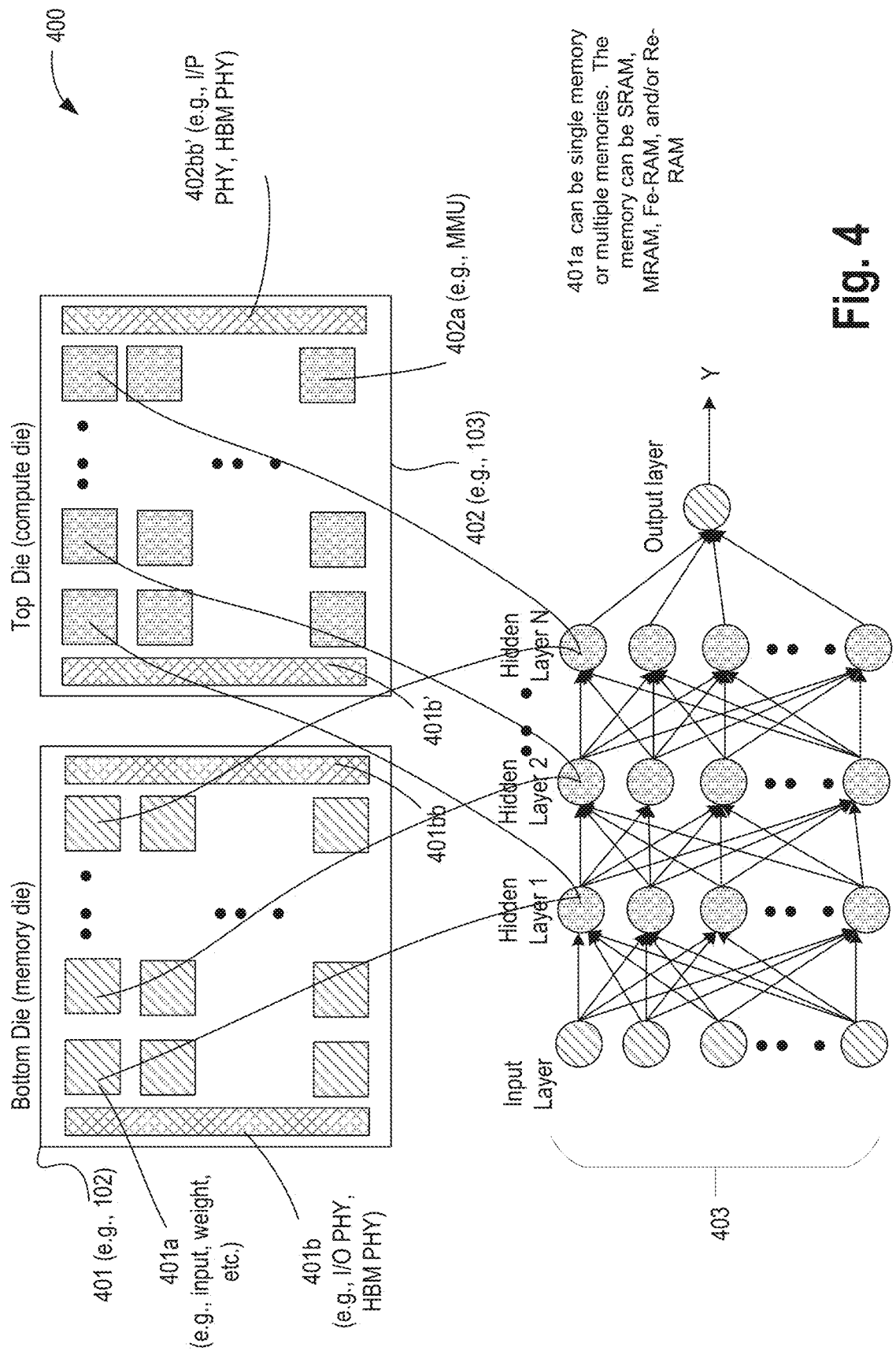
FIG. 4 illustrates a compute architecture that stores input and weights in a memory die below a compute die, where the compute die multiplies the inputs and weights to generate an output, in accordance with some embodiments.

FIG. 4 illustrates compute architecture 400 that stores input and weights in a memory die (Bottom Die) below a compute die (Top Die), where the compute die multiplies the inputs and weights to generate an output, in accordance with some embodiments. The memory die has multiple memory tiles (e.g., 401a). The compute die has multiple compute tiles or PEs (e.g., 402a). Each of the logic units on the compute die may have a corresponding memory unit on the bottom die and communicate with each other. A neural network mapping is shown in the figure, where the blocked computation corresponding to different layers can be mapped to the logic units.

In various embodiments, bottom die 401 comprises memory and top die 402 comprises compute logic. The memory may be partitioned into arrays or segments 401a that substantially align vertically with corresponding PEs 402a. Each of these dies include high bandwidth memory (HBM) interface or physical I/O interface 401b to communicate with large memories such as memories 104, 106, and 107. Here, 403 illustrates the inference operation and/or weight computation for a training model. The inputs X are stored in the memory arrays 401a. In case of inference operation, stationary weights in arrays 401a are also stored in the bottom die 401. Top die 402 includes a plurality of processing elements (PEs) 402a. Each PE 402a may include one or more MMUs. Each MMU includes matrix multiplication logic (MML), logic, temporary buffer, etc.

While the hidden layers (e.g., Hidden layer 1, 2, though N) are shown as paring between compute tiles and memory tiles, computation associated with a hidden layer can be distributed across multiple compute and/or memory tiles in a particular order or out-of-order. In the pipelined architecture of FIG. 4, the output of hidden layer 1 may flow as input to one or more hidden layers (e.g., layer 2, 3, n).

Figure 5:
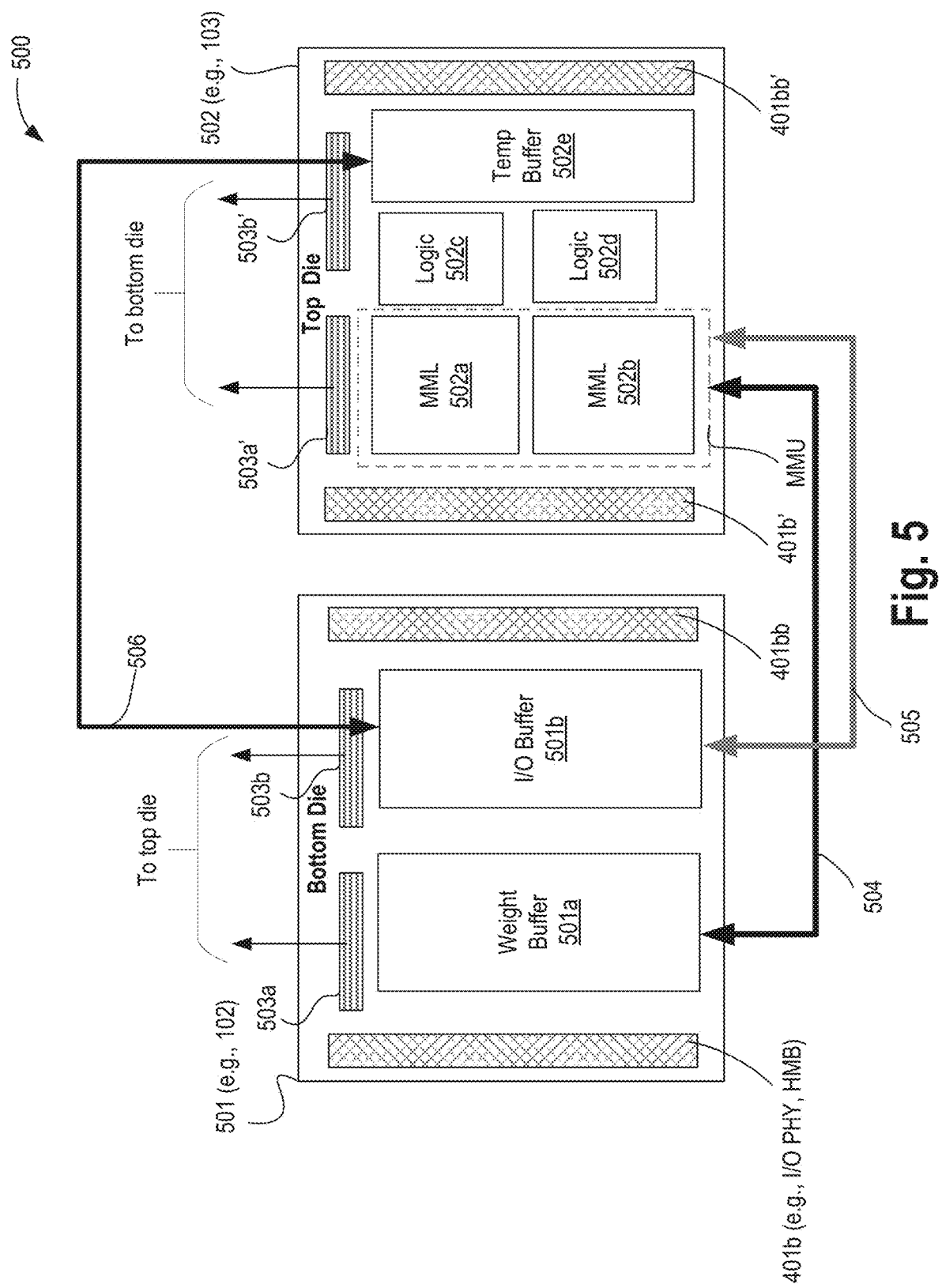
FIG. 5 illustrates a compute architecture showing sideband communication interface between a top die (compute die) and a bottom die (memory die), in accordance with some embodiments.

FIG. 5 illustrates compute architecture 500 showing sideband communication interface between top die (compute die) and bottom die (memory die), in accordance with some embodiments. Bottom die 501 (e.g., 102) includes a segment of memory to store weights 501a and a segment of memory to store input and/or outputs 501b. The memories 501a and/or 501b can be a single continuous memory that is partitioned into partitions 501a and 501b. The memories 501a/b can be SRAM, MRAM, FE-RAM, DRAM, and/or Re RAM. The memories 501a/b can be multiple memories that communicate with top die 502 via dedicated interfaces 503a and 503b. For example, weight buffer 501a communicates with top die 502 via interfaces 503a and 503a' while I/O buffer 501b communicates with top die 502 via interfaces 503b and 503b'. The bottom 501 and top 502 dies also communicate via interfaces 401b, 401bb, 401b' and 401bb'. Interface 401b is substantially aligned vertically with 401b' while interface 401bb is substantially aligned vertically with 401bb'. These interfaces can be HMB interface or physical I/O interface 401b to communicate between the two dies (501 and 502) and/or with large memories such as memories 104, 106, and 107.

Top die 502 (e.g., 103) comprises I/O interfaces 503a', 503b', 401b' and 401bb' that substantially align with I/O interfaces 503a, 503b, 401b, and 401bb, respectively, of the bottom die 501. These I/O interfaces allow for fast communication between the dies because they are placed substantially across from each other. In some embodiments, the weight buffer or memory segment 501a of the bottom die is coupled to the MML 502a/b of the top die via I/O interfaces 503a'/503a as illustrated by bi-directional communication arrow 504. In some embodiments, the I/O buffer or memory segment 501b of the bottom die is coupled to the MML 502a/b of the top die via I/O interfaces 503a'/503a as illustrated by bi-directional communication arrow 505. In some embodiments, the temporary buffer 502e of the top die is coupled to the I/O buffer 501b via I/O interfaces 503b'/503b as illustrated by bi-directional communication arrow 506.

Here, the communication between bottom die 501 and top die 502 is shown to perform matrix multiplication operations, where the inputs/outputs and weights are communicated between bottom 501 and top 502 die. For training process, weights are updated as the computation is performed using the two way communication to the weight buffer. For the inference process, weights are remain unchanged and can be made stationary in the weight buffer or on the top die.

Figure 6:
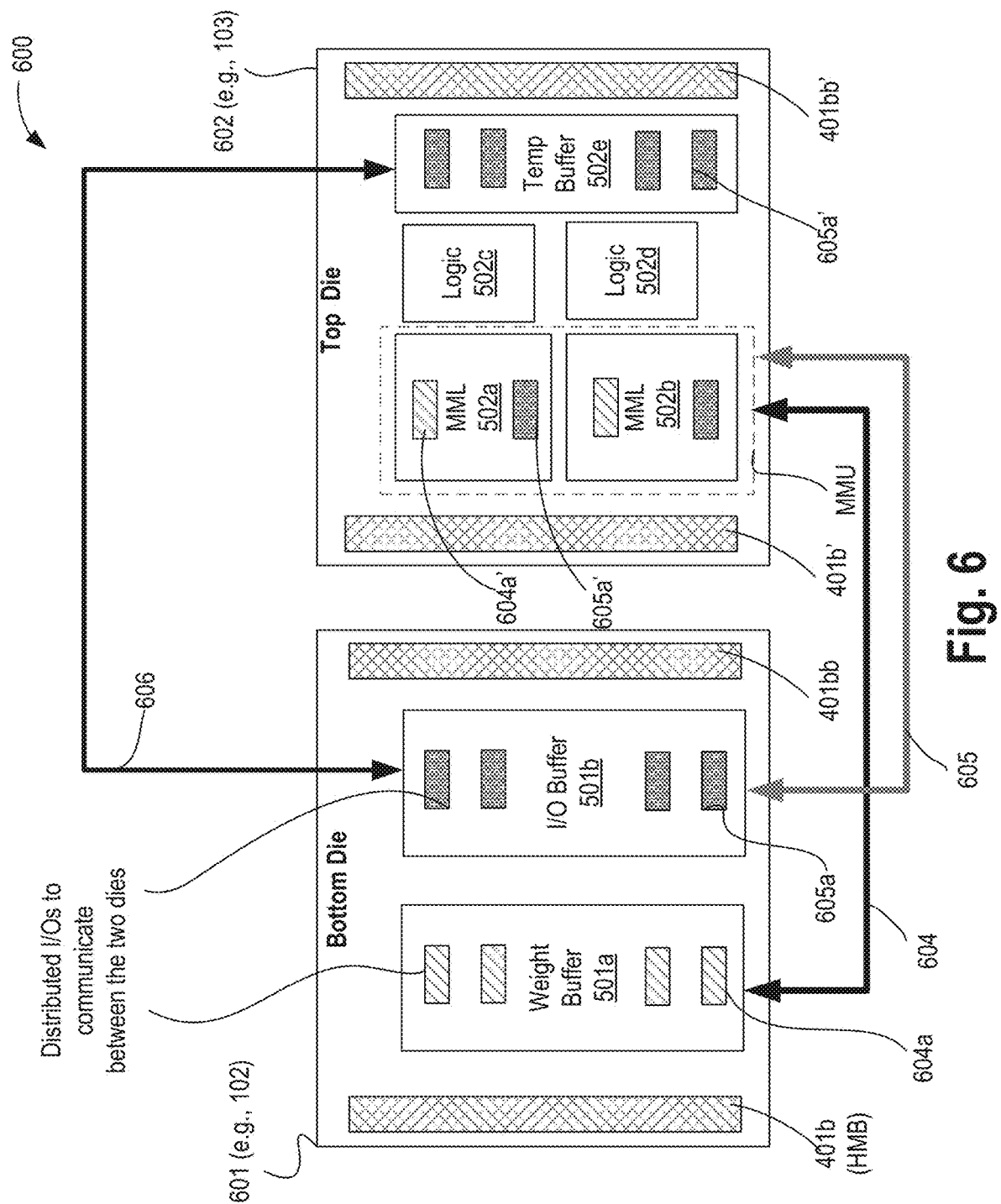
FIG. 6 illustrates a compute architecture showing die-to-die interconnects between matrix multiply logic of top die (compute die) and weight and input memories of the bottom die (memory die), in accordance with some embodiments.

FIG. 6 illustrates compute architecture 600 showing die-to-die interconnects (604 and 605) between matrix multiply logic (MML) of top die (e.g., compute die 602) and weight and input memories of the bottom die (e.g., memory die 601), in accordance with some embodiments. Compared to FIG. 5, I/Os 503a'/503a and 503b'/503b are replaced with distributed I/Os 604a/604a' and 605b/605b'. I/Os 604a are distributed in the memory region 501a which is used for storing weights. I/Os 605a are distributed in the memory region 501b which is used for storing data. Each MML (e.g., 502a/b) has both I/Os 604a'/605a' to communicate with memory regions 501a/b, respectively. In some embodiments, temporary buffer 502e includes distributed I/Os 605a' to communicate with memory 501b. In some embodiments, I/Os 605a' are substantially aligned vertically with I/Os 605a to reduce latency.

In some embodiments, the weight buffer or memory segment 501a of the bottom die is coupled to the MML 502a/b of the top die via distributed I/O interfaces 604a as illustrated by bi-directional communication arrow 604. In some embodiments, the I/O buffer or memory segment 501b of the bottom die is coupled to the MML 502a/b of the top die via I/O interfaces 605a'/605 a as illustrated by bi-directional communication arrow 605. In some embodiments, the temporary buffer 502e of top die 602 is coupled to the I/O buffer 501b via I/O interfaces 605a'/605a as illustrated by bi-directional communication arrow 606.

Figure 7A:
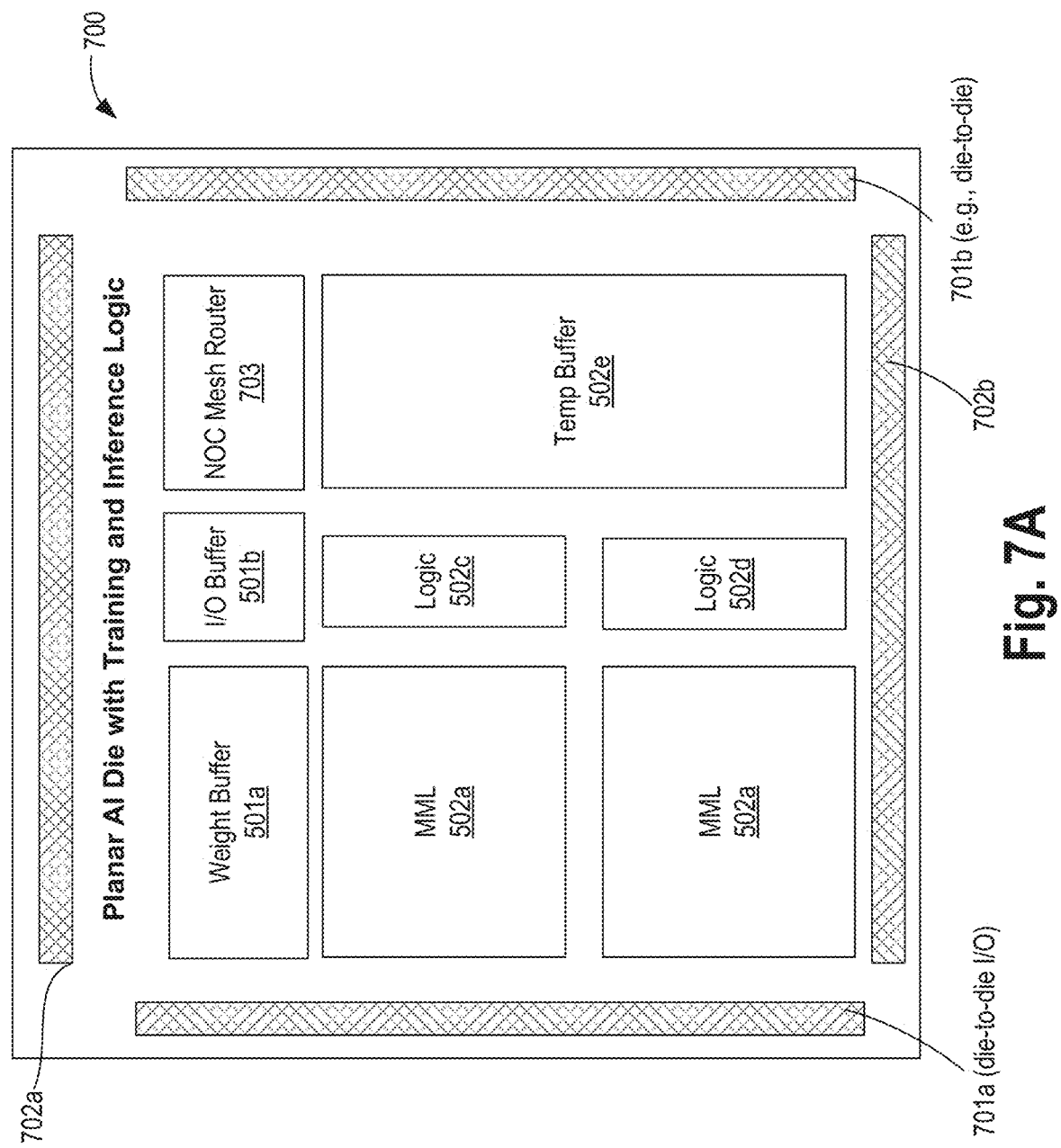
FIG. 7A illustrates an architecture of a planar artificial intelligence (AI) die with training and inference logic, in accordance with some embodiments.

FIG. 7A illustrates architecture 700 of a planar artificial intelligence (AI) die with training and inference logic, in accordance with some embodiments. Here, planar refers to having components of die1 and die2 in the same die. In some embodiments, FE-RAM is used as integrated memory to perform large dimension matrix-multiplication operations in a high performance manner Architecture 700 includes one or more matrix multiplier logics 501a, weight buffer 501a, I/O buffer 501b, logic 503c/d, temporary buffer 502e, and network-on-chip (NoC) mesh router 703. The NoC mesh router 703 allows the planar die to communicate with other neighboring dies in a SoC (system-on-chip) comprising multiple such planar dies.

While architecture 700 illustrates a single die with multiple I/O interfaces 701a/b and 702a/b, the die can have one I/O interface. For example, the die is a processing element (PE) which has one or two I/O interfaces to communicate with neighboring PEs. In that case, the SoC with multiple PEs will have additional I/O interfaces to communicate with HBM and/or the memory die(s) below the PE SoC. Each PE can have one or more processing cores.

Figure 7B:
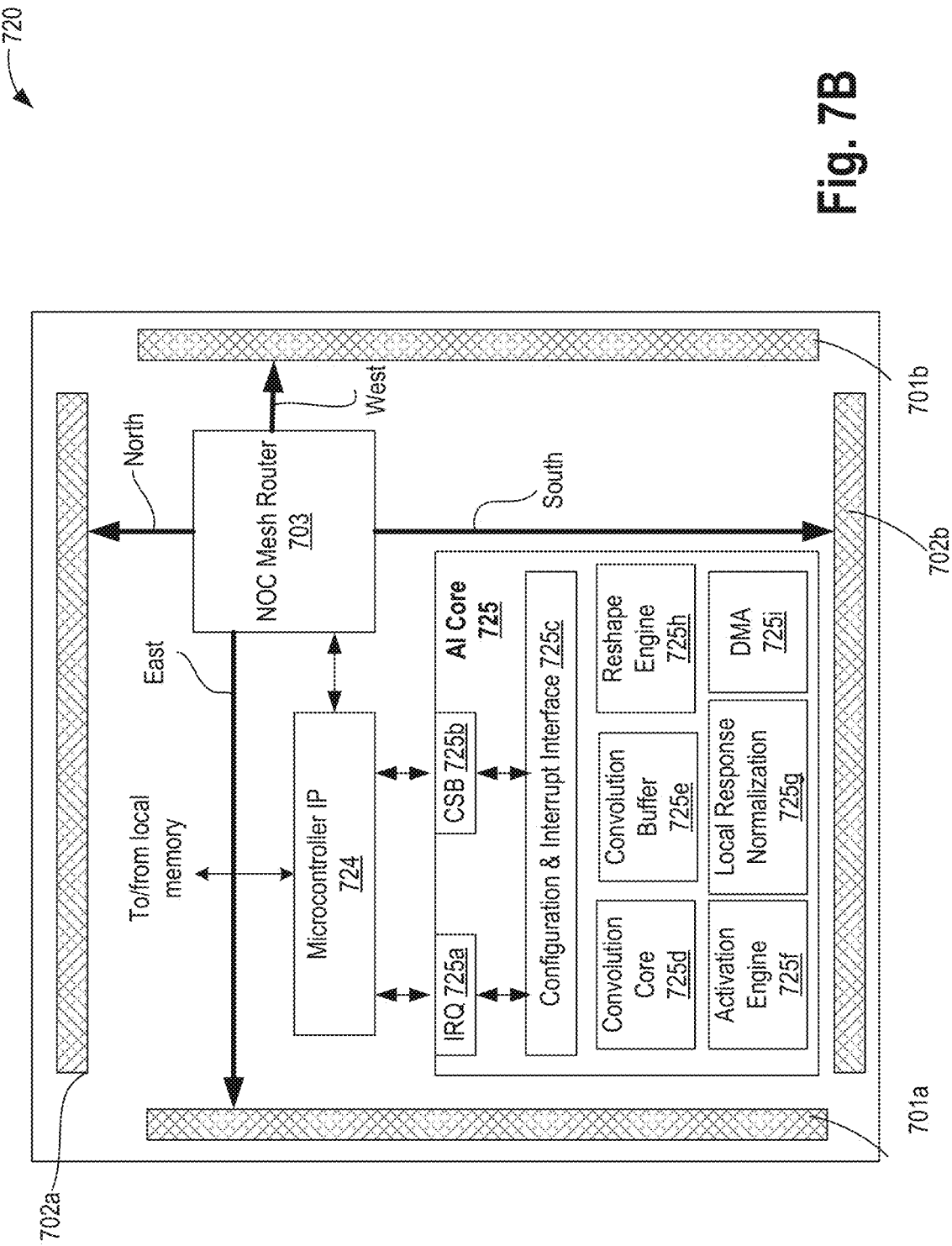
FIG. 7B illustrates an architecture of a planar AI die with training and inference logic, in accordance with some embodiments.

FIG. 7B illustrates an architecture of planar AI die 720 with training and inference logic, in accordance with some embodiments. Planar AI die 720 is an example of a single PE. In this example, the PE includes I/O interfaces 701a/b and 702a/b, NoC Mesh Router 703, microcontroller 724, and Core 725. While architecture 720 illustrates a single die with multiple I/O interfaces 701a/b and 702a/b, the die can have one I/O interface. For example, the die is a processing element (PE) which has one or two I/O interfaces to communicate with neighboring PEs. In that case, the SoC (system-on-chip) with multiple PEs will have additional I/O interfaces to communicate with HBM and/or the memory die(s) below the PE SoC.

In some embodiments, NoC mesh router 703 allows the PE to communicate with other PEs and/or with memory dies below them. Router 703 includes cross-bars or multiplexers to route signals along North, South, East, and/or West directions. Router 702 is also referred to as a network interconnect controller (NIC). The routing may further use I/O interfaces 701a/b and/or 702a/b. As discussed herein, the PE may not have all fourth I/O interfaces. In that case, the routing from router 703 may directly communicate with router 703 of another PE of the compute die.

In various embodiments, data (e.g., weights, inputs, and outputs) are routed by router 703 via instructions from microcontroller 724. Microcontroller 724 may be any suitable logic that can be programmed or manage computations by Core 725 and to provide the data for router 703 to route the appropriate PE. In some embodiments, microcontroller is a proprietary controller. In other embodiments, intellectual property (IP) blocks from a third party may be used to implement microcontroller 724. In some embodiments, microcontroller 724 includes components of a memory controller and is also used to control read/write operations by compute tile 720. For example, microcontroller 724 communicates with a memory tile via NIC 703 to read from the memory tile or write from a memory tile. In some embodiments, microcontroller 724 directly communicates with a local memory of PE 720 and/or compute die without using NIC 703. In this example, the compute die has one or more PE (or compute tiles) and one or more local memory arrays. In some embodiments, microcontroller 724 directly communicates with a memory of a memory tile (on a memory die) without using NIC 703.

In various embodiments, each PE or compute tile includes core 725 such as an AI core. While one core per PE is illustrated, each PE can have multiple cores. Core 725 includes I/O interfaces 725/a/b to communicate with microcontroller 724. For example, I/O interface 725a sends and/or receives interrupt request (IRQ) to stop core 725 momentarily while core 725 decides which task it should perform next. Here, configuration space bus (CSB) 725b passes configuration setting for each AI Core. It allows access to configuration registers internal to compute core 725.

Core 725 further comprises configuration and interrupt interface 725c, convolution core 725d, convolution buffer 725e, activation engine 725f, local response normalization 725g, reshape engine 725h, and direct memory access (DMA) 725i.

Configuration and interrupt interface 725c the logic that implements the interface logic for CSB and IRQ.

The convolution core 725d perform a convolution mathematical function. Convolution core 725d applies a kernel matrix of weights to extract certain features from an input. The kernel "slides" over the input performing an element-wise multiplication with the part of the input the kernel is currently on, and then summing up the results into a single output.

Convolution buffer 725e works in conjunction with convolution core 725d in that it stores partial and/or full multiplication outputs from the convolution operation from convolution core 725d. Convolution buffer 725e may include any suitable memory such as SRAM, FE-RAM, DRAM, MRAM, etc. These partial and/or full multiplication outputs are then added to produce an output which is stored in the convolution buffer 725e or one of the memory dies for further processing.

Activation engine 725f can perform element-wise operation including non-linear activation functions such as relu, tanh, sigmoid, batch normalization, etc.

Local response normalization 725g performs normalization function of a multidimensional matrix along a particular dimension. In one example, local response normalization 725g operates on channel dimensions, as opposed to the spatial dimensions. In another example, a 4-D input tensor is treated as a 3-D array of 1-D vectors (along a last dimension), and each vector is normalized independently by local response normalization 725g. Within a given vector, each component is divided by the weighted, squared sum of inputs within depth_radius.

Reshape engine 725h performs data format transformations (e.g., splitting or slicing, merging, contraction, reshape-transpose).

In some embodiments, NIC 703 of a compute tile (e.g., PE 720) communicates with one or ore memory tiles (in a memory die) via another NIC of another compute tile. In one example, the NICs communicate with one another via a scalable non-cache coherent interconnect which may be coupled to one or more of interfaces 701a/b and/or 702a/b.

DMA 725i is a direct memory access interface. It provides access to the memory controller which can reside in the memory die or the PE of the compute die.

Figure 8:
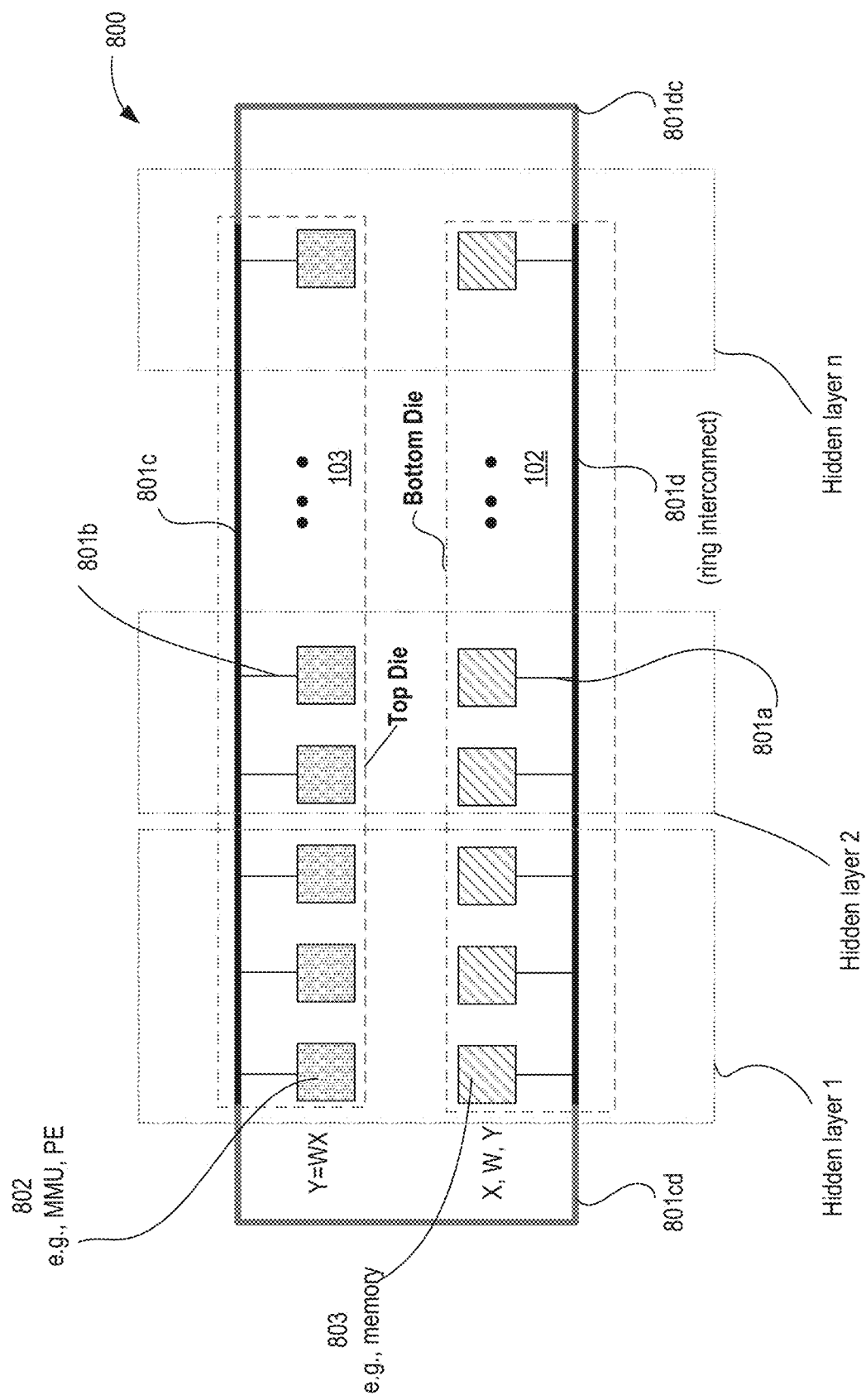
FIG. 8 illustrates a ring-interconnect architecture that couples matrix multiplier units (MMUs) with memory arrays, wherein the ring-interconnect is distributed between the compute die having the MMUs and the memory die having the memory arrays, in accordance with some embodiments.

FIG. 8 illustrates a ring-interconnect architecture 800 that couples matrix multiplier units (MMUs) to memory arrays, wherein the ring-interconnect is distributed between the compute die 103 having the MMUs and the memory die 102 having the memory arrays or memory tiles, in accordance with some embodiments. The memory tiles and MMUs are arranged such that data and weights for each corresponding MMU 802 are available via a corresponding memory tile 803 across from it. The MMUs and memories can be paired in accordance with hidden layers 1 through n as shown.

The ring interconnect 801 carries the weights W, inputs X, and computed outputs Y from memory 803 via local interconnect 801a, which is local to die 102. The ring interconnect 801 carries the outputs Y1, Y2, Y3, and so on from each MMU 802 via local interconnect 801b, which is local to die 103. The outputs are then put together to form an output matrix Y either by adding the individual outputs or concatenating them as described with reference to FIGS. 3A-K. The final output Y is also stored in second die 102 or to an external memory.

The ring interconnect 801 passes through first and second dies as indicated by ring segments 801c and 801d and also along the periphery of the dies as indicated by ring segments 801cd and 801dc. The ring interconnect allows for fast communication between MMUs 802 and memories 803. In some embodiments, each MMU 802 is a die, which is packaged together in a single package forming the top die 103. In some embodiments, each memory 803 is a die, which is packaged together in a single package forming the bottom die 102.

In various embodiments, the memory tiles (e.g., 803) of memory on the bottom die have global address space, and any compute tile (e.g., 802) can access any address via the ring or mesh interconnect. In some embodiments, each compute tile has its own local address space, and also has access to other memory tiles (of the bottom die) and memory of other compute tiles. In this case, the compute tiles can communicate with the memories of other compute tiles via message passing protocol. In some embodiments, the ring-interconnect can be coherent fabric. In some embodiments, ring-interconnect 901 can be non-coherent fabric.

Figure 9:
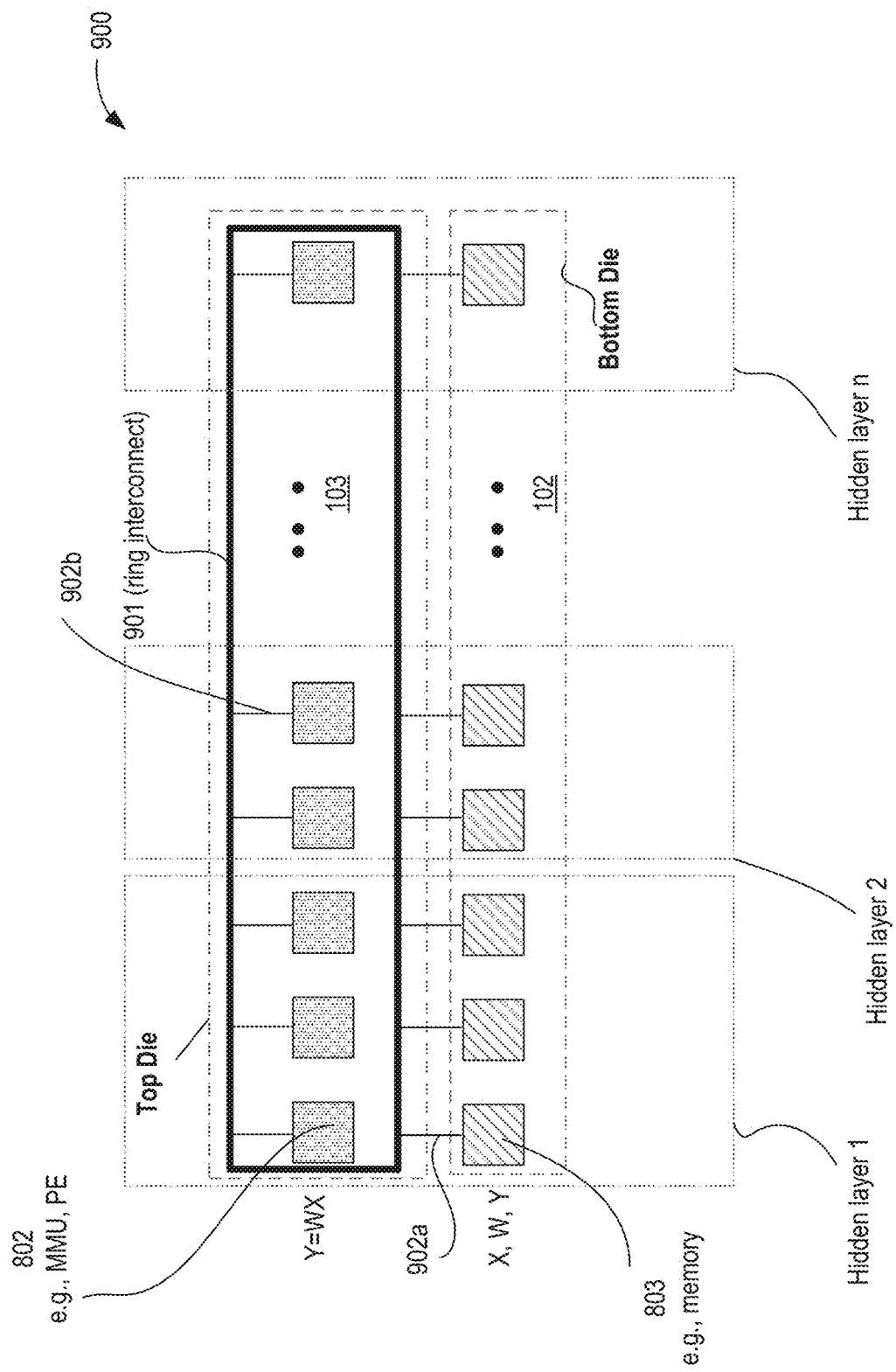
FIG. 9 illustrates a ring-interconnect architecture that couples matrix multiplier units (MMUs) with memory arrays, wherein the ring-interconnect is in the compute die having the MMUs, in accordance with some embodiments.

FIG. 9 illustrates ring-interconnect architecture 900 that couples matrix multiplier units (MMUs) with memory arrays, wherein the ring-interconnect is in the compute die having the MMUs, in accordance with some embodiments. Compared to ring-interconnect architecture 800, here the ring is not in the bottom die. The memories 802 of bottom die communicates with ring 901 via interconnects 902a. The MMUs 802 of top die communicate with ring 901 via local interconnect 902b which are local to the compute die. In some embodiments, ring-interconnect 1001 can be non-coherent fabric.

Figure 10:
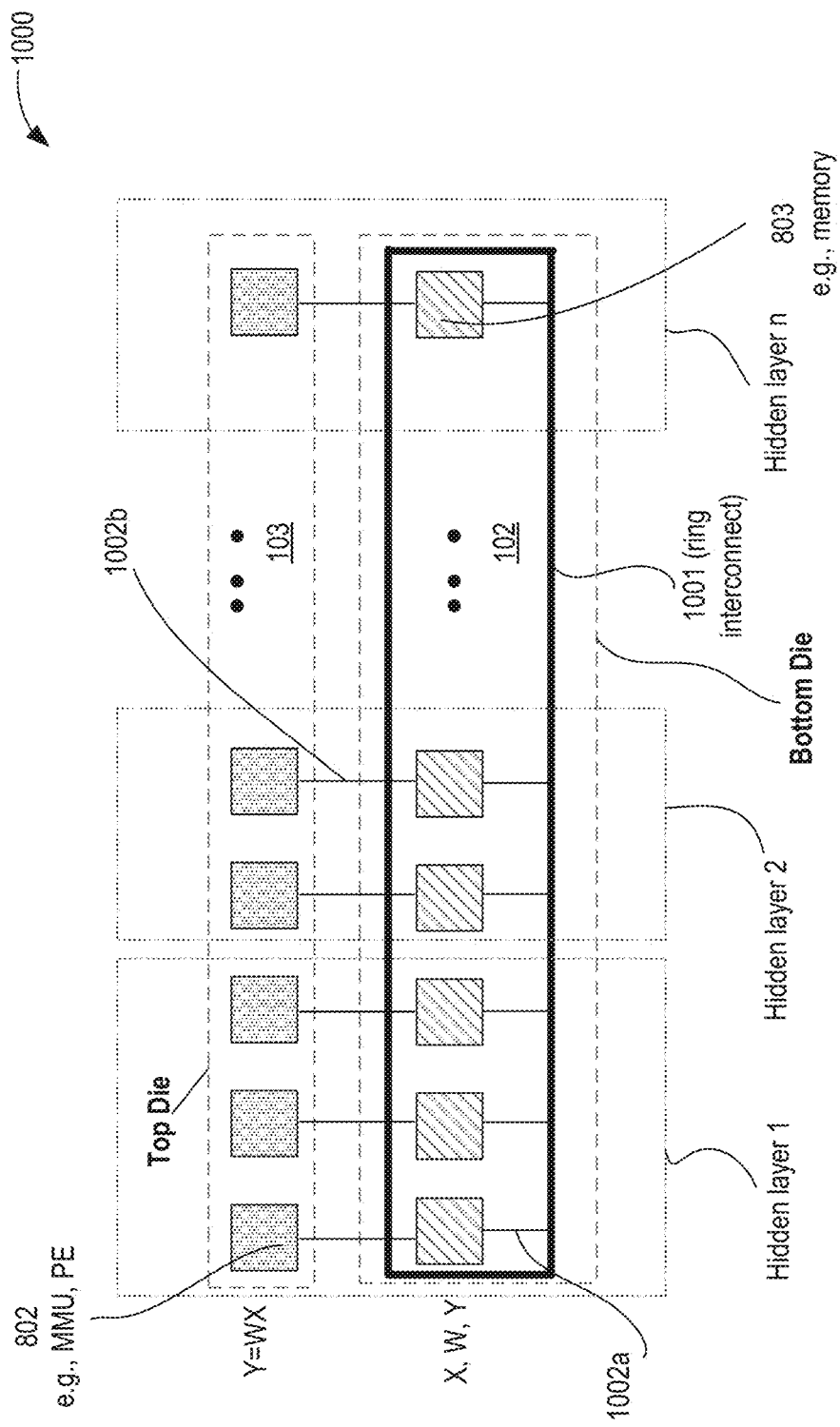
FIG. 10 illustrates a ring-interconnect architecture that couples matrix multiplier units (MMUs) with memory arrays, wherein the ring-interconnect is in the memory die having the memory arrays, in accordance with some embodiments.

FIG. 10 illustrates ring-interconnect architecture 1000 that couples matrix multiplier units (MMUs) with memory arrays, wherein the ring-interconnect is in the memory die having the memory arrays, in accordance with some embodiments. Compared to ring-interconnect architecture 900, here the ring is not in the compute die. The memories 802 of bottom die communicates with ring 1001 via local interconnects 1002a, which are local to the memory die. The MMUs 802 of top die communicate with ring 1001 via interconnect 1002b. In some embodiments, ring-interconnect 1001 can be non-coherent fabric.

While the hidden layers (e.g., Hidden layer 1, 2, though n) in FIGS. 8-10 are shown as paring between compute tiles and memory tiles, computation associated with a hidden layer can be distributed across multiple compute and/or memory tiles in a particular order or out-of-order.

Figure 11:
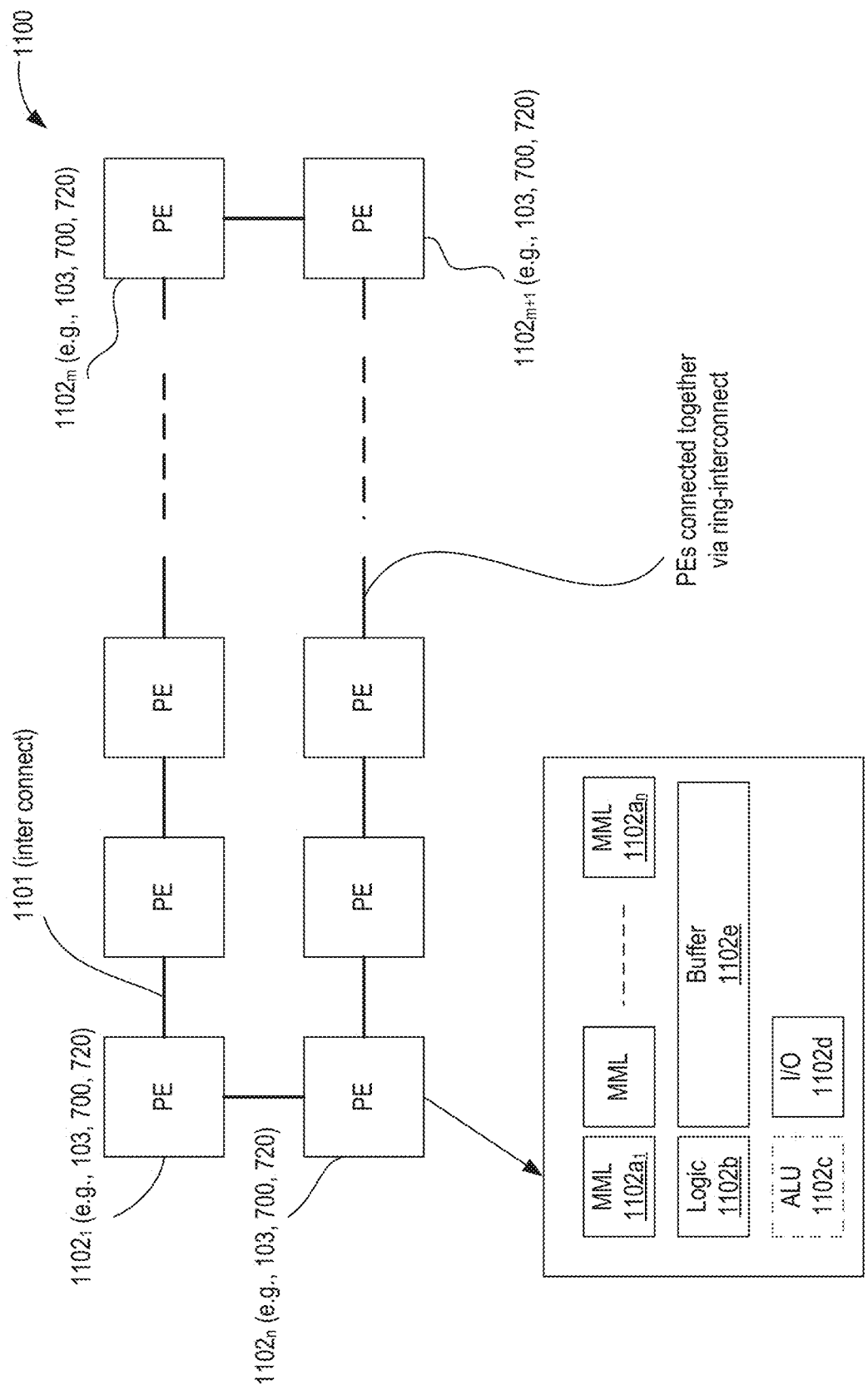
FIG. 11 illustrates a compute die architecture comprising a plurality of processing elements (PEs) coupled in a ring formation, in accordance with some embodiments.

FIG. 11 illustrates compute die architecture 1100 comprising a plurality of processing elements (PEs) $1102_1$ through $1102_{m+1}$ coupled in a ring formation, in accordance with some embodiments. Each PE can be a processor die or an instantiation of a logic. Each PE can comprise one or more MMLs $1102a_1$ through $1102a_n$, logic 1102b, buffer 1102e, arithmetic logic unit 1102c, and I/O 1102d. The PEs are coupled via a ring interconnect 1101. In some embodiments, buffer 1102e comprises Fe-RAM for fast speed and low power operations. In some embodiments, ring-interconnect 1101 can be non-coherent fabric.

Figure 12:
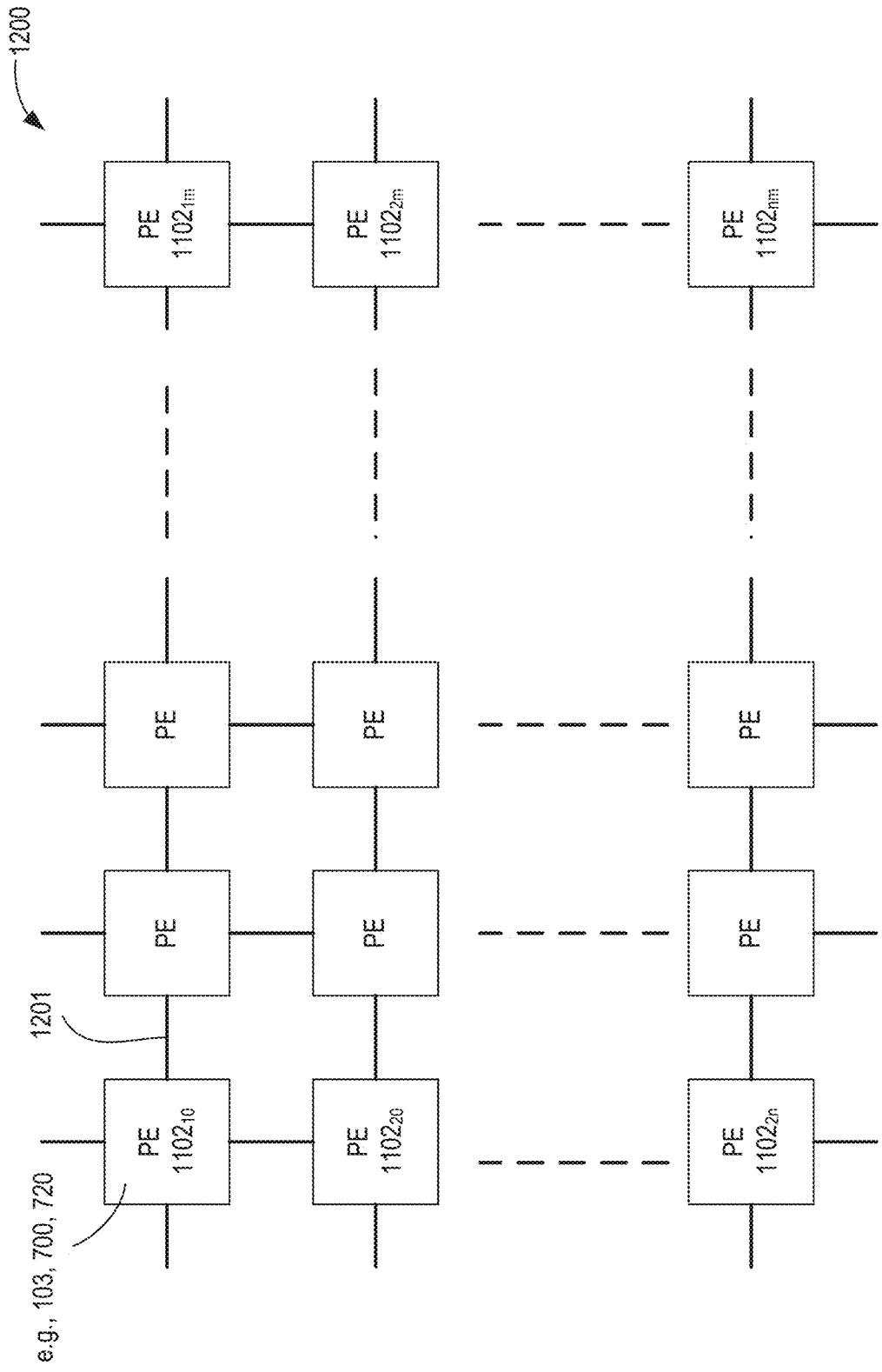
FIG. 12 illustrates a compute die architecture comprising a plurality of PEs coupled in a mesh formation, in accordance with some embodiments

FIG. 12 illustrates compute die architecture 1200 comprising a plurality of PEs $1102_1$ through $1102_{m+1}$ coupled in a mesh formation, in accordance with some embodiments. The mesh is indicated by interconnect 1201.

Figure 13:
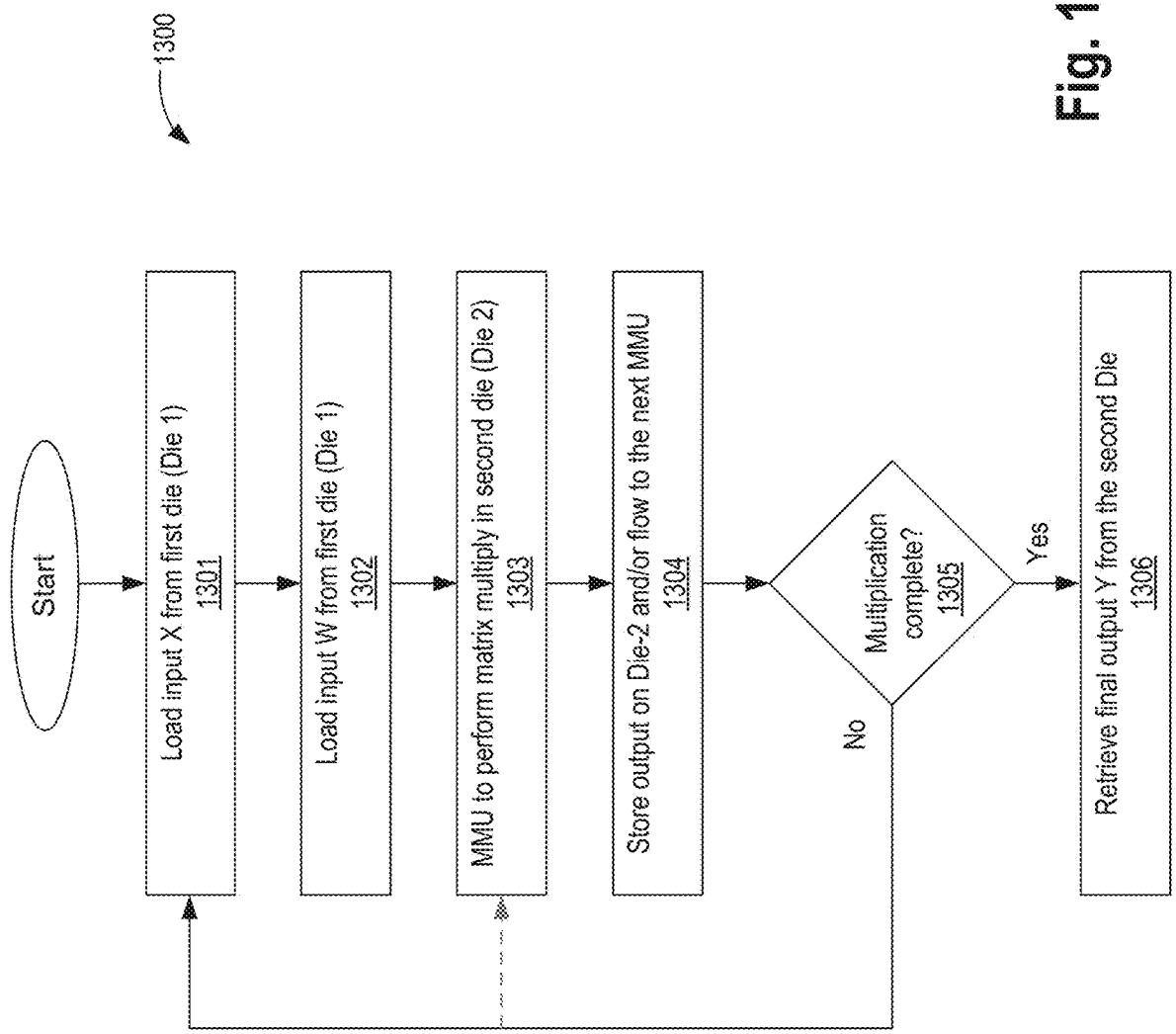
FIG. 13 illustrates a flowchart of a method of matrix multiplication, in accordance with some embodiments.

FIG. 13 illustrates flowchart 1300 of a method of matrix multiplication, in accordance with some embodiments. While the various operations are showing in a particular order, the order can be changed. For example, some operations can be performed before others while some operations can be performed in parallel or simultaneously. In one case, all inputs X and weights W may need to be re-loaded for the next matrix multiplication operation. In some cases, inputs X and weights W are loaded once and re-used. Matrix multiplication is performed with segregated compute and memory dies, where matrix-multiplication is performed in the compute die with the help of data from the memory die.

At block 1301, inputs X are loaded from the memories of first die to one or more MMUs of the second die. At block 1302, weights W are loaded from memories of the first die to one or more MMUs of the second die. At block 1303, the one or more MMUs perform matric multiplication in the second die. At block 1304, the output of each MMU is stored in the one or more memories of the first die. The output of each MMU is also passed along to the adjacent MMU in the pipeline of MMUs. The final output is either a sum of each output of each MMU or a concatenation of outputs of each MMU as described with reference to FIGS. 3A-K. At block 1305, a determination is made by a logic of the PE whether multiplication is complete. If multiplication process is complete the process proceeds to block 1306. Otherwise, the process proceeds to block 1301. At block 1306, the final output Y is retrieved and classification of the input is realized.

Figure 14:
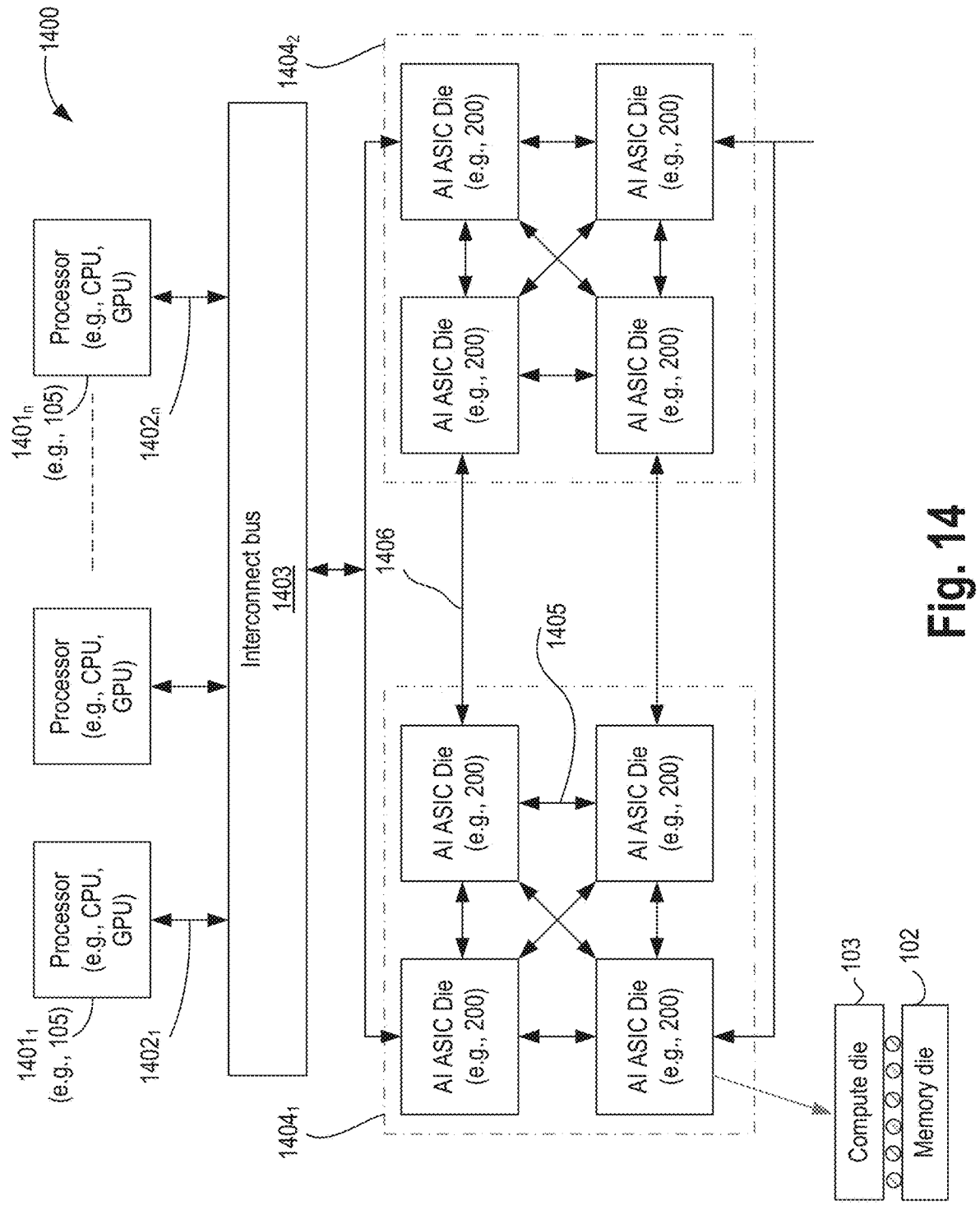
FIG. 14 illustrates an AI architecture having a plurality of AI ASIC dies (e.g., computational blocks or inference logic chips) coupled in a hyper-cube format, wherein each hyper-cube comprises a set of AI ASICs, wherein each AI ASIC comprises a compute die stacked over a memory die, in accordance with some embodiments.

FIG. 14 illustrates AI architecture 1400 having a plurality of AI ASIC dies 200 (e.g., computational blocks or inference logic chips) coupled in a hyper-cube format, wherein each hyper-cube comprises a set of AI ASICs, wherein each AI ASIC comprises a compute die 103 stacked over a memory die 102, in accordance with some embodiments. Architecture 1400 comprises a system having processors $1401_1$ to $1401_n$, where 'n' is an integer, interconnect $1402_i$ through $1402_n$ associated with processors $1401_1$ to $1401_n$, respectively, interconnect bus 1403 shared by processors $1401_1$ to $1401_n$, and plurality of AI ASIC dies 1401 (e.g., $1401_1$, $1404_2$). In some embodiments, plurality of AI ASIC dies 1401 are coupled in a hyper-cube format that allows for each set of ASIC dies to communicate with one another through multiple means via interconnect 1405 (e.g., die-die, chip-to-chip, or board-level interconnect). Each set of ASIC dies communicates with another set via interconnect 1406. Architecture 1400 illustrates two sets of ASICs $1401_1$, $1404_2$. However, any number of sets of ASICs can be coupled together to increase capability of classifying large amount of data.

Figure 15:
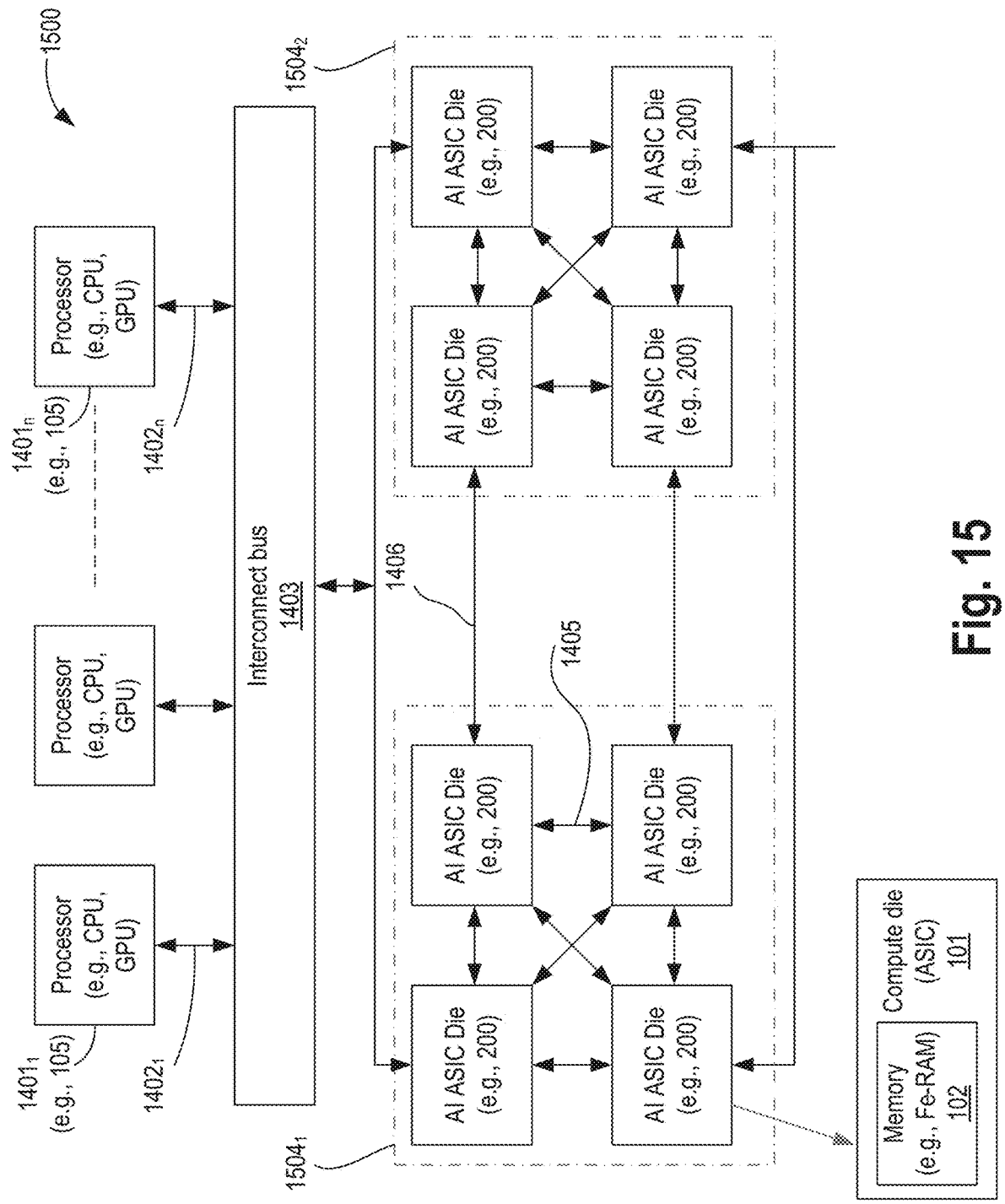
FIG. 15 illustrates an AI architecture having a plurality of AI ASIC dies (e.g., computational blocks or inference logic chips) coupled in a hyper-cube format, wherein each hyper-cube comprises a set of AI ASICs, wherein each AI ASIC comprises a compute die with integrated memory (e.g., ferroelectric memory), in accordance with some embodiments.

FIG. 15 illustrates AI architecture 1500 having a plurality of AI ASIC dies (e.g., computational blocks or inference logic chips) coupled in a hyper-cube format, wherein each hyper-cube comprises a set of AI ASICs $1504_1$, $1504_2$, wherein each AI ASIC comprises a compute die with integrated memory (e.g., ferroelectric memory), in accordance with some embodiments. Each compute die may include one or more compute tiles (or PEs). In various embodiments, each AI ASIC comprises a stacked architecture of compute die 101 and memory die 102 as described herein. The memory die 101 may include multiple memory tiles. In various embodiments, the memory tiles include ferroelectric RAM and/or other memory types described herein. Architecture 1500 is similar to architecture 1400 in terms of connectivity. Here, compute die is not above the memory die. Instead, the compute die include the memory that stores input X and weights W. Architecture 1500 illustrates two sets of ASICs 1504$_1$, 1504$_2$. However, any number of sets of ASICs can be coupled together to increase capability of classifying large amount of data.

Figure 16:
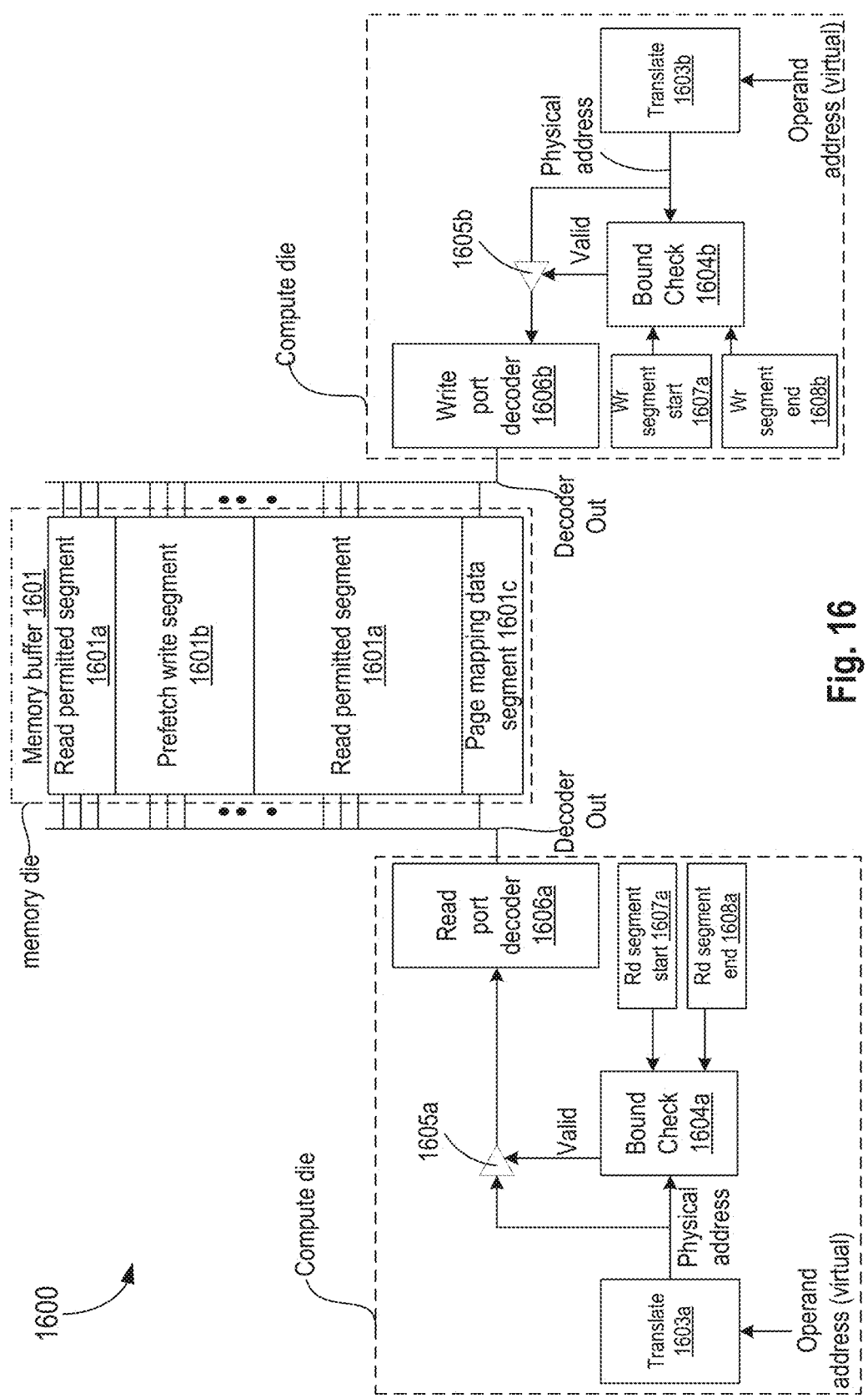
FIG. 16 illustrates a memory architecture with double buffered memory (e.g., SRAM, Fe-RAM, DRAM), in accordance with some embodiments.

FIG. 16 illustrates memory architecture 1600 with double buffered memory (e.g., SRAM, Fe-RAM, DRAM), in accordance with some embodiments. Architecture 1600 illustrates memory buffer 1601 and logic to control read (Rd) and write (Wr) operations. In some embodiments, two separate buffers are implemented for memory buffer 1601. One of the two buffers allows for reads while the other of the two buffers allow for write of prefetched data. The buffer segment that permits read operation is 1601*a* while the buffer segment for write prefetch is 1601*b*. Note, the buffer that is being used for reading may later be used for writing. Page mapping data segment 1601*c* includes a translation mapping table.

The double buffered memory architecture hides latency for prefetching data when there is significant reuse (e.g., greater than 50%) of data for computation. As such, double buffered memory architecture gives the illusion that all data needed for immediate computation is present and available in the local memory. In this case, the overhead associated with handshaking related to fetching data is hidden. By having two separate memory banks, latency is improved compared to regular memory architectures.

The memory controller comprises translation buffers 1603*a/b* that convert an operand address into a physical addresses. While memory buffer 1601 is a single unit, it logically behaves as two memory buffers, hence double buffer memory. The physical address space is segmented into read and write buffers. The sizes of each individual read/write buffer is configurable. For example, by writing new values for registers 1607*a/b* and 1608*a/b*, the read/write buffer can be configured to a new size.

In some embodiments, to ensure read and write buffers are separate, bound check logic 1604*a/b* performs bound check for each read and write access. As such, the controller does not allow writing in the read buffer and vice versa. If the read and/or write physical address are legal and within bounds, then a valid signal is asserted which buffers via buffers 1605*a/b* the physical address to the read port decoder 1606*a/b*. The decoder outputs then read data from the proper read permitted segment, or write data to the prefetch write segment. The bound check logic compares the start and end of the read/write segments 1607*a/b* and 1608*a/b* with the translated physical address to verify whether the physical address is within the start and end limits. The controller can move the read or write segments by writing to bound registers.

In some embodiments, translate logic 1602*a/b*, bound check logic 1604*a/b*, controllable buffer 1605*a/b*, read and write port decoders 1606*a/b*, read (Rd) segment start register 1607*a*, read segment end register 1608*a*, write (Wr) segment start register 1607*b*, and write segment end register 1608*b* are part of a memory controller. In some embodiments, the memory controller components are in the compute die as shown. In some embodiments, the memory controller components are in the memory die and/or in a memory tile of the memory die.

Figure 17:
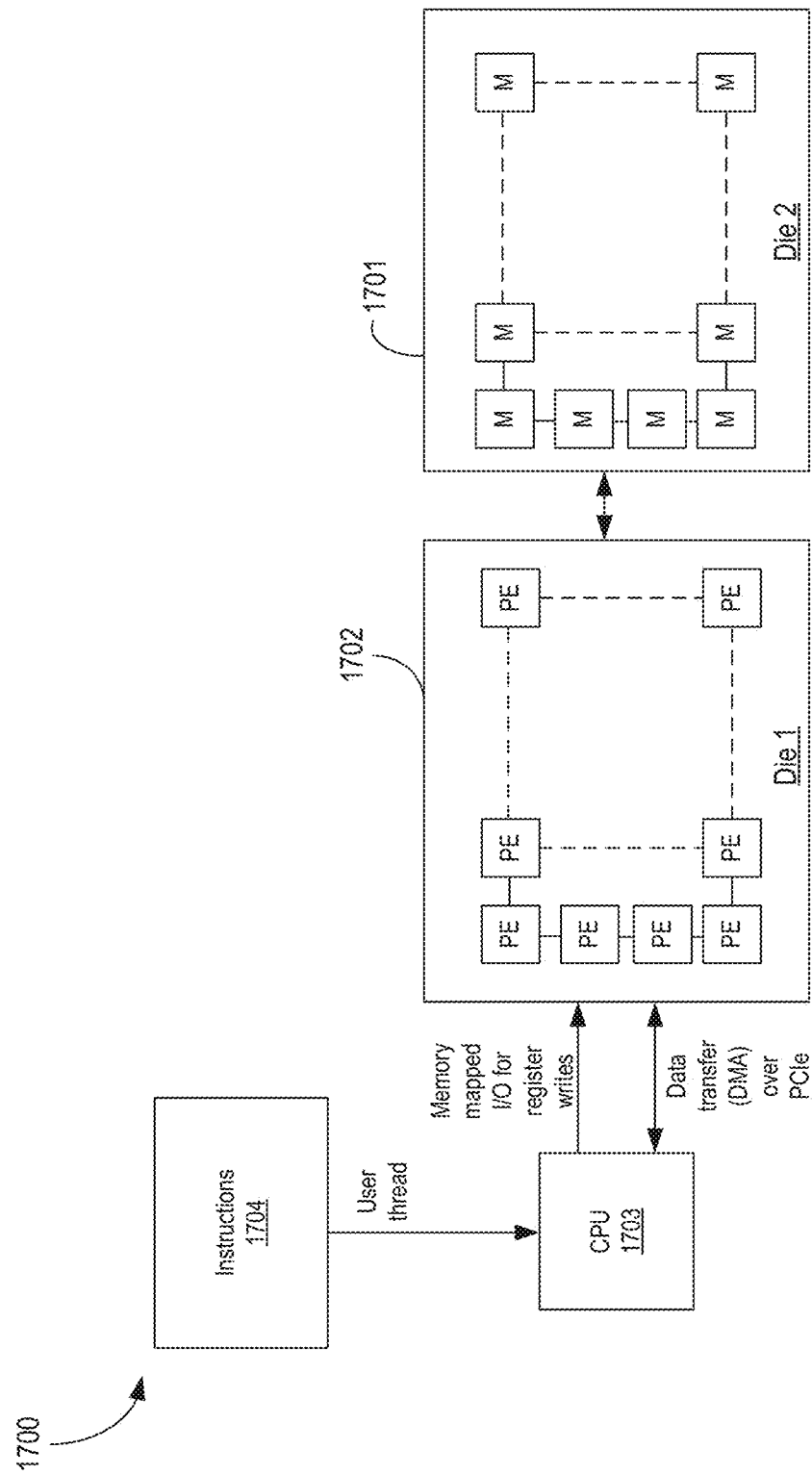
FIG. 17 illustrates a computing system with a compute die (having a plurality of PEs) coupled to a memory die (having a plurality of memory banks) and a general purpose processor (CPU), in accordance with some embodiments.

FIG. 17 illustrates a computing system 1700 with a compute die (having a plurality of PEs) coupled to a memory die (having a plurality of memory banks) and a general purpose processor (CPU), in accordance with some embodiments. System 1700 comprises memory die 1701 (die 2), compute die 1702 (die 1), processor 1703, and operating system 1704. This is a simplified view of computing system 1700 and all components are not shown for brevity purposes. Memory die 1701 may include a plurality of memory arrays or banks (M). Compute die 1702 may include a plurality of PEs. Each PE may include one or more cores as described with reference to various embodiments. Each memory bank can communicate with a PE directly above it. In some embodiments, depending on the interconnect fabric, each memory bank can communicate with multiple PEs in the top die. The stack of dies 1701 and 1702 are coupled to a processor 1703. For example, memory mapped I/O and PCIe (peripheral component interconnect express) can communicate with CPU 1703 and compute die 1702. Processor 1703 can be any suitable processor such as x86 architecture based general processor (CPU), ARM® based processor, a graphics processing unit, another AI chip etc. An operating system 1704 provides instructions to processor 1703.

Figure 18A:
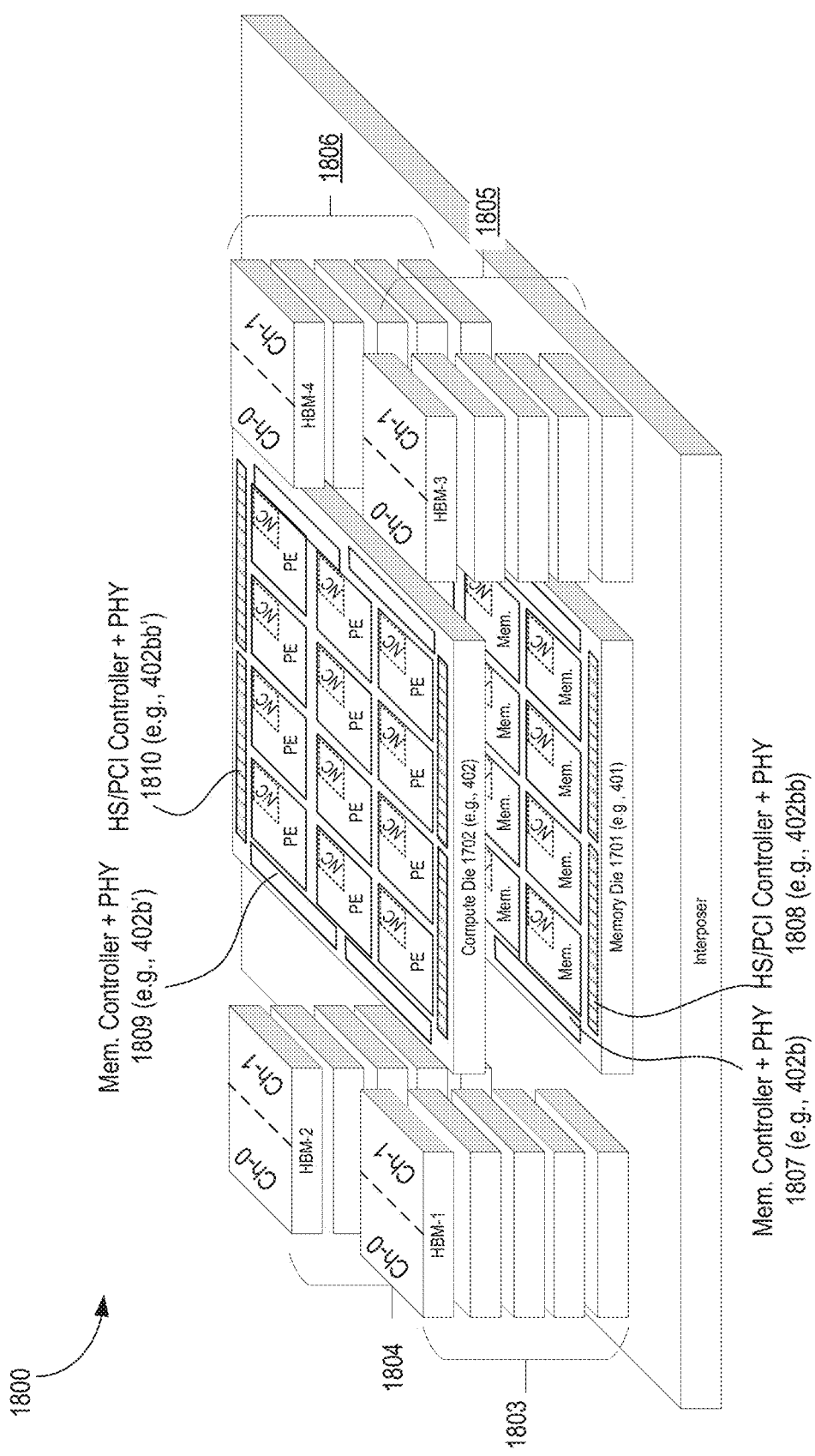
FIG. 18A illustrates a three-dimensional (3D) view of a system-on-chip (SoC) with one compute die over a memory die, which is communicatively coupled to multi-channel high bandwidth memory (HBM), in accordance with some embodiments.

FIG. 18A illustrates a three-dimensional (3D) view of system-on-chip (SoC) 1800 with one compute die over a memory die, which are communicatively coupled to multi-channel high bandwidth memory (HBM), in accordance with some embodiments. SoC 1800 comprises a stack of memory die 1701 and compute die 1702; and multi-channel HBMs 1803, 1804, 1805, and 1806. Any number of HBMs can be used. Each HBM may be a stack of memory dies. The HBMs may communicate with the memory die 1701 and/or compute die 1702 via memory controller interface 1807/1809 and high-speed (HS) PCI(e) controller interfaces 1808/1810 through the interposer. The interposer can have active or passive devices. The interposer may further couple to a package substrate (not shown). In some embodiments, HBMs 1803, 1804, 1805, 1806, are removed. In one such example, the interposer may not be needed and the memory die may sit on the package substrate. The PEs of compute die 1702 face the memory tiles of memory die 1701 such that the active transistor layers of compute die 1702 are closer to the active transistor layers of memory die 1701. In this configuration latency between memory die 1701 and compute die 1702 is reduced.

Figure 18B:
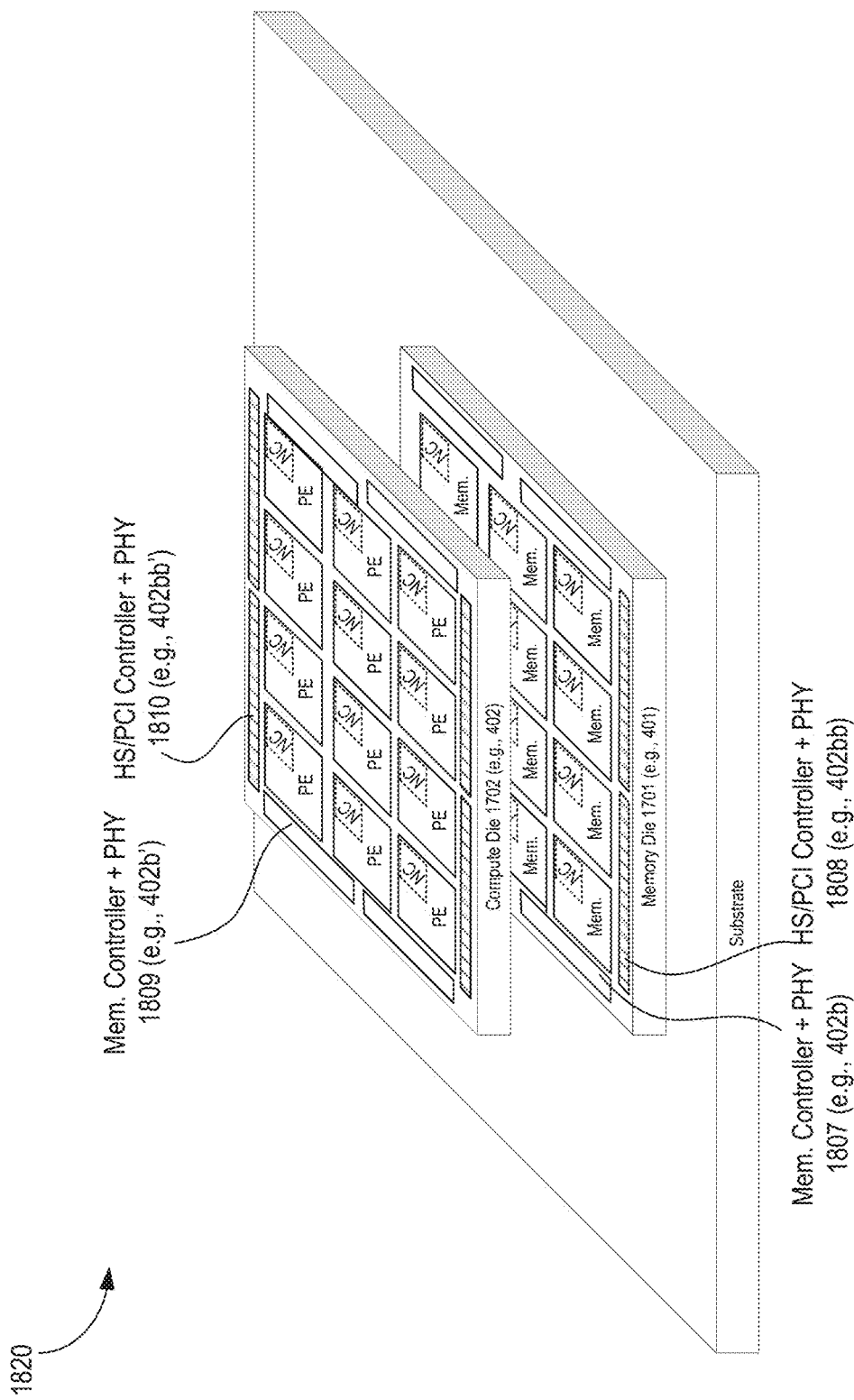
FIG. 18B illustrates a 3D view of a system-on-chip (SoC) with one compute die over a memory die over a substrate, in accordance with some embodiments.

FIG. 18B illustrates a 3D view of system-on-chip (SoC) 1820 with one compute die over a memory die over a substrate, in accordance with some embodiments. SoC 1820 is similar to SoC 1800 but without HBMs, and by replacing the interposer with a substrate (e.g., package substrate).

Figure 19A:
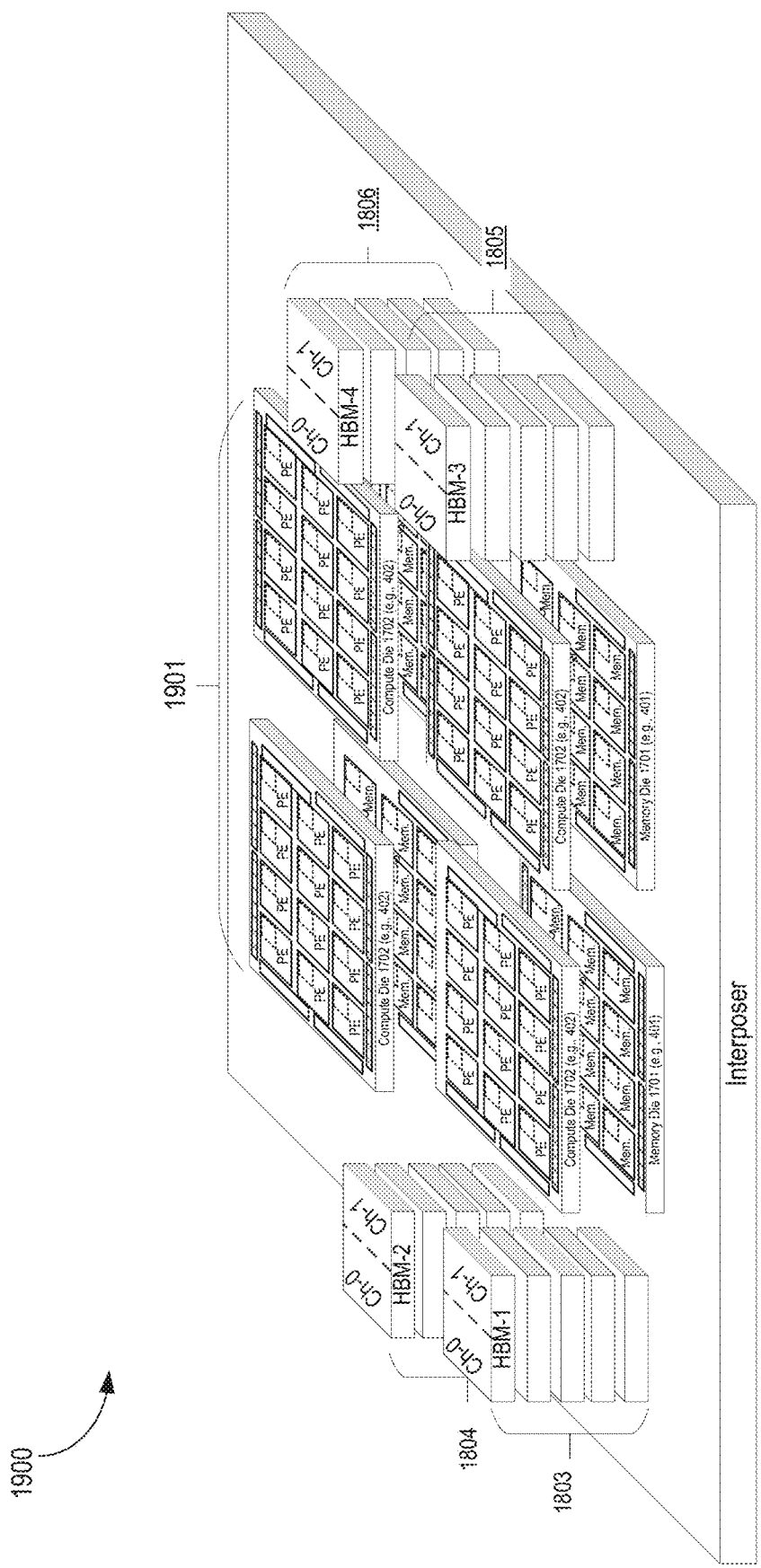
FIG. 19A illustrates a 3D view of an SoC with a cluster of homogenous compute dies over corresponding memory dies, which are communicatively coupled to HBM, in accordance with some embodiments.

FIG. 19A illustrates a 3D view of SoC 1900 with a cluster of homogenous compute dies over corresponding memory dies, which are communicatively coupled to HBM, in accordance with some embodiments. SoC 1900 is similar to SoC 1800 but for cluster 1901 of memory dies and compute dies. Here, a 2×2 cluster is shown. However, the number of clusters can be any M×N array size. The clusters are formed of chiplets of compute and memory dies. Here, the term "chiplet" generally refers to a multi-chip integrated circuit. For example, a chiplet comprises a stack of compute and memory dies. However, the embodiments are not limited to a 2×2 cluster and can have any number of clusters with any number of HBMs. In this example, the clusters are instances of memory and compute dies that together form a homogenous group of memory and compute dies. In some embodiments, HBMs 1803, 1804, 1805, 1806, are removed. In one such example, the interposer may still be used to communication between the various chiplets (e.g., stacks of compute and memory dies).

Figure 19B:
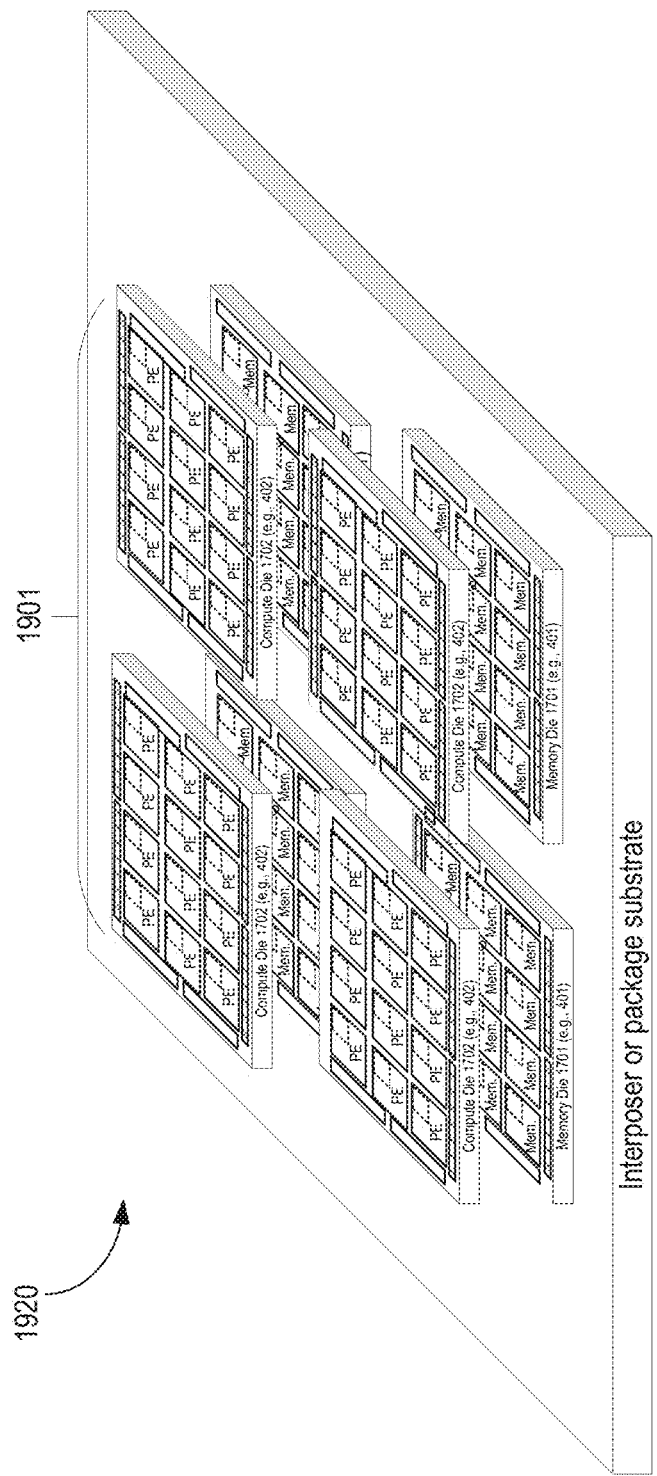
FIG. 19B illustrates a 3D view of an SoC with a cluster of homogenous compute dies over corresponding memory dies, in accordance with some embodiments.

FIG. 19B illustrates a 3D view of SoC 1920 with a cluster of homogenous compute dies over corresponding memory dies, in accordance with some embodiments. SoC 1920 is similar to SoC 1900 but without HBMs, and by replacing an active interposer with an active and/or passive interposer or substrate (e.g., package substrate).

Figure 20:
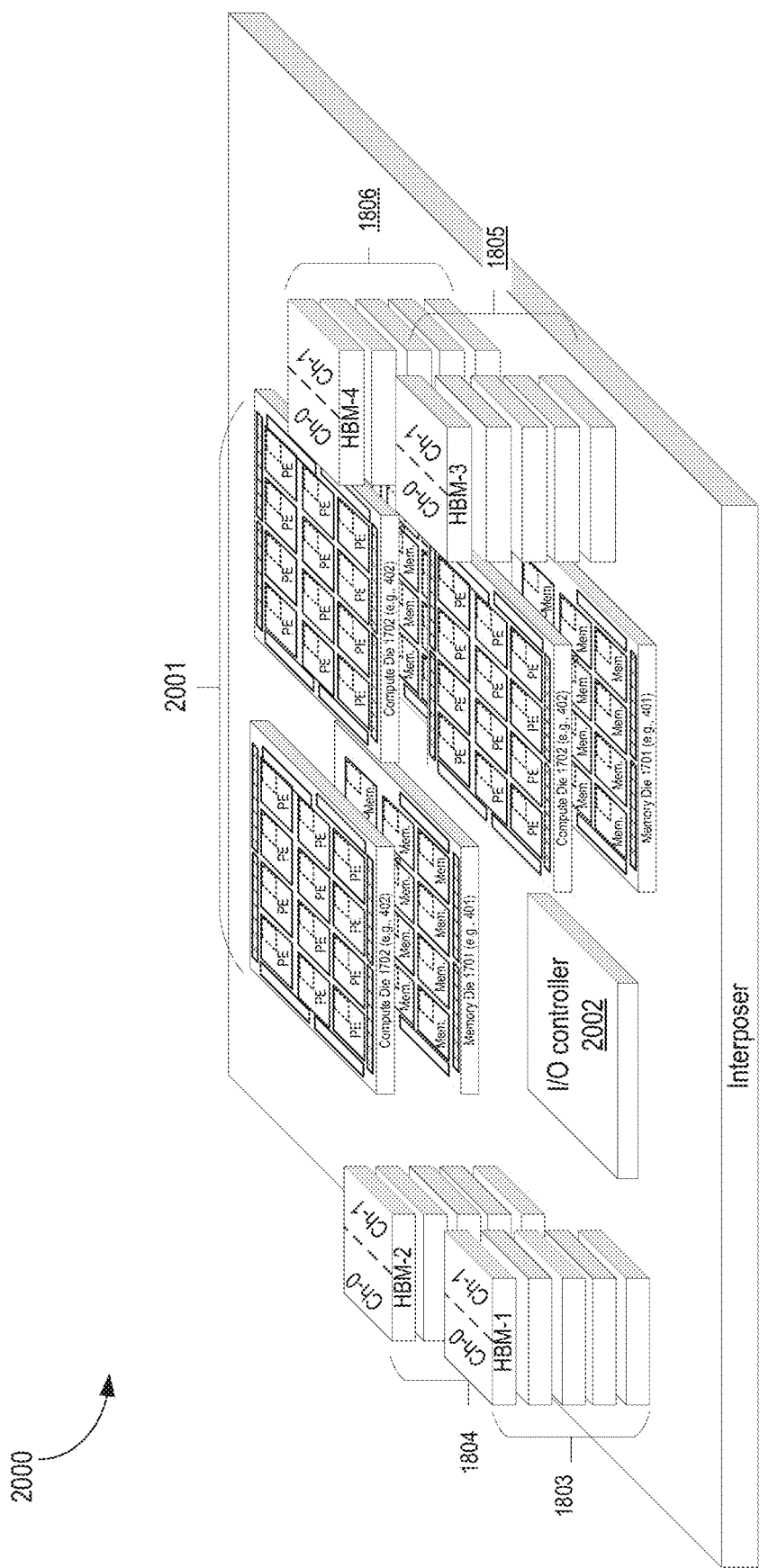
FIG. 20 illustrates a 3D view of an SoC with a cluster of heterogeneous dies, which are communicatively coupled to HBM, in accordance with some embodiments.

FIG. 20 illustrates a 3D view of a SoC 2000 with a cluster of heterogeneous dies, which are communicatively coupled to HBM, in accordance with some embodiments. Compared to SoC 1900, here the cluster 2001 of dies is heterogeneous. In this example, one of the dies is an I/O controller die 2002 while the other dies are stacks of compute and memory dies. The I/O controller die 2002 may control the traffic between the various I/O interfaces of each chiplet. Any order and number of different dies can be packaged together to form a cluster of heterogeneous dies. For example, multiple I/O controller dies can be packed such that each chiplet has an associated I/O PHY and/or controller die. The I/O controller 2002 can also communicate with off-package dies (not shown). In some embodiments, HBMs 1803, 1804, 1805, 1806, are removed. In one such example, the interposer may still be used to communication between the various chip-lets (e.g., stacks of compute and memory dies).

Figure 21:
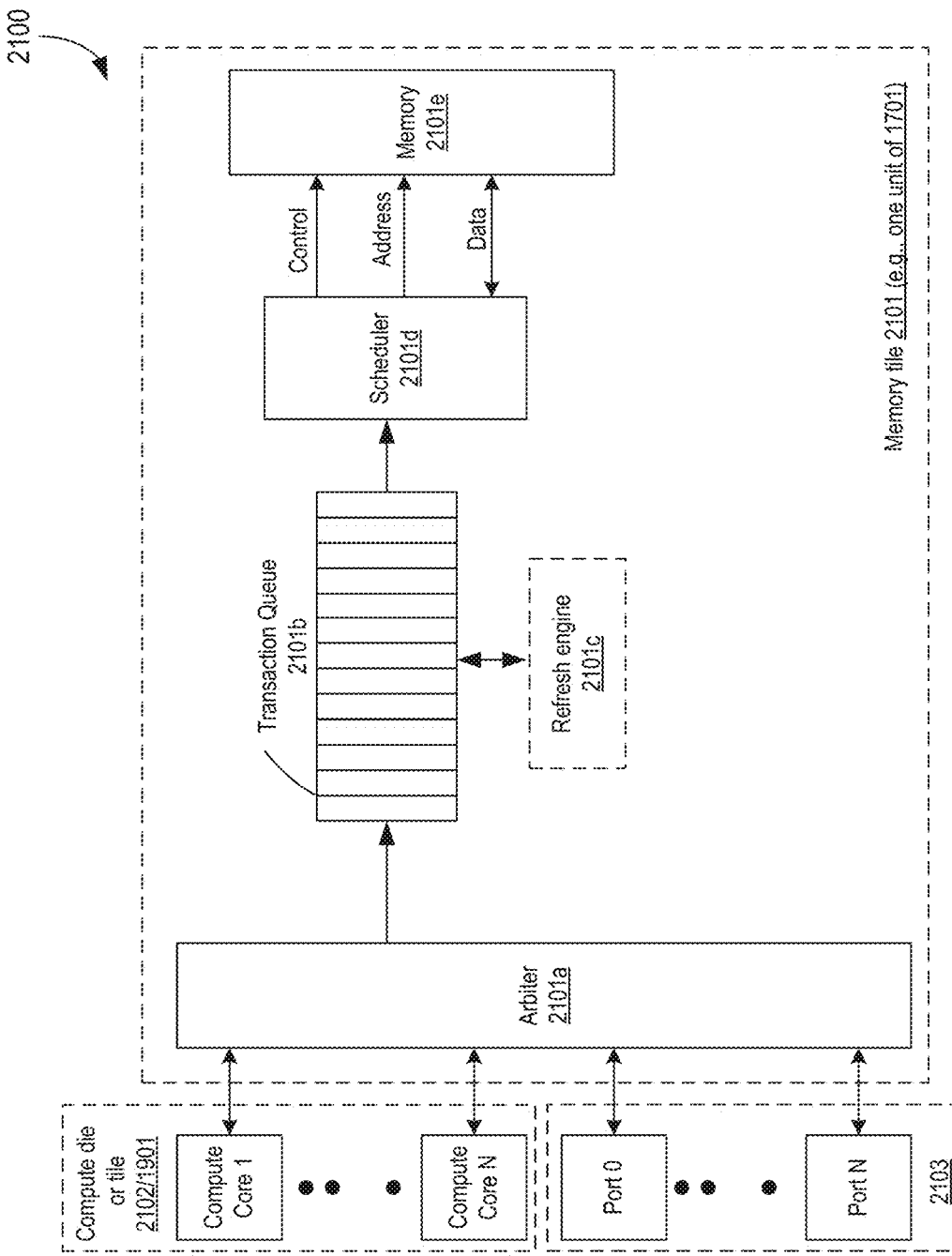
FIG. 21 illustrates a memory architecture of a memory die or memory controller having a transaction queue, in accordance with some embodiments.

FIG. 21 illustrates memory architecture 2100 of a memory die or memory controller having a transaction queue, in accordance with some embodiments. Architecture 2100 illustrates a memory tile 2101 (e.g., one of the memory units of die 1701) coupled to compute die 2102 (e.g., 1901), and a network port die 2103 (e.g., I/O controller 2002). Compute die 2101 includes a plurality of PEs or cores (e.g., core 1 through core N). Each PE may have one or more cores. The network port 2103 includes a plurality of instances of network ports (e.g., ports 0 to N). Here, the network port 2103 is part of an NoC mesh router or any such router to communicate with different compute dies (or tiles), different cores of the same compute die or tile, different memory dies, tiles, or banks.

Compute die 2102 and/or network port die 2103 issues transaction requests for memory 2101e. In this example, the memory unit comprises arbiter 2101a, transaction queue 2101b, refresh engine 2101c (if DRAM is used for memory 2101e), scheduler 2101d, and memory arrays 2101e. Arbiter 2101a decides the priority order of the requests and pushes them into transaction queue 2101b. Arbiter 2101a may also decide the rate of requests provided to the transaction queue 2101b. Transaction queue 2101b can be a, FIFO (first-in first-out) pipeline or any other suitable pipeline. In some embodiments, refresh engine 2101c adds a request to refresh memory array or subarray of memory 2101e. For example, when memory 2101e comprises DRAM, a regular refresh may be needed to prevent loss of data. Scheduler 2101d decides which transaction to schedule. It can use any suitable algorithm to generate control and address to write data to or read data from memory 2101e.

In some embodiments, components of a memory controller including arbiter 2101a, transaction queue 2101b, refresh engine 2101c (if DRAM is used for memory 2101e), and scheduler 2101d are in a separate die or tile coupled to the memory die or tile. In one example, the components of the memory controller including arbiter 2101a, transaction queue 2101b, refresh engine 2101c (if DRAM is used for memory 2101e), and scheduler 2101d are in the compute die or a compute tile.

Figure 22:
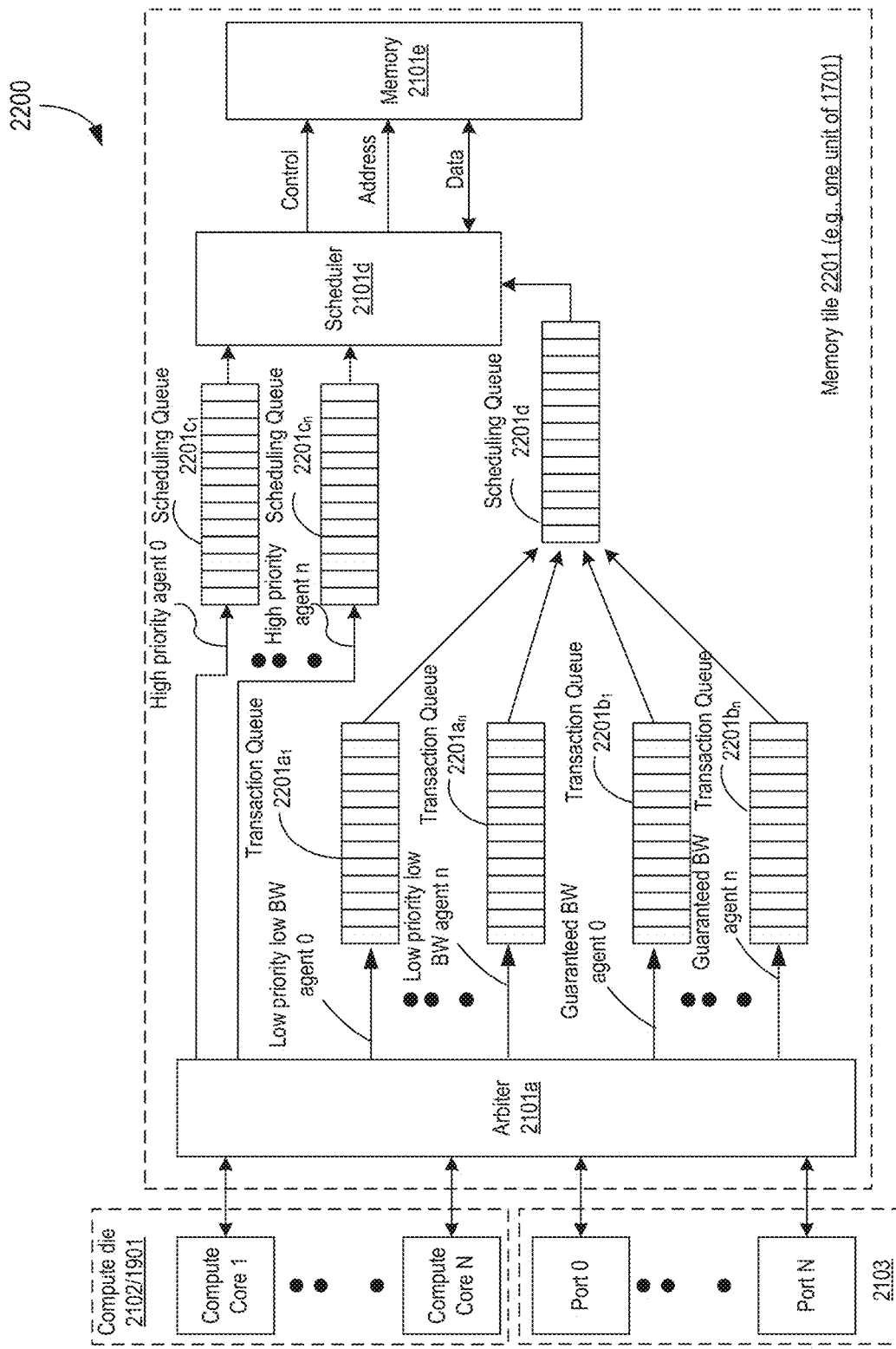
FIG. 22 illustrates a memory architecture of a memory die or memory controller having multiple transaction queues and scheduling queues, in accordance with some embodiments.

FIG. 22 illustrates memory architecture 2200 of a memory tile 2201 or memory controller having multiple transaction queues and scheduling queues, in accordance with some embodiments. Compared to architecture 2100, here multiple transactions queues 2101$a_{1-n}$, and 2201$b_{1-n}$ are provided. Transaction queues 2101$a_{1-n}$, receive low priority and low bandwidth requests, while transaction queues 2201$b_{1-n}$ receive requests with guaranteed bandwidth. For example, for DRAM, a refresh is generally used to guarantee sufficient periodic refresh bandwidth to ensure correct functionality of the DRAM. In those cases, transaction queues 2201$b_{1-n}$ are used to ensure correct functionality of the DRAM.

The requests from compute tiles or compute cores, and/or routers 2103 are forwarded by arbiter 2101a. These requests are put in transaction queues 2101$a_{1-n}$ and/or 2201$b_{1-n}$ which then provide the requests to scheduler 2101d for scheduling. In this architecture, additional scheduling queues 2201$c_{1-n}$ are provided for high priority requests. These high priority requests are not routed to a separate common scheduling queue like queue 2201d. Scheduler 2101d is the final arbiter in this example.

In some embodiments, components of the memory controller including arbiter 2101a, transaction queues 2101$a_{1-n}$, scheduler queue 2201$b_{1-n}$, and scheduler 2101d are in a separate die or tile coupled to the memory die or tile. In one example, the components of the memory controller including arbiter 2101a, transaction queues 2101$a_{1-n}$, scheduler queue 2201$b_{1-n}$, and scheduler 2101d are in the compute die or a compute tile.

Figure 23:
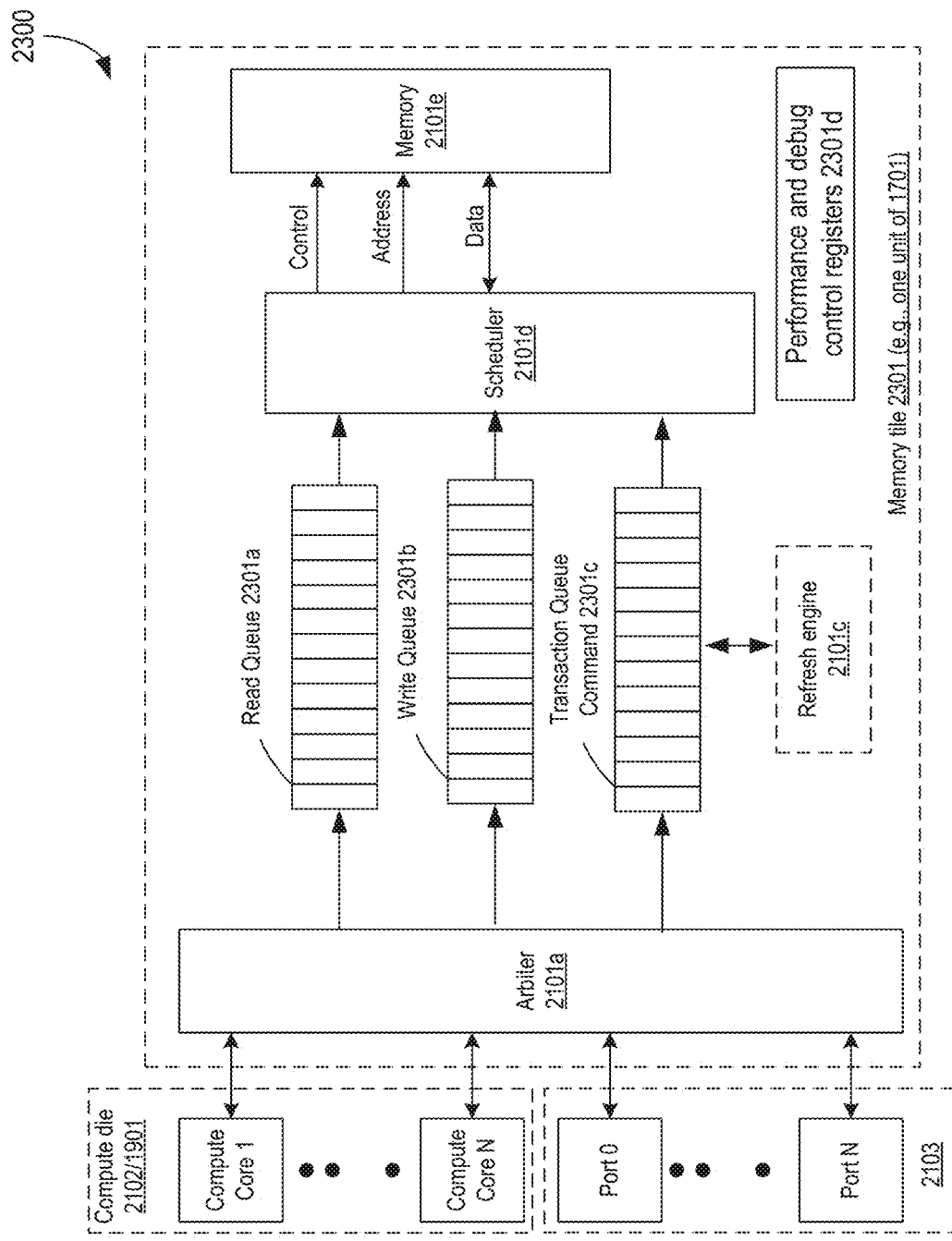
FIG. 23 illustrates a memory architecture of a memory die or memory controller having read and write quests and a transaction queue, in accordance with some embodiments.

FIG. 23 illustrates memory architecture 2300 of a memory die (and/or tile) or memory controller having read and write quests and a transaction queue, in accordance with some embodiments. Memory architecture 2300 is similar to architecture 2100 but for additional separate read 2301a and write 2301b queues. Having separate queues for read and write can provide additional performance benefits over single transaction queues. For example, extra complexity for transaction queues to decode whether the transaction request is a read or write may no longer be needed with separate read and write queues. As such, read and write transactions can be prioritized with much less logic overhead. While performance and debug control registers 2301d are shown in FIG. 23, they are also applicable to FIGS. 21-22. These registers can be used to test the operation any of the logic blocks in memory die or unit 2301.

In some embodiments, components of a memory controller including arbiter 2101a, read queue 2301a, write queue 2301b, transaction queue 2301c, refresh engine 2101c (if DRAM is used for memory 2101e), and scheduler 2101d are in a separate die or tile coupled to the memory die or tile. In one example, the components of the memory controller including arbiter 2101a, read queue 2301a, write queue 2301b, transaction queue 2301c, refresh engine 2101c (if DRAM is used for memory 2101e), and scheduler 2101d are in the compute die or a compute tile.

Figure 24:
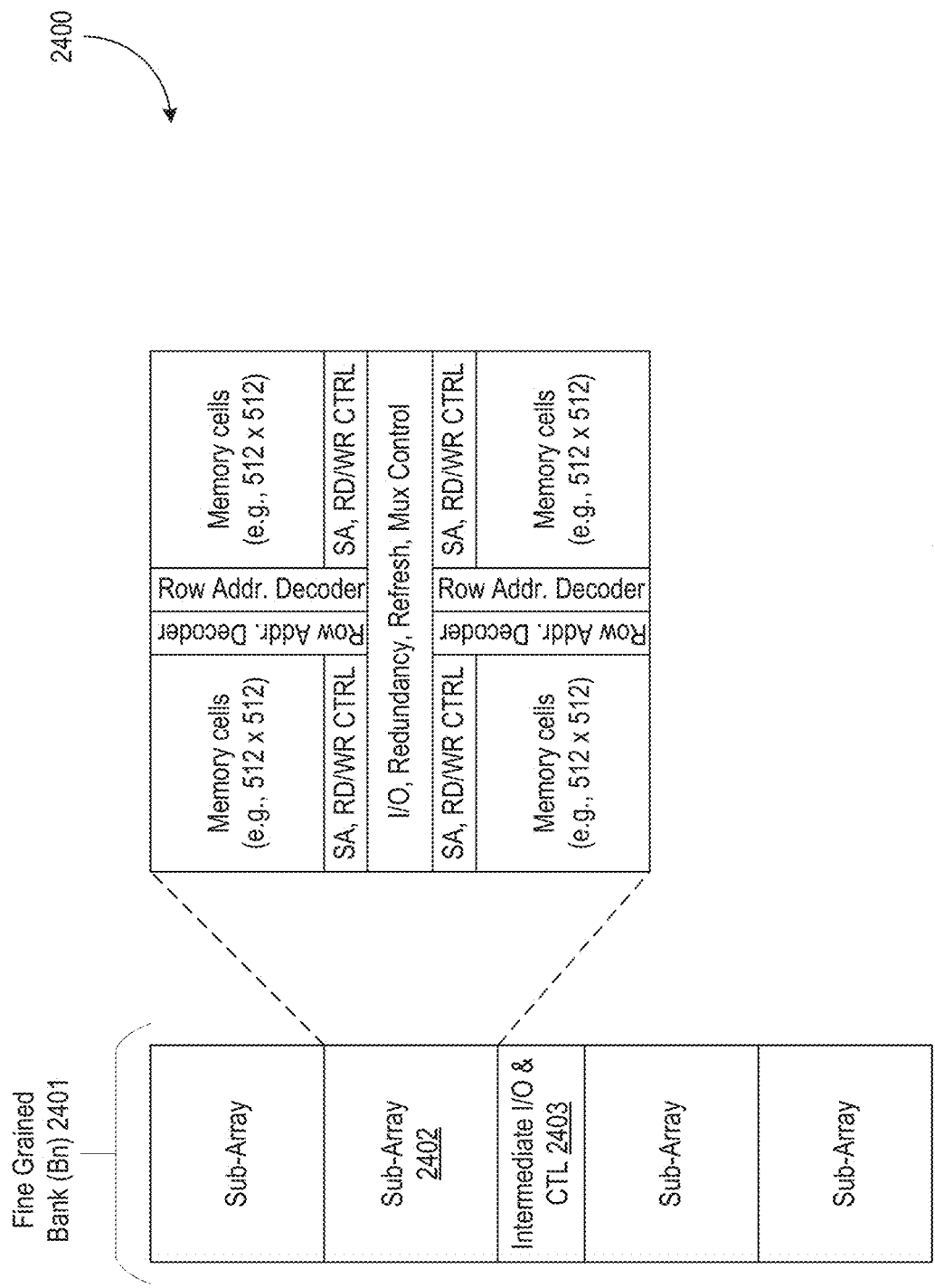
FIG. 24 illustrates a fine grained bank of a memory in the memory die, in accordance with some embodiments.

FIG. 24 illustrates architecture 2400 of a fine grained bank 2401 of a memory in the memory die, in accordance with some embodiments. Each file grained bank includes sub arrays 2402 of memory cells that share an intermediate I/O and control (CTL) logic 2403. Each sub array 2402 includes arrays of memory bit-cells (e.g., 512×512 bit-cells) organized in rows and columns Each array has an associated set of sense amplifier(s), read (RD) and write (WR) control logic. Each array also has an associated row address (addr.) decoder. Each sub-array 2402 further includes additional control logic such as memory redundancy control, I/O, refresh logic (when memory bit-cells are DRAM), column/row multiplexer controller, etc.

Figure 25:
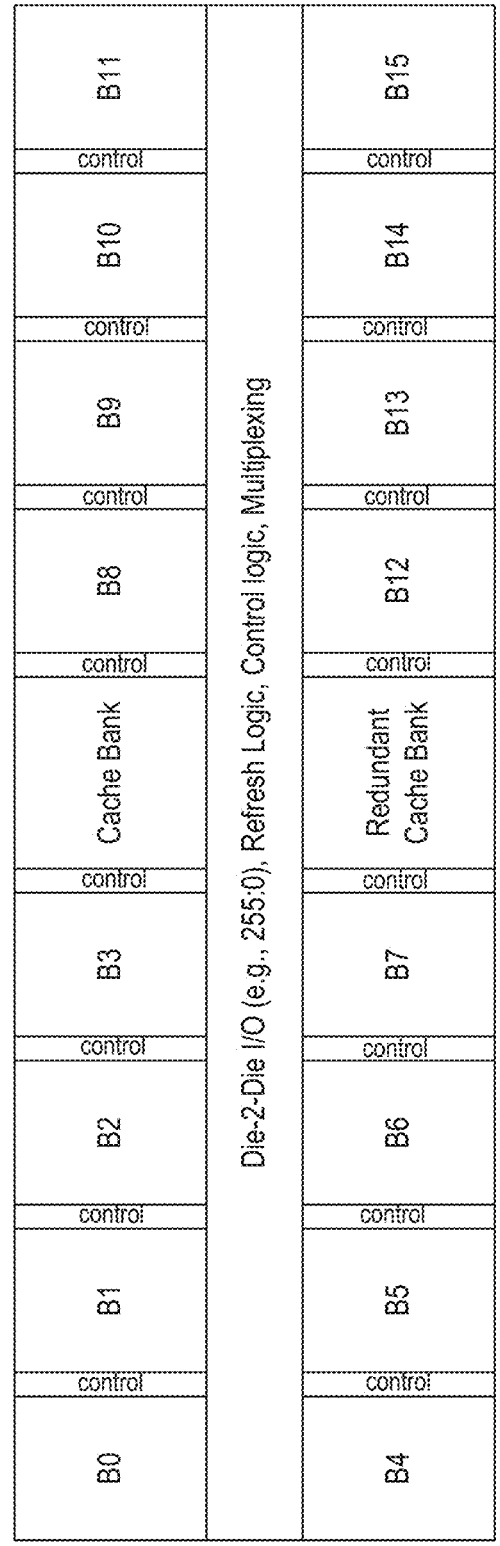
FIG. 25 illustrates a memory bank group having a cache bank, in accordance with some embodiments.

FIG. 25 illustrates memory bank group 2500 (of the memory tile) having a cache bank, in accordance with some embodiments. In this example, B0 through B15 are the 16 DRAM banks coupled to the cache. The cache bank facilitates fixed latency transactions in the DRAM banks hiding the latency uncertainties associated with the refresh operations when a read/write operation overlaps with refresh in the same bank.

Figure 26:
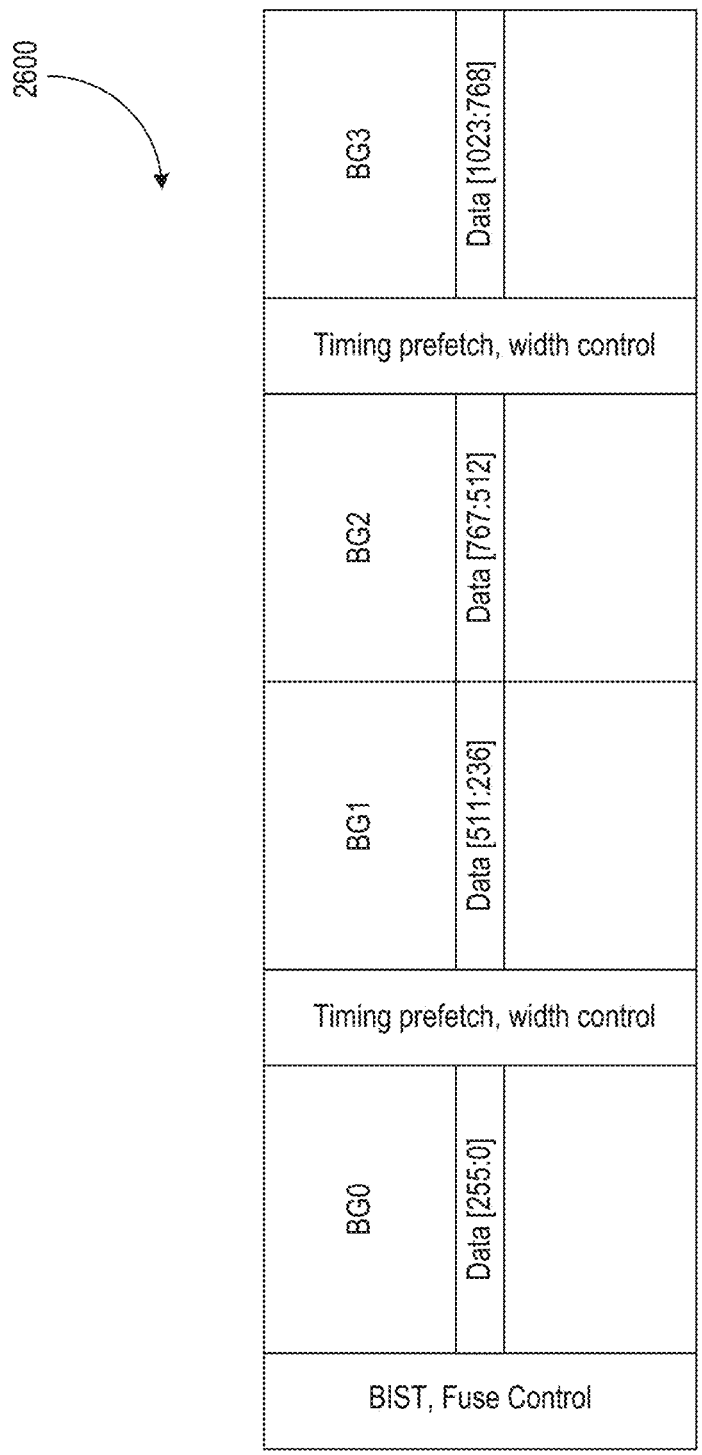
FIG. 26 illustrates a proton of the memory bank group, in accordance with some embodiments.

FIG. 26 illustrates a portion of the memory bank group for the memory tile, in accordance with some embodiments. A memory channel can have one or more memory bank groups (e.g., BG0 through BG3). This architecture includes fuse control, BIST (built-in self-test) to configure the memory.

Figure 27:
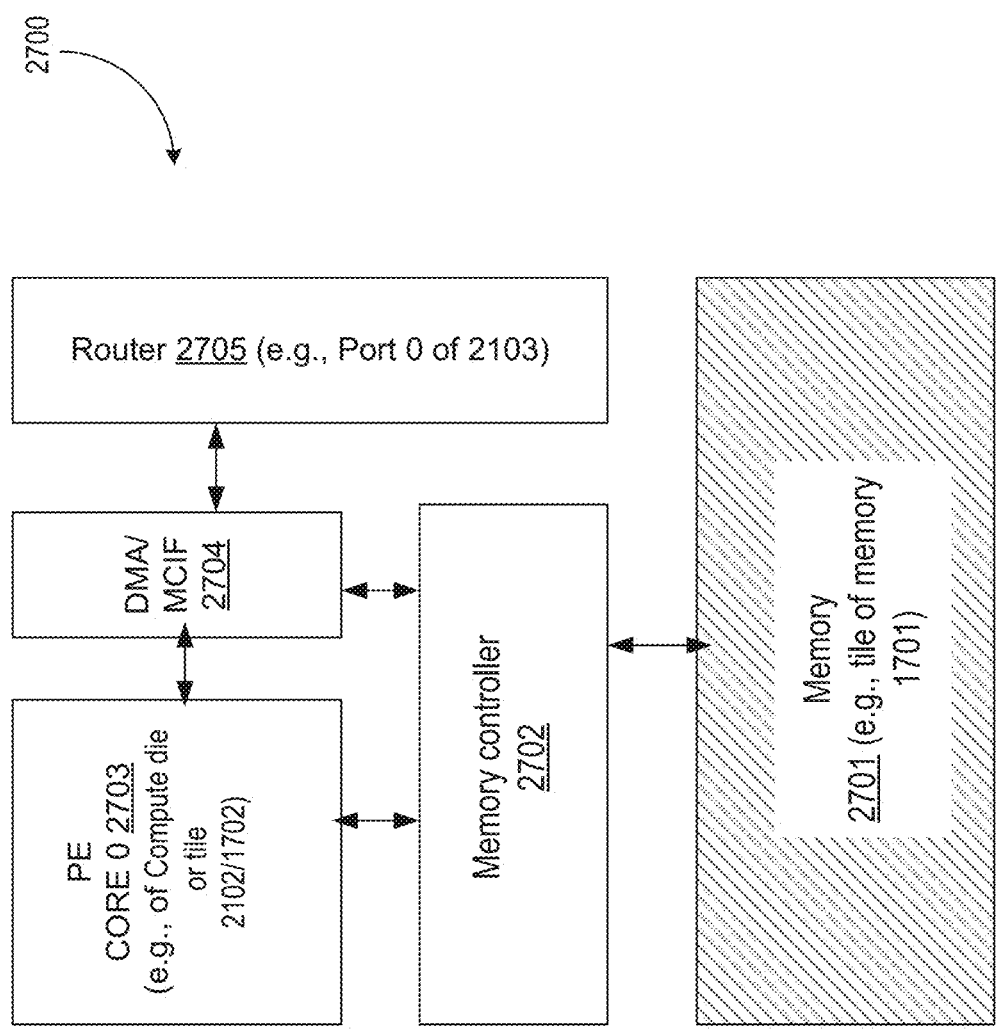
FIG. 27 illustrates a functional view of a compute tile and a memory tile, where a memory controller couples to a PE core of the compute tile, in accordance with some embodiments.

FIG. 27 illustrates functional view of a chip 2700 having a compute tile and a memory tile, where a memory controller couples to a PE core of the compute tile, in accordance with some embodiments. Chip 2700 comprises memory 2701, memory controller 2702, PE core 0 2703, DMA or memory controller interface (or interconnect fabric) 2704, and router 2705. Memory 2701 can be one of the tiles of memory die 1701. Memory controller 2702 can include arbiter 2101a, read queue 2301a, write queue 2301b, transaction queue 2301c, refresh engine 2101c (if DRAM is used for memory 2101e), scheduler 2101d, and/or any of the components described with reference to FIGS. 21-23. PE core 2703 can be in one of the tiles of compute die 2102. DMA/MCIF 2704 provides the physical interface to PE core and router 2705. As such, other PEs and/or memory controllers can communicate with one another. Router 2705 is part of the NoC mesh router 703. In this example, memory controller 2702 is coupled to a single compute tile having one PE core 2703.

In some embodiments, memory controller 2702, DMA/MCIF 2704, and/or router 2705 are part of memory tile 2701. In some embodiments, memory controller 2702, DMA/MCIF 2704, and/or router 2705 are part of compute tile which includes one or more PE cores.

Figure 28:
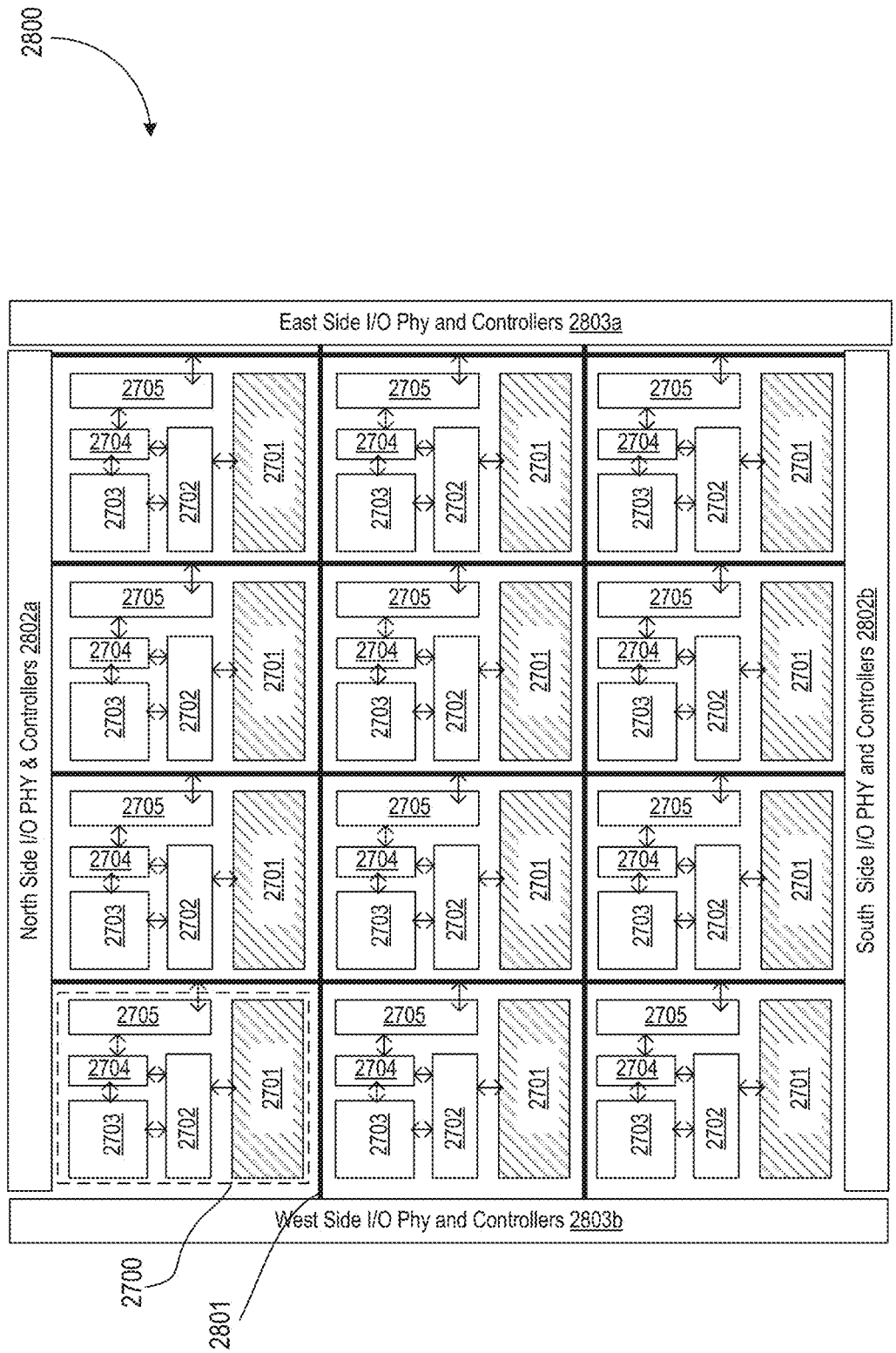
FIG. 28 illustrates a functional view of an SoC with an array of compute tiles and memory tiles, where memory controllers couple to corresponding PE cores of the compute tiles, in accordance with some embodiments.

FIG. 28 illustrates a functional view of SoC 2800 with an array of compute tiles and memory tiles, where memory controllers couple to corresponding PE cores of the compute tiles, in accordance with some embodiments. In various embodiments, components of chip 2700 form an intellectual property (IP) block that are instantiated multiple times for form an M×N array. In this example, a 4×3 array is shown which communicates via ring interconnect or any suitable mesh or torus interconnect fabric 2801. The ring interconnect or any suitable interconnect fabric 2801 is communicatively coupled to the I/Os of SoC 2800, which includes North and South side I/O PHYs and controllers 2802a/b, and/or East and West side I/O PHYs and controllers 2803a/b. These I/O PHYs and controllers may allow communication with other clusters of compute dies and memory dies. In some embodiments, these I/O PHYs and controllers may allow SoC 2800 to communicate with HBM (e.g., 1803, 1804, 1805, 1806) via an interposer. In some embodiments, router in each IP block 2700 communicate with other routes via interconnect 2801. There may be an additional router to route traffic to the North, South, East, or West I/Os 2802a/b2803a/b. Interconnect fabric 2801 may extend to peripheral I/O controllers (e.g., 2802a/b2803a/b) to talk to the routers (not shown) within those controllers.

Figure 29:
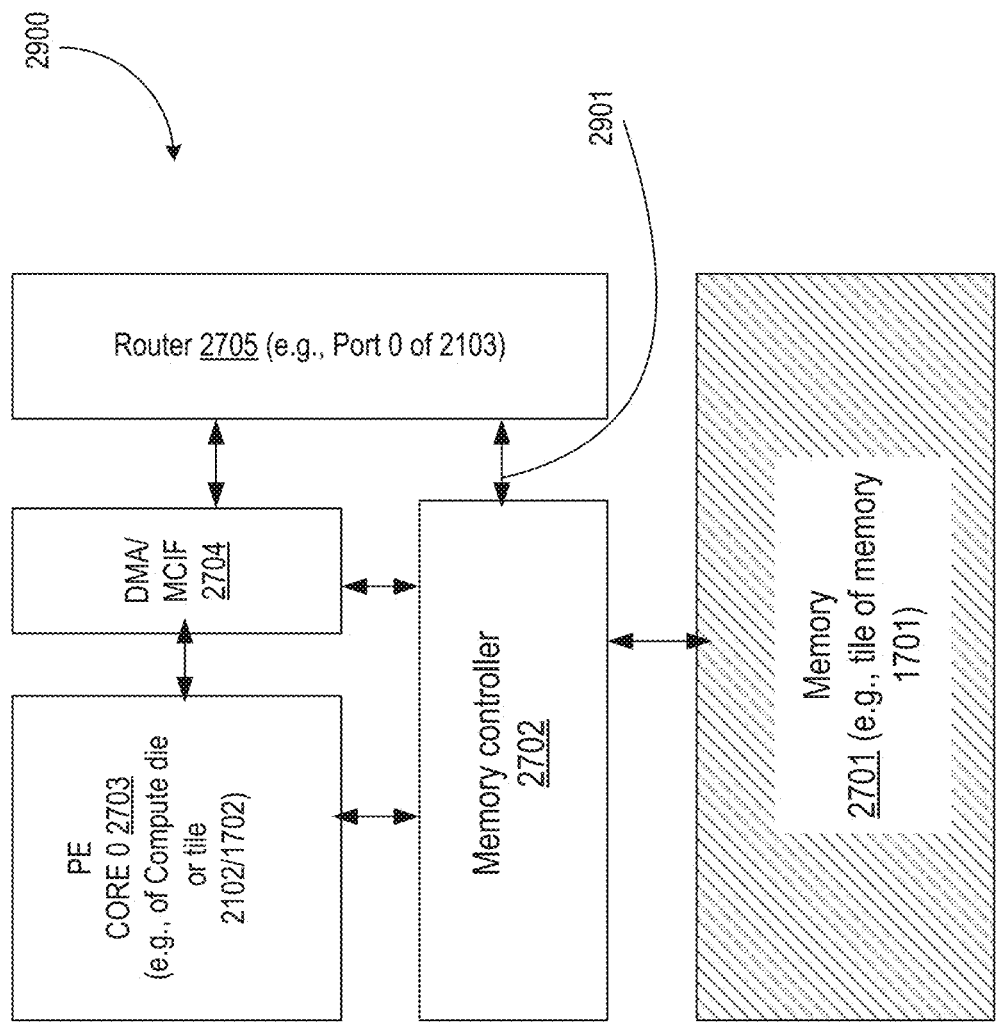
FIG. 29 illustrates a functional view of a compute tile and a memory tile, where a memory controller couples to a PE core of the compute tile, and also to a local router, in accordance with some embodiments.

FIG. 29 illustrates a functional view of a chip 2900 having a compute tile and a memory tile, where a memory controller couples to a PE core of the compute tile and also to a local router, in accordance with some embodiments. Chip 2900 is same as chip 2700 but with additional interface 2901 to allow memory controller 2702 to directly communicate with router 2705. For high priority transactions, memory controller 2702 may directly communicate with another compute tile or memory tile via router 2705.

Figure 30:
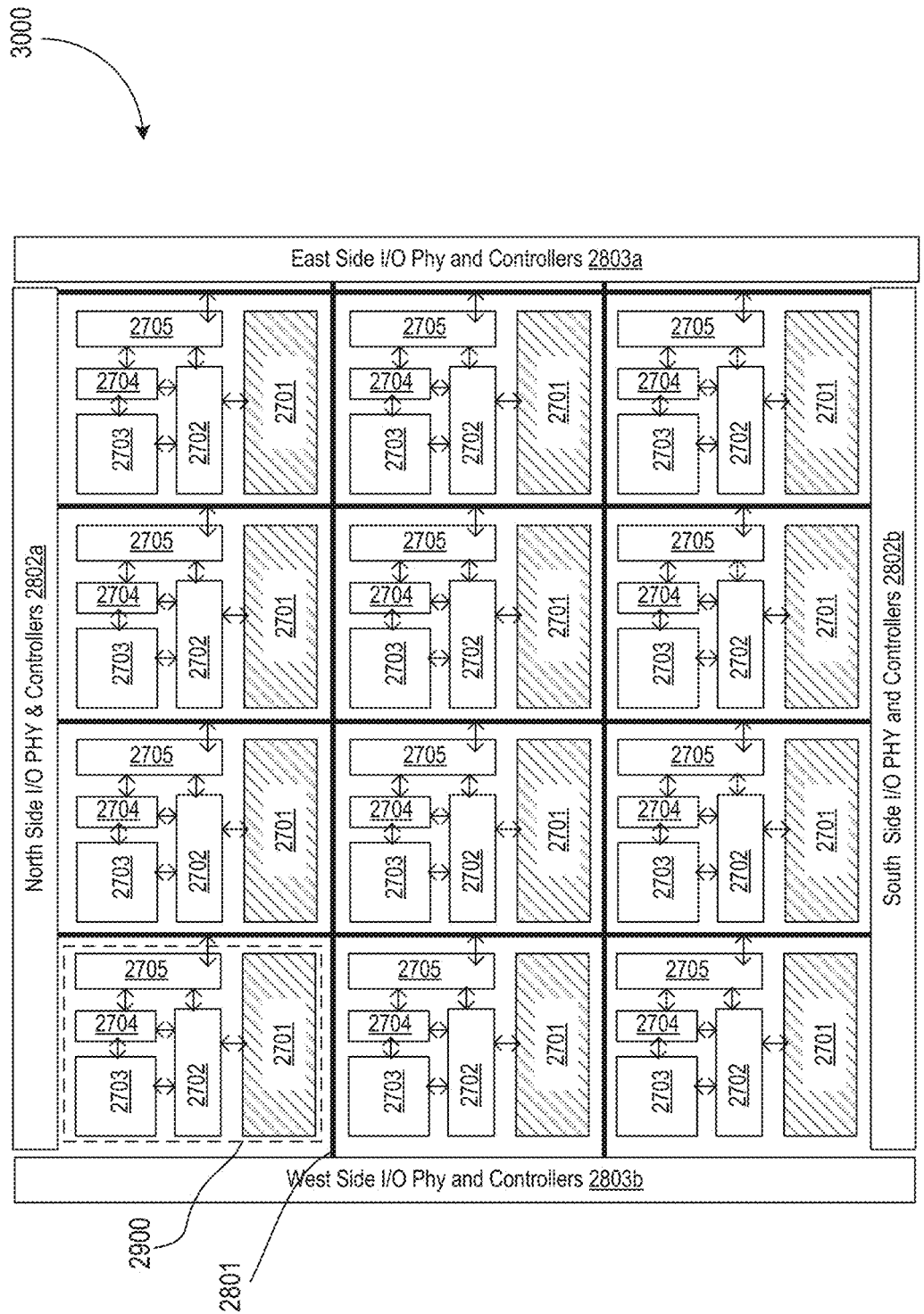
FIG. 30 illustrates a functional view of an SoC with an array of compute tiles and memory tiles, where memory controllers couple to corresponding PE cores of the compute tiles, and also to a local router, in accordance with some embodiments.

FIG. 30 illustrates a functional view of SoC 3000 with an array of compute tiles and memory tiles, where memory controllers couple to corresponding PE cores of the compute tiles and also to a local router, in accordance with some embodiments. In this example, the array is a 3×3 array of the IP block of chip 2900.

Figure 31:
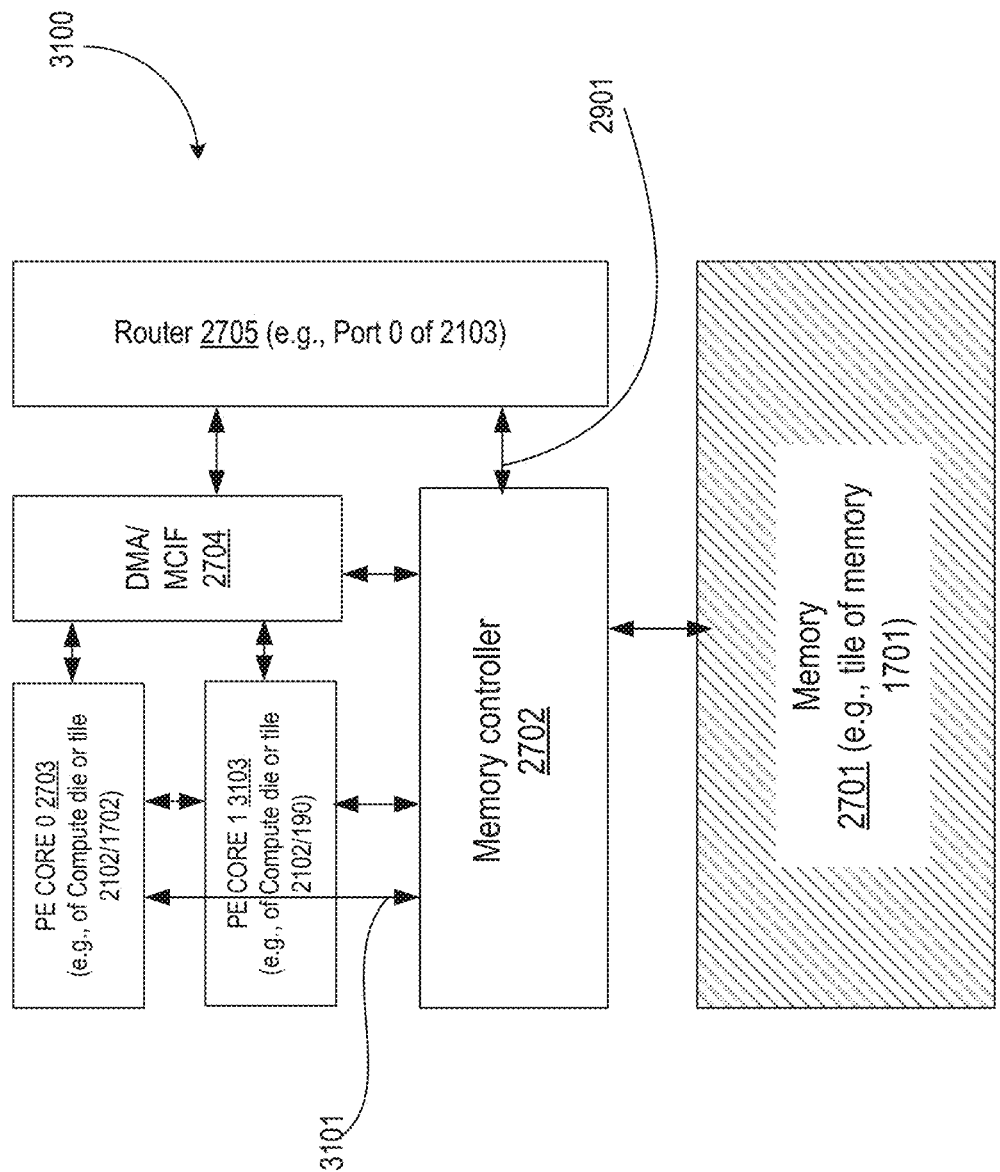
FIG. 31 illustrates a functional view of a compute tile and a memory tile, where a memory controller couples to two PE cores of the compute tile, the memory tile, and to a local router, in accordance with some embodiments.

FIG. 31 illustrates a functional view of a chip 3100 having a compute tile and a memory tile, where a memory controller couples to two PE cores of the compute tile, the memory tile, and to a local router, in accordance with some embodiments. Chip 3100 is the same as chip 2900 but for the addition of a multi-core compute die which include PE core 0 2703 and PE core 1 3103. Another different between chip 2900 and 3100 is the additional interface 3101 that allows memory controller to communicate directly with both PE cores.

Figure 32:
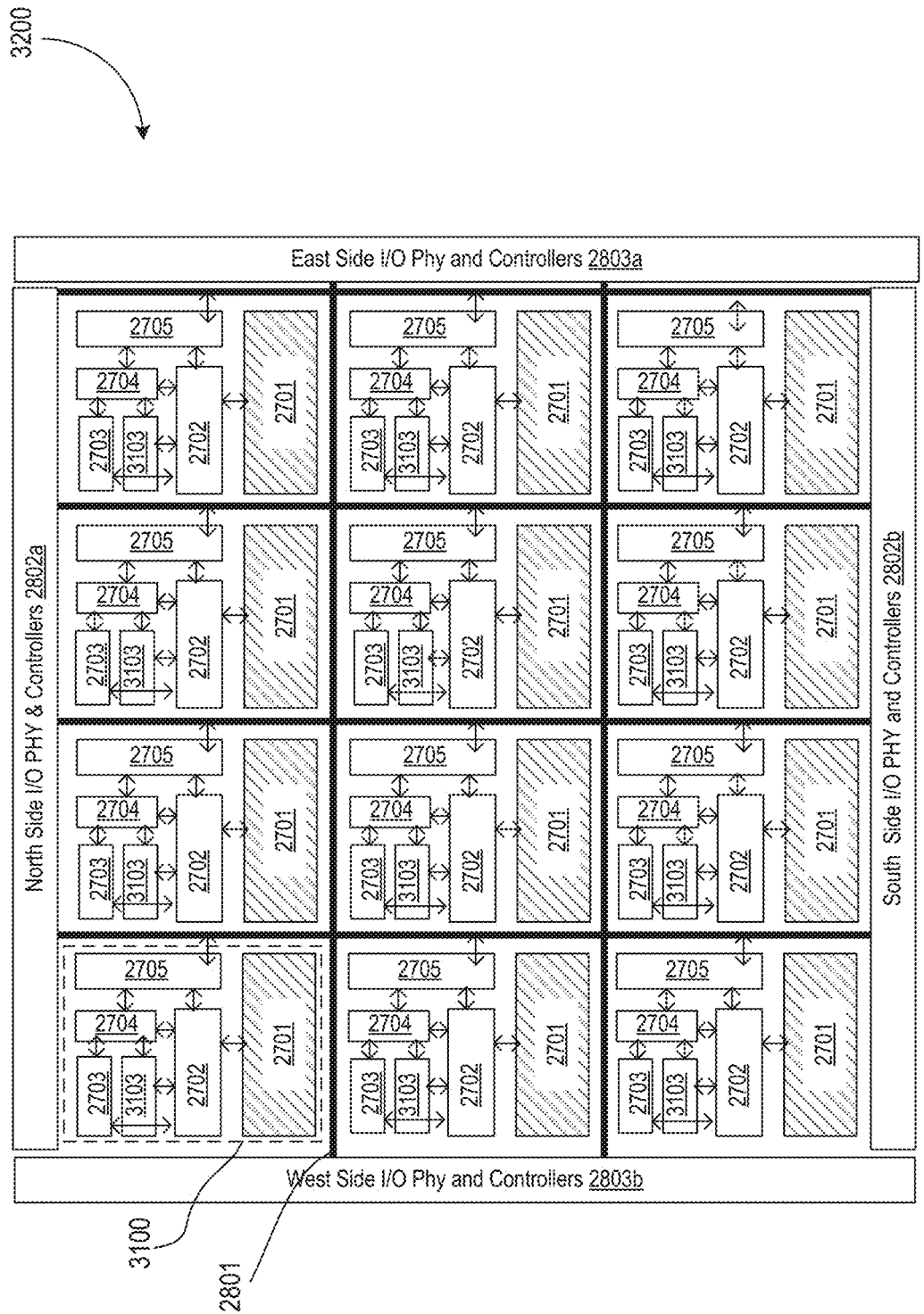
FIG. 32 illustrates a functional view of an SoC with an array of compute tiles and memory tiles, where memory controllers couples to two PE cores of the compute tiles, and also to a local router, in accordance with some embodiments.

FIG. 32 illustrates a functional view of SoC 3200 with an array of compute tiles and memory tiles, where memory controllers couples to two PE cores of the compute tiles, and also to a local router, in accordance with some embodiments. In this example, the array is a 3×3 array of the IP block of chip 3100.

Figure 33:
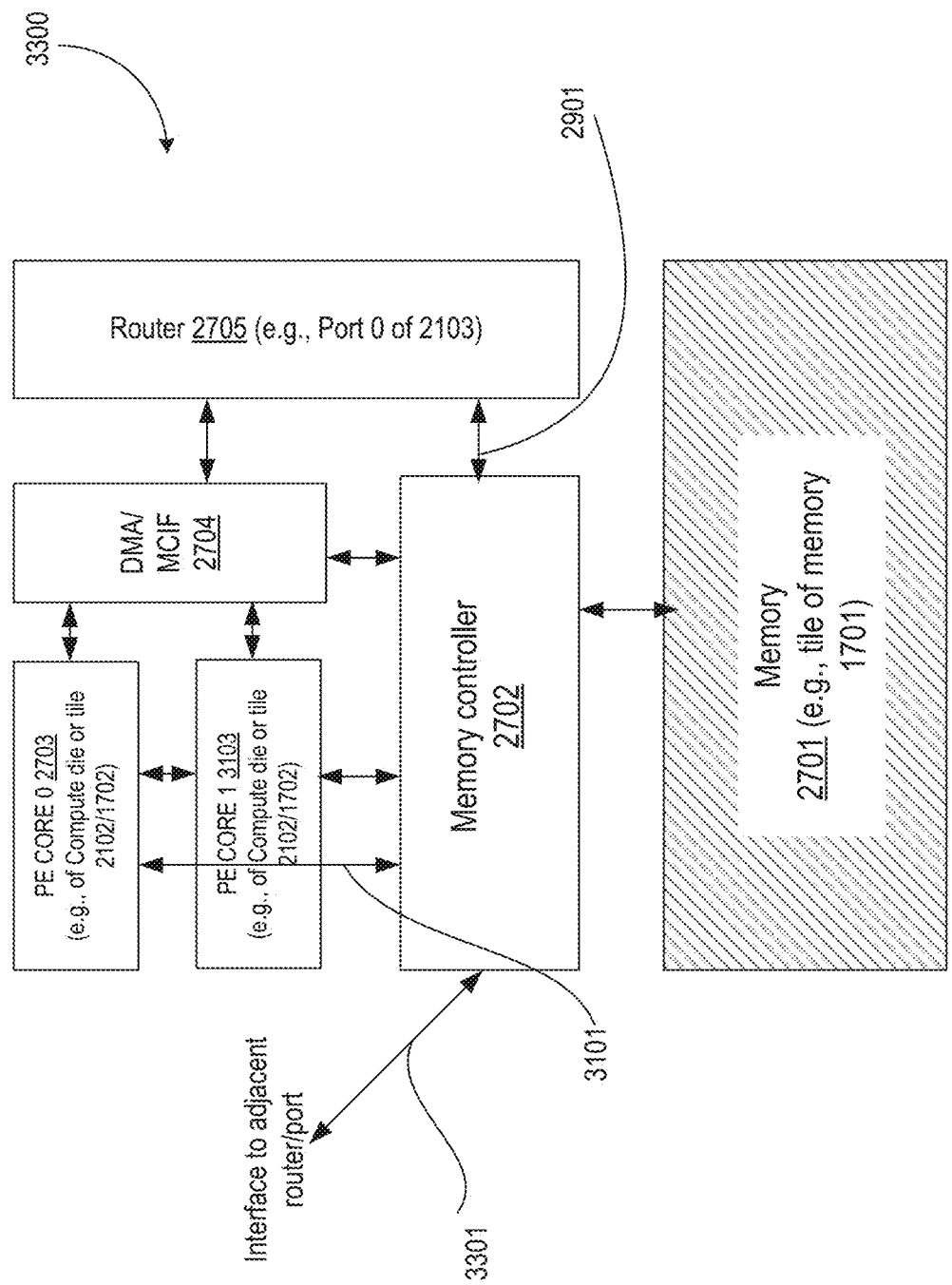
FIG. 33 illustrates a functional view of a compute tile and a memory tile, where a memory controller couples to two PE cores of the compute tile, the memory tile, to a local router, and an adjacent router, in accordance with some embodiments.

FIG. 33 illustrates a functional view of a chip 3300 having a compute tile and a memory tile, where a memory controller couples to two PE cores of the compute tile, the memory tile, to a local router, and an adjacent router, in accordance with some embodiments. Chip 3300 is same as chip 3100 but for the addition an interface 3301 to memory controller 2701 to ally memory controller 2701 to communicate with an adjacent router. While interface 3301 can communicate with an adjacent router, it is not limited to such. For example, interface 3301 can communicate with other routers (e.g., other neighbors) within this function view.

Figure 34:
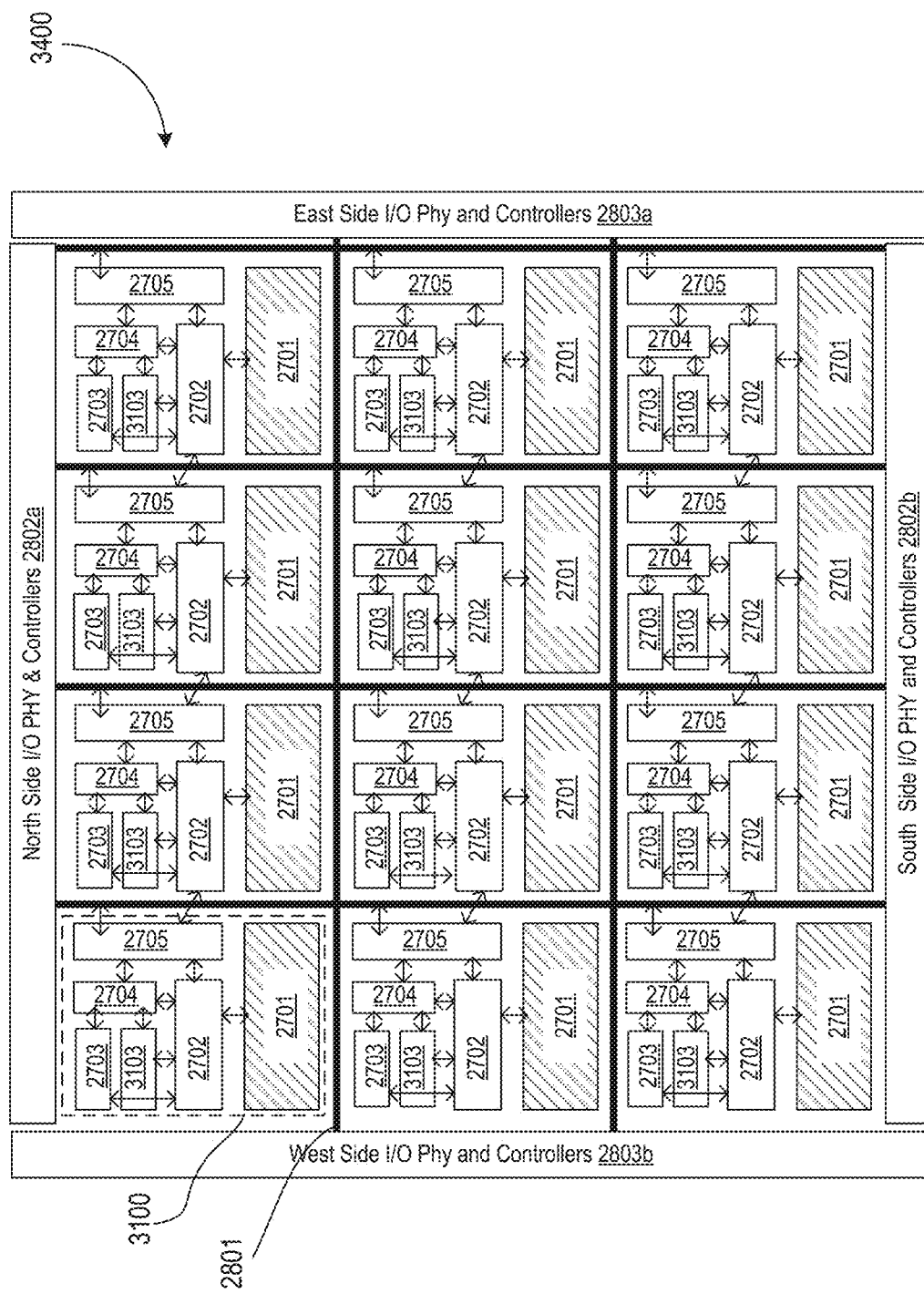
FIG. 34 illustrates a functional view of an SoC with an array of compute tiles and memory tiles, where memory controllers couple to two PE cores of the compute tiles, to a local router, and an adjacent router, in accordance with some embodiments.

FIG. 34 illustrates a functional view of SoC 3400 with an array of compute tiles and memory tiles, where memory controllers couple to two PE cores of the compute tiles, to a local router, and an adjacent router, in accordance with some embodiments. In this example, the array is a 3×3 array of the IP (intellectual property) block of chip 3300.

In one embodiment, where the cache bank of FIG. 25 is shared across multiple banks for a DRAM-type memory, refresh operations can be scheduled to all the banks (e.g., B0 through B15) while ensuring fixed latency access. In this embodiment, all the banks and refresh engines follow the following policy. First, all banks can have refresh schedules when not doing any read/write operation within the bank, independently. Second, when a read happens to any bank, it is written into the cache memory bank.

This then can take care of following extreme situation that can happen, guaranteeing ability to refresh a bank, without blocking or delaying memory operations. First, read to only one bank (e.g., A1), same row (e.g., R1). In this case, since the memory is in the cache after $1^{st}$ read, the refresh can be scheduled in bank A1, to all the rows without blocking memory access operations. Other banks can refresh anyway, since no operation is happening there. Second, read to different rows within the same bank. In this case, since the reads are happening to different rows of the same bank, the refresh requirement goes down, proportionately to the number of rows that are not being read, and now they can be scheduled again without blocking access. However, there is a cost associated with this since each operation involves an additional read or write to cache memory, the density impact can be minimized as cache bank is shared across multiple bank.

In other implementations, a read to a bank in conjunction with the availability of the read or write buffer on a per-bank can again be done to hide latency associated with refresh. For example, a read operation to a bank can make use of a read buffer to store a page worth of data in, say, one cycle, which it can use to send across I/O over multiple cycles, thereby gaining time to schedule refresh into the bus. Vice-versa, one can do the same for the write operation using write buffers as well, ensuring fixed cycle latency for read/write operation while scheduling the refresh in the background. This implementation can be done where the I/O bandwidth is limited to a lower value, compared to the internal bandwidth or time available at the bank level, due to large page read or writes at the bank level.

There are at least three different methods and/or options to manage data for reading and/or writing. The first option is arbitration based. In an arbitration based architecture based on DRAM, refresh engine 2101c arbitrates for writing to a memory bank in which read and/or write operations are happening. During conflicts with an ongoing refresh, read and/or write operations have to be halted which cause latency, for read or write transactions that overlap with refresh transactions in the same memory bank, increases relative to normal.

In fixed reserved slot option, clock cycle is divided in two sub-parts. One part is used for refresh, and the other for normal read and/or write operation. In this case, array access clocking is effectively halved for useful operations. For example, for every clock cycle there is a refresh operation and in another clock cycle read/or write operation takes place. This option has non-optimal refresh scheduling and fixed latency for read and/or write operations because refresh is perhaps happening more than needed. In another example, a time slot reserved for refresh may use that time slot for no-operation (no-op) or refresh depending on the need for refresh of the memory.

In the option for refresh scheduling with one extra cache of bank, optimal refresh scheduling with refresh operation is hidden from external access. There is fixed latency for read and/or write operations. This option may have an area penalty (e.g., approximately 10%) associated with extra cache bank, tags, and logic controlling refresh scheduling.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a first die including a plurality of a random access memory (RAM) tiles to store input data, weight factors, and outputs; and a second die over the first die, wherein the second die includes a plurality of compute tiles, wherein each compute tile includes: a matrix multiplier communicatively coupled to one or more RAM tiles of the first die; and a buffer communicatively coupled to the one or more RAM tiles of the first die.

Example 2: The apparatus of example 1, wherein the plurality of compute tiles includes a first compute tile and a second compute tile, wherein the first compute tile is operable to access a buffer or memory of the second compute tile.

Example 3: The apparatus of example 1 comprising a ring or mesh interconnect that is coupled to the first and second die, wherein the ring or mesh interconnect is: coupled to a first interconnect which is coupled to the buffer and the RAM; coupled to a second interconnect which is coupled to the RAM and the matrix multiplier; and coupled to a third interconnect which is coupled to the RAM and the matrix multiplier.

Example 4: The apparatus of example 3, wherein the ring or mesh interconnect is positioned in the first die.

Example 5: The apparatus of example 3, wherein the ring or mesh interconnect is positioned in the second die.

Example 6: The apparatus of example 3, wherein the first, second, and third interconnects extend vertically between the first and second dies.

Example 7: The apparatus of example 6, wherein a first portion of the ring or mesh interconnect is in the first die and a second portion of the ring or mesh interconnect is in the second die, wherein the first and second portions of the ring or mesh interconnect are coupled via interconnect that extends vertically between the first and second dies.

Example 8: The apparatus of example 1, wherein the first die comprises buffers to communicate with a memory external to the first and second dies.

Example 9: The apparatus of example 1, wherein the second die comprises buffers to communicate with a memory external to the first and second dies.

Example 10: The apparatus of example 9, wherein the memory is one of a Fe-RAM, DRAM, or an SRAM.

Example 11: The apparatus of example 9, wherein: the matrix multiplier is a first matrix multiplier; the second die includes a second multiplier; the input data is split into a first data and a second data; the weight factors are split into a first weight factor and a second weight factor; the first matrix multiplier is to multiply the first data with the first weight factor to generate a first output; and the second matrix multiplier is to multiply the second data with the second weight factor to generate a second output.

Example 12: The apparatus of example 11, wherein: the second die includes an adder, which is to add the first output with the second output to generate a third output; the third output is stored in the RAM; the input data is split in the first and second data when a size of the input data is above a first threshold; and the weight factors data is split in the first and second data when a size of the weight factors is above a second threshold.

Example 13: The apparatus of example 9, wherein: the matrix multiplier is a first matrix multiplier; the second die includes a second multiplier; the weight factors are split into a first weight factor and a second weight factor; the first matrix multiplier is to multiply the input data with the first weight factor to generate a first output; and the second matrix multiplier is to multiply the input data with the second weight factor to generate a second output.

Example 14: The apparatus of example 13, wherein: the second die includes circuitry to concatenate the first output with the second output to generate a third output; the third output is stored in the RAM; the weight factors data is split in the first and second data when a size of the weight factors is above a second threshold; and the second die is positioned over the first die in a package.

Example 15: The apparatus of example 14, wherein the RAM includes one or more of: MRAM, Fe-RAM, Fe-SRAM, SRAM, DRAM, or Re-RRAM.

Example 16: A system comprising: a memory; a first processor to generate a training model having weight factors; and a second processor to receive the training model, wherein the second processor is coupled to the memory, and wherein the second processor includes: a first die including: a first ferroelectric random access memory (FE-RAM) to store input data; a second FE-RAM to store the weight factors; and a second die including: a matrix multiplier communicatively coupled to the first and second FE-RAMs; and a buffer communicatively coupled to the first FE-RAM.

Example 17: The system of example 16, wherein the second processor comprising a ring interconnect that is coupled to the first and second die, wherein the ring interconnect is: coupled to a first interconnect which is coupled to the buffer and the first FE-RAM; coupled to a second interconnect which is coupled to the first FE-RAM and the matrix multiplier; and coupled to a third interconnect which is coupled to the second FE-RAM and the matrix multiplier.

Example 18: The system of example 16, wherein: the matrix multiplier is a first matrix multiplier; the second die includes a second multiplier; the input data is split into a first data and a second data; the weight factors are split into a first weight factor and a second weight factor; the first matrix multiplier is to multiply the first data with the first weight factor to generate a first output; and the second matrix multiplier is to multiply the second data with the second weight factor to generate a second output.

Example 19: The system of example 18, wherein the second die includes an adder, which is to add the first output with the second output to generate a third output, and wherein the third output is stored in the first FE-RAM.

Example 20: An apparatus comprising: a first die including: a first ferroelectric random access memory (FE-RAM) to store input data; a second FE-RAM to store weight factors; and a second die including: a matrix multiplier communicatively coupled to the first and second FE-RAMs; and a buffer communicatively coupled to the first FE-RAM.

Example 21: The apparatus of example 20 comprising a ring or mesh interconnect that is coupled to the first and second dies, wherein the ring or mesh interconnect is: coupled to a first interconnect which is coupled to the buffer and the first FE-RAM; coupled to a second interconnect which is coupled to the first FE-RAM and the matrix multiplier; and coupled to a third interconnect which is coupled to the second FE-RAM and the matrix multiplier.

Example 22: The apparatus of example 21, wherein the ring or mesh interconnect is positioned in the first die.

Example 23: The apparatus of example 21, wherein the ring or mesh interconnect is positioned in the second die.

Example 24: The apparatus of example 21, wherein the first, second, and third interconnects extend vertically between the first and second dies.

Example 25: The apparatus of example 21, wherein a first portion of the ring or mesh interconnect is in the first die and a second portion of the ring or mesh interconnect is in the second die, wherein the first and second portions of the ring or mesh interconnect are coupled via interconnect that extends vertically between the first and second dies.

Example 26: The apparatus of example 20, wherein the first die comprises buffers to communicate with a memory external to the first and second dies.

Example 27: The apparatus of example 20, wherein the second die comprises buffers to communicate with a memory external to the first and second dies.

Example 28: The apparatus of example 27, wherein the memory is one of a FE-RAM or an SRAM.

Example 29: The apparatus of example 20, wherein: the matrix multiplier is a first matrix multiplier; the second die includes a second multiplier; the input data is split into a first data and a second data; the weight factors are split into a first weight factor and a second weight factor; the first matrix multiplier is to multiply the first data with the first weight factor to generate a first output; and the second matrix multiplier is to multiply the second data with the second weight factor to generate a second output.

Example 30: The apparatus of example 29, wherein: the second die includes an adder, which is to add the first output with the second output to generate a third output; the third output is stored in the first FE-RAM; the input data is split in the first and second data when a size of the input data is above a first threshold; the weight factors data is split in the first and second data when a size of the weight factors is above a second threshold.

Example 31: The apparatus of example 20, wherein: the matrix multiplier is a first matrix multiplier; the second die includes a second multiplier; the weight factors are split into a first weight factor and a second weight factor; the first matrix multiplier is to multiply the input data with the first weight factor to generate a first output; and the second matrix multiplier is to multiply the input data with the second weight factor to generate a second output.

Example 32: The apparatus of example 31, wherein: the second die includes circuitry to concatenate the first output with the second output to generate a third output; the third output is stored in the first FE-RAM; the weight factors data is split in the first and second data when a size of the weight factors is above a second threshold; and the second die is positioned over the first die in a package.

Example 33: An apparatus comprising: a first circuitry to generate a training model having weight factors; a second circuitry to multiply an input data with the weight factors to generate an output representative of an error; a first ferroelectric random access memory (FE-RAM) to store the input data; a second FE-RAM to store the weight factors, wherein the second circuitry is communicatively coupled to the first and second FE-RAMs; and a buffer communicatively coupled to the first FE-RAM.

Example 34: The apparatus of example 33 comprising a ring or mesh interconnect, wherein the ring mesh interconnect is coupled to: the buffer, the first FE-RAM; the second circuitry and the second FE-RAM.

Example 35: The apparatus of example 33 comprises a memory interface to communicate with a memory external to the first and second dies.

Example 36: The apparatus of example 35, wherein the memory is one of an FE-RAM or an SRAM.

Example 37: The apparatus of example 33, wherein: the second circuitry includes a first matrix multiplier and a second multiplier; the input data is split into a first data and a second data; the weight factors are split into a first weight factor and a second weight factor; the first matrix multiplier is to multiply the first data with the first weight factor to generate a first output; and the second matrix multiplier is to multiply the second data with the second weight factor to generate a second output.

Example 38: The apparatus of example 37 includes an adder, which is to add the first output with the second output to generate a third output, wherein the third output is stored in the first FE-RAM.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a substrate;
   a first die on the substrate, the first die including a plurality of a random access memory (RAM) tiles to store input data, weight factors, and outputs;
   a second die over the first die, wherein the first die is between the substrate and the second die; and
   a heat sink over the second die, wherein the second die is between the heat sink and the first die, wherein the substrate is at a reference level of an x-y plane, wherein the first die is positioned above the reference level along a positive z-axis at a first z-plane, wherein the second die is positioned above the first z-plane along the positive z-axis at a second z-plane, wherein the second z-plane is higher than the first z-plane along an x-axis and relative to the reference level, wherein the second die includes a plurality of compute tiles, wherein an individual compute tile is substantially vertically aligned with an individual RAM tile of the plurality of RAM tiles, wherein the individual RAM tile includes non-linear polar material, and wherein the individual compute tile includes:
   a matrix multiplier communicatively coupled to one or more RAM tiles of the first die; and
   a buffer communicatively coupled to the one or more RAM tiles of the first die.

2. The apparatus of claim 1, wherein the plurality of compute tiles includes a first compute tile and a second compute tile, and wherein the first compute tile is operable to access a buffer or memory of the second compute tile.

3. The apparatus of claim 1 comprising a ring or mesh interconnect that is coupled to the first die and the second die, wherein the ring or mesh interconnect is:
   coupled to a first interconnect which is coupled to the buffer and the individual RAM tile;
   coupled to a second interconnect which is coupled to the individual RAM tile and the matrix multiplier; and
   coupled to a third interconnect which is coupled to the individual RAM tile and the matrix multiplier.

4. The apparatus of claim 3, wherein the ring or mesh interconnect is positioned in the first die.

5. The apparatus of claim 3, wherein the ring or mesh interconnect is positioned in the second die.

6. The apparatus of claim 3, wherein the first, second, and third interconnects extend vertically between the first and second dies.

7. The apparatus of claim 6, wherein a first portion of the ring or mesh interconnect is in the first die and a second portion of the ring or mesh interconnect is in the second die, and wherein the first and second portions of the ring or mesh interconnect are coupled via an interconnect that extends vertically between the first and second dies.

8. The apparatus of claim 1, wherein the first die comprises buffers to communicate with a memory external to the first and second dies.

9. The apparatus of claim 1, wherein the second die comprises buffers to communicate with a memory external to the first and second dies.

10. The apparatus of claim 9, wherein the memory is one of a Fe-RAM, DRAM, or an SRAM.

11. The apparatus of claim 9, wherein:
    the matrix multiplier is a first matrix multiplier;
    the second die includes a second multiplier;
    the input data is split into a first data and a second data;
    the weight factors are split into a first weight factor and a second weight factor;
    the first matrix multiplier is to multiply the first data with the first weight factor to generate a first output; and
    the second matrix multiplier is to multiply the second data with the second weight factor to generate a second output.

12. The apparatus of claim 11, wherein:
    the second die includes an adder, which is to add the first output to the second output to generate a third output;
    the third output is stored in the RAM;
    the input data is split in the first and second data when a size of the input data is above a first threshold; and
    the weight factors data is split in the first and second data when a size of the weight factors is above a second threshold.

13. The apparatus of claim 9, wherein:
    the matrix multiplier is a first matrix multiplier;
    the second die includes a second multiplier;
    the weight factors are split into a first weight factor and a second weight factor;
    the first matrix multiplier is to multiply the input data with the first weight factor to generate a first output; and
    the second matrix multiplier is to multiply the input data with the second weight factor to generate a second output.

14. The apparatus of claim 13, wherein:
the second die includes circuitry to concatenate the first output with the second output to generate a third output;
the third output is stored in the individual RAM tile;
the weight factors data is split in the first and second data when a size of the weight factors is above a second threshold; and
the second die is positioned over the first die in a package.

15. The apparatus of claim 14, wherein the individual RAM tile includes one or more of:
MRAM, Fe-RAM, Fe-SRAM, SRAM, DRAM, or Re-RRAM.

16. The apparatus of claim 1, wherein the non-linear polar material comprises a perovskite, and wherein the perovskite which is doped to provide a spontaneous distortion which is less than 2%.

17. The apparatus of claim 1, wherein the second die is directly over the first die, and wherein the second die is coupled to the first die by a set of interconnects that extend vertically between the second die and the first die, and wherein the set of interconnects are along peripheral areas of the second die and the first die.

18. A system comprising:
a memory;
a first processor to generate a training model having weight factors; and
a second processor to receive the training model, wherein the second processor is coupled to the memory, and wherein the second processor includes:
a substrate;
a first die on the substrate, the first die including:
a first ferroelectric random access memory (FE-RAM) to store input data; and
a second FE-RAM to store the weight factors; and
a second die, wherein the first die is between the second die and the substrate, wherein the second die is over the first die, wherein the substrate is at a reference level of an x-y plane, wherein the first die is positioned above the reference level along a positive z-axis at a first z-plane, wherein the second die is positioned above the first z-plane along the positive z-axis at a second z-plane, and wherein the second z-plane is higher than the first z-plane along an x-axis and relative to the reference level, the second die including:
a matrix multiplier communicatively coupled to the first FE-RAM and the second FE-RAM; and
a buffer communicatively coupled to the first FE-RAM.

19. The system of claim 18, wherein the second processor comprising a ring interconnect that is coupled to the first and second die, and wherein the ring interconnect is:
coupled to a first interconnect which is coupled to the buffer and the first FE-RAM;
coupled to a second interconnect which is coupled to the first FE-RAM and the matrix multiplier; and
coupled to a third interconnect which is coupled to the second FE-RAM and the matrix multiplier.

20. The system of claim 18, wherein:
the matrix multiplier is a first matrix multiplier;
the second die includes a second multiplier;
the input data is split into a first data and a second data;
the weight factors are split into a first weight factor and a second weight factor;
the first matrix multiplier is to multiply the first data with the first weight factor to generate a first output; and
the second matrix multiplier is to multiply the second data with the second weight factor to generate a second output.

21. The system of claim 20, wherein the second die includes an adder, which is to add the first output with the second output to generate a third output, and wherein the third output is stored in the first FE-RAM.

22. An apparatus comprising:
a substrate;
a first die on the substrate, the first die including:
a first ferroelectric random access memory (FE-RAM) to store input data; and
a second FE-RAM to store weight factors, wherein the first FE-RAM and the second FE-RAM includes perovskite which is doped to provide a spontaneous distortion which is less than 2%;
a second die on the first die, wherein the first die is between the second die and the substrate, wherein the substrate is at a reference level of an x-y plane, wherein the first die is positioned above the reference level along a positive z-axis at a first z-plane, wherein the second die is positioned above the first z-plane along the positive z-axis at a second z-plane, wherein the second z-plane is higher than the first z-plane along an x-axis and relative to the reference level, wherein the second die includes:
a matrix multiplier communicatively coupled to the first FE-RAM and the second FE-RAM; and
a buffer communicatively coupled to the first FE-RAM, wherein the second die is over the first die;
a stack of high-bandwidth memories (HBMs) adjacent to a first side of the first die; and
a second stack of HBMs adjacent to a second side of the first die, wherein the first side is opposite to the second side.

23. The apparatus of claim 22 comprising a ring or mesh interconnect that is coupled to the first and second dies, wherein the ring interconnect is:
coupled to a first interconnect which is coupled to the buffer and the first FE-RAM;
coupled to a second interconnect which is coupled to the first FE-RAM and the matrix multiplier; and
coupled to a third interconnect which is coupled to the second FE-RAM and the matrix multiplier.

24. The apparatus of claim 23, wherein the ring or mesh interconnect is positioned in the first die.

25. The apparatus of claim 23, wherein the ring or mesh interconnect is positioned in the second die.

26. The apparatus of claim 23, wherein the first, second, and third interconnects extend vertically between the first and second dies.

27. The apparatus of claim 23, wherein a first portion of the ring or mesh interconnect is in the first die and a second portion of the ring or mesh interconnect is in the second die, and wherein the first and second portions of the ring or mesh interconnect are coupled via an interconnect that extends vertically between the first and second dies.

28. The apparatus of claim 22, wherein the first die comprises buffers to communicate with a memory external to the first and second dies.

29. The apparatus of claim 22, wherein the second die comprises buffers to communicate with a memory external to the first and second dies.

30. The apparatus of claim 29, wherein the memory is one of an FE-RAM, DRAM or an SRAM.

31. The apparatus of claim 22, wherein:
the matrix multiplier is a first matrix multiplier;
the second die includes a second multiplier;
the input data is split into a first data and a second data;
the weight factors are split into a first weight factor and a second weight factor;
the first matrix multiplier is to multiply the first data with the first weight factor to generate a first output; and
the second matrix multiplier is to multiply the second data with the second weight factor to generate a second output.

32. The apparatus of claim 31, wherein:
the second die includes an adder, which is to add the first output with the second output to generate a third output;
the third output is stored in the first FE-RAM;
the input data is split in the first and second data when a size of the input data is above a first threshold; and
the weight factors data is split in the first and second data when a size of the weight factors is above a second threshold.

33. The apparatus of claim 22, wherein:
the matrix multiplier is a first matrix multiplier;
the second die includes a second multiplier;
the weight factors are split into a first weight factor and a second weight factor;
the first matrix multiplier is to multiply the input data with the first weight factor to generate a first output; and
the second matrix multiplier is to multiply the input data with the second weight factor to generate a second output.

34. The apparatus of claim 33, wherein:
the second die includes circuitry to concatenate the first output with the second output to generate a third output;
the third output is stored in the first FE-RAM;
the weight factors data is split in the first and second data when a size of the weight factors is above a second threshold; and
the second die is positioned over the first die in a package.

35. An apparatus comprising:
a substrate;
a first die on the substrate, the first die including a plurality of a random access memory (RAM) tiles to store input data, weight factors, and outputs, wherein an individual RAM tile includes non-linear polar material;
a second die over the first die, wherein the first die is between the substrate and the second die; and
a heat sink over the second die, wherein the second die is between the heat sink and the first die, wherein the substrate is at a reference level of an x-y plane, wherein the first die is positioned above the reference level along a positive z-axis at a first z-plane, wherein the second die is positioned above the first z-plane along the positive z-axis at a second z-plane, wherein the second z-plane is higher than the first z-plane along an x-axis and relative to the reference level, wherein the second die includes a plurality of compute tiles, and wherein an individual compute tile is substantially vertically aligned with the individual RAM tile.

36. The apparatus of claim 35, wherein the second die is directly over the first die, and wherein the second die is coupled to the first die by a set of interconnects that extend vertically between the second die and the first die, and wherein the set of interconnects are along peripheral areas of the second die and the first die.

37. The apparatus of claim 35, wherein the non-linear polar material comprises a perovskite, and wherein the perovskite which is doped to provide a spontaneous distortion which is less than 2%.

* * * * *